US011191181B1

(12) United States Patent
Tandon et al.

(10) Patent No.: US 11,191,181 B1
(45) Date of Patent: Nov. 30, 2021

(54) CUSTOM SERVER ASSEMBLY

(71) Applicant: Amazon Technologies, Inc., Seattle, WA (US)

(72) Inventors: Prateek Tandon, Issaquah, WA (US); David Edward Bryan, Seattle, WA (US); Kevin M. Bailey, Seattle, WA (US); Ioana Galis, Fremont, CA (US); Kypros Constantinides, Seattle, WA (US)

(73) Assignee: Amazon Technologies, Inc., Seattle, WA (US)

( * ) Notice: Subject to any disclaimer, the term of this patent is extended or adjusted under 35 U.S.C. 154(b) by 717 days.

(21) Appl. No.: 16/020,752

(22) Filed: Jun. 27, 2018

(51) Int. Cl.
*H05K 7/14* (2006.01)
*B25J 9/16* (2006.01)
*H05K 7/02* (2006.01)
*H05K 7/18* (2006.01)
*G06N 20/00* (2019.01)

(52) U.S. Cl.
CPC ........... *H05K 7/1487* (2013.01); *B25J 9/163* (2013.01); *B25J 9/1679* (2013.01); *G06N 20/00* (2019.01); *H05K 7/023* (2013.01); *H05K 7/1498* (2013.01); *H05K 7/18* (2013.01)

(58) Field of Classification Search
CPC ........ H05K 7/18; H05K 7/1498; H05K 7/023; H05K 7/1487; B25J 9/1679; B25J 9/163; G06N 20/00
See application file for complete search history.

(56) References Cited

U.S. PATENT DOCUMENTS

| 8,417,578 B1 | 4/2013 | Evans |
| 9,557,792 B1* | 1/2017 | Potlapally ................. G06F 1/20 |
| 2013/0190899 A1* | 7/2013 | Slessman ............ H05K 7/1498 |
| | | 700/28 |

(Continued)

OTHER PUBLICATIONS

U.S. Appl. No. 14/981,651, filed Dec. 28, 2015, Mitchell Gannon Flaherty.

(Continued)

*Primary Examiner* — Adam R Mott
*Assistant Examiner* — Arslan Azhar
(74) *Attorney, Agent, or Firm* — Robert C. Kowert; Kowert, Hood, Munyon, Rankin & Goetzel, P.C.

(57) ABSTRACT

A server assembly service determines configurations for custom assembled servers based on time-series utilization metadata for servers executing workloads similar to workloads that are to be executed on the custom assembled servers. The server assembly service determines trends in the time-series utilization metadata and compares the identified trends to associations between workload utilization trends and application classes to determine one or more application classes for applications executing the workloads. The service uses the determined application classes to select server configurations for custom servers that are to be assembled to execute workloads similar to the workloads related to the server utilization metadata. In some embodiments, the service selects custom server configurations without access to applications or application data for workloads of concern. For example, the service may select custom server configurations without using profiling techniques that may intrude on customer privacy by requiring access to underlying applications or application data.

20 Claims, 30 Drawing Sheets

(56) References Cited

U.S. PATENT DOCUMENTS

2016/0107312 A1\* 4/2016 Morrill .................. G11B 15/68
    29/402.08
2016/0346928 A1\* 12/2016 Zhang .................... B25J 9/1679
2017/0063606 A1\* 3/2017 Babu ....................... H04W 4/00

OTHER PUBLICATIONS

U.S. Appl. No. 14/475,189, filed Sep. 2, 2014, Osvaldo P. Morales.

\* cited by examiner

CUSTOM SERVER ASSEMBLY

BACKGROUND

Businesses and other organizations often conduct operations requiring significant computing resources. Some such organizations may maintain their own computing facilities, such as data centers, or may conduct computer operations using computing resources of computing facilities managed by others, such as a service provider that manages a provider network comprising one or more data centers.

Often computing facilities are designed and built based on anticipated demand for computing resources. However, actual demand may differ from anticipated demand. This may lead to inefficiencies and/or bottle-necks at computing facilities. For example, server configurations of servers installed in a computing facility may be selected based on anticipated demand for various server configurations. However, actual demand for particular server configurations may differ from the anticipated demand. Also, as another example, support infrastructure for servers of a computing facility may be designed and built based on anticipated demand for such support infrastructure. However, installed server configurations may differ from anticipated server configurations resulting in over supply or under supply of support infrastructure for servers of a computing facility.

To efficiently utilize computing resources, some facility operators may query customers about what applications the customers plan to execute. The facility operators may then use this information to select server configurations to install in a computing facility. However, actual use may vary from planned use, and some customers may prefer to not share such detailed information with facility operators for privacy reasons, strategic reasons, or various other reasons. Alternatively, facility operators may utilize profiling techniques to determine applications or classes of applications being executed on servers. However, such profiling techniques may require access to customer applications and may reduce customer privacy or raise other security issues.

Figure 1:
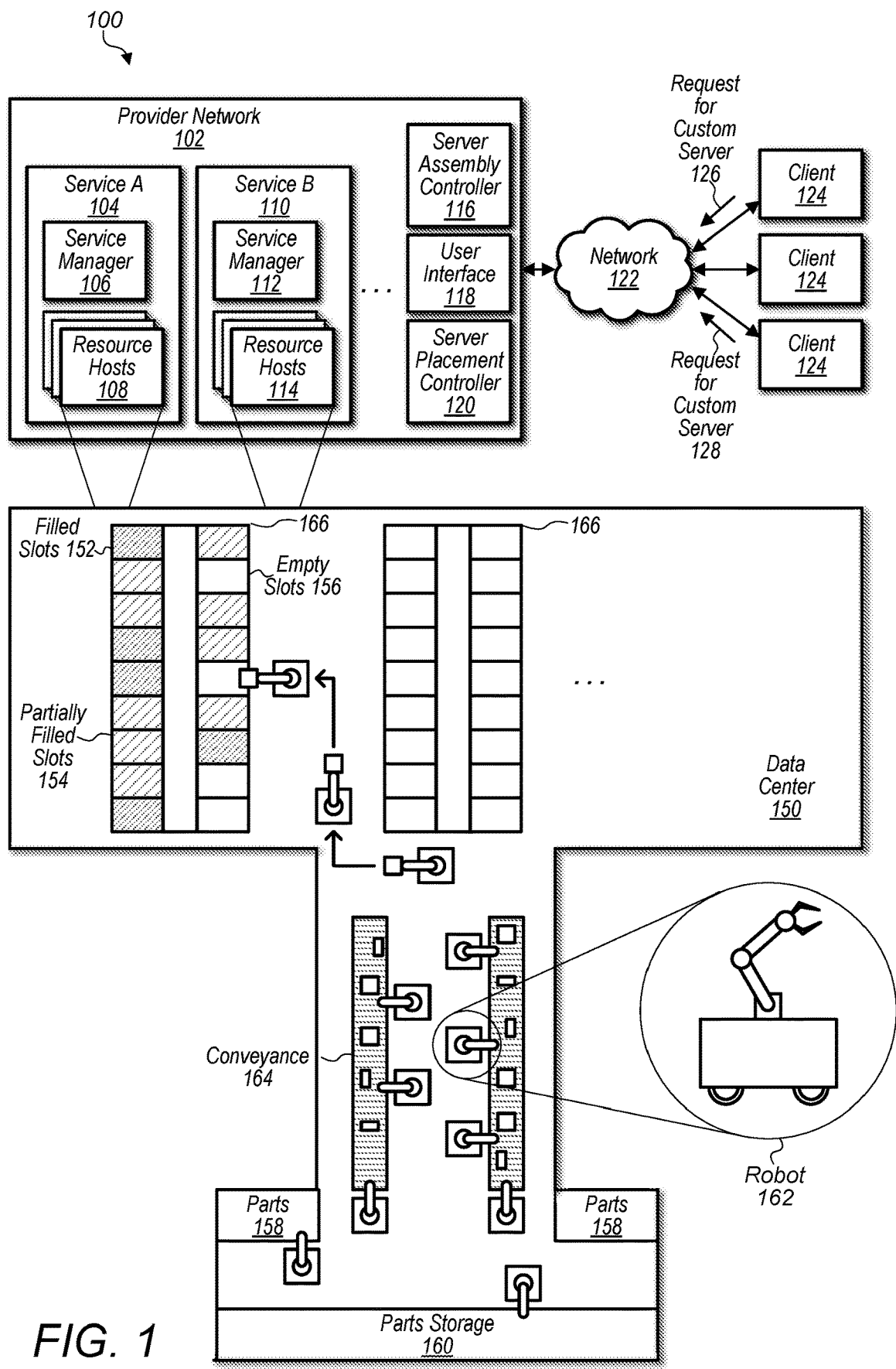
FIG. 1 illustrates a block diagram of a provider network, a top view of a data center included in the provider network, and a server assembly system for custom assembling servers for the data center, according to some embodiments.

While embodiments are described herein by way of example for several embodiments and illustrative drawings, those skilled in the art will recognize that the embodiments are not limited to the embodiments or drawings described. It should be understood, that the drawings and detailed description thereto are not intended to limit embodiments to the particular form disclosed, but on the contrary, the intention is to cover all modifications, equivalents and alternatives falling within the spirit and scope as defined by the appended claims. The headings used herein are for organizational purposes only and are not meant to be used to limit the scope of the description or the claims. As used throughout this application, the word "may" is used in a permissive sense (i.e., meaning having the potential to), rather than the mandatory sense (i.e., meaning must). Similarly, the words "include", "including", and "includes" mean including, but not limited to.

DETAILED DESCRIPTION

The systems and methods described herein implement a near real-time custom server system, a custom server placement system, a portable server assembly system, and a server configuration selection system, according to various embodiments. It should be noted that the various systems described herein may be used either separately, in some embodiments, or in combination with other ones of the systems described herein in some embodiments.

In some embodiments, a system includes a data center comprising a server mounting structure and a plurality of robots. The server mounting structure comprises a plurality of slots configured to accept installation of servers and the plurality of robots are configured to custom assemble servers to be installed in the slots of the server mounting structure of the data center. The system also includes a provider network comprising a server assembly controller. The server assembly controller is configured to receive a request for a custom assembled server, cause one or more of the robots located at the data center to custom assemble the custom assembled server, and cause installation of the custom assembled server in an unoccupied slot of the server mounting structure. For custom assembled server types requested in lower volumes, the custom assembled servers may be assembled autonomously by respective ones of the robots; and for custom assembled server types requested in higher volumes, the custom assembled servers may be assembled by respective groups of robots working in coordination with one another, for example via an assembly line.

In some embodiments, a method includes receiving a request for a custom assembled server, assembling the custom assembled server at a data center using one or more robots located at the data center, installing the custom assembled server in an unoccupied slot of a server mounting structure at the data center, and making the custom assembled server available to execute one or more workloads on behalf of a requestor of the custom assembled server. For custom assembled server types requested in lower volumes, a custom assembled server may be assembled autonomously by respective ones of the robots; and for custom assembled server types requested in higher volumes, a custom assembled server may be assembled by respective groups of robots working in coordination with one another, for example via an assembly line.

In some embodiments, a non-transitory computer-readable medium stores program instructions, that when executed by one or more processors, cause the one or more processors to: receive a request for a custom assembled server; cause one or more robots to assemble the custom assembled server at a data center; cause installation of the custom assembled server in an unoccupied slot of a server mounting structure at the data center; and initiate one or more configuration changes to make the custom assembled server available to execute one or more workloads on behalf of a requestor of the custom assembled server. For custom assembled server types requested in lower volumes, a custom assembled server may be assembled autonomously by respective ones of the robots; and for custom assembled server types requested in higher volumes, a custom assembled server may be assembled by respective groups of robots working in coordination with one another, for example via an assembly line.

In some embodiments, a data center includes a server mounting structure comprising a plurality of slots configured to accept installation of a server and one or more server support infrastructure systems configured to provide power support, networking support, or cooling support to respective servers mounted in the slots of the server mounting structure. The data center also includes one or more assembly robots configured to custom assemble servers and a server placement controller configured to select, for a custom assembled server, a particular slot of the plurality of slots of the server mounting structure for installation, based, at least in part, on support infrastructure requirements of the custom assembled server and available support infrastructure capacity at respective unoccupied ones of the plurality of slots of the server mounting structure.

In some embodiments, a method includes selecting a particular slot of a plurality of slots of a server mounting structure at a data center location for installation of a custom assembled server, assembled at the data center location, wherein the particular slot is selected based, at least in part, on support infrastructure requirements of the custom assembled server and available support infrastructure capacity at respective unoccupied ones of the plurality of slots of the server mounting structure. The method further includes causing the custom assembled server to be installed in the particular slot via one or more robots located at the data center location.

In some embodiments, a non-transitory computer-readable medium stores program instructions, that when executed by one or more processors, cause the one or more processors to select a particular slot of a plurality of slots of a server mounting structure for installation of a custom assembled server, wherein the particular slot is selected based, at least in part, support infrastructure requirements of the custom assembled server and available support infrastructure capacity at respective unoccupied ones of the plurality of slots of the server mounting structure. The program instructions, when executed by the one or more processors, further cause the one or more processors to cause the custom assembled server to be installed in the particular slot via one or more robots.

In some embodiments, a system includes a data center that includes a server mounting structure comprising a plurality of slots configured to accept installation of a server and the system also includes a portable server assembly system. The portable server assembly system includes a container positioned proximate to the data center and a plurality of robots configured to custom assemble servers to be installed in the slots of the server mounting structure. Additionally, the container is configured to stow the plurality of robots for relocation of the portable server assembly system to another data center.

In some embodiments, a portable server assembly system includes a container structure configured to be transported from a first data center location to another data center location and a plurality of robots configured to custom assemble servers to be installed at the first data center location or the other data center location, wherein the container structure is configured to stow the plurality of robots for relocation of the portable server assembly system from the first data center location to the other data center location.

In some embodiments, a method includes positioning a container of a portable server assembly system at a data center location and assembling custom assembled servers at the data center location via one or more robots of the portable server assembly system, wherein the one or more robots are stored in the container of the portable server assembly system when transporting the portable server assembly system to or from the data center location.

In some embodiments, a system includes servers mounted in a server mounting structure of a data center and one or more robots configured to custom assemble additional servers to be installed in unoccupied slots of the server mounting structure of the data center. The system also includes a server assembly controller configured to: identify trends in server utilization metadata for the servers mounted in the server mounting structure, wherein the server assembly controller identifies the trends in the server utilization metadata without access to applications being executed on the servers; determine a particular application class for an application being executed on one or more of the servers based, at least in part, on the identified trends in the server utilization metadata; and cause the one or more robots to custom assemble an additional server having a server configuration tailored for the particular application class. Also, the one or more robots are further configured to cause the additional server to be installed in one of the unoccupied slots of the server mounting structure.

In some embodiments, a method includes identifying trends in server utilization metadata for servers mounted in a data center, wherein the trends in the server utilization metadata are identified without access to applications being executed on the servers; determining a particular application class for an application being executed on one or more of the servers based, at least in part, on the identified trends in the server utilization metadata; and causing one or more robots at the data center to custom assemble an additional server having a server configuration tailored for the particular application class.

In some embodiments, a non-transitory computer readable medium stores program instructions, that when executed by one or more processors, cause the one or more processors to: identify trends in server utilization metadata for servers, wherein the trends in the server utilization metadata are identified without access to applications being executed on the servers; determine a particular application class for an application being executed on one or more of the servers based, at least in part, on the identified trends in the server utilization metadata; and cause one or more robots to custom assemble an additional server having a server configuration tailored for the particular application class.

Some data center operators may build data centers and install computing devices in the data centers, such as servers, based on an anticipated level of demand for various types of computing requirements that will need to be met by the installed computing devices. However, for various reasons, such as changes in computer technology, changes in customer demand, or for various other reasons, actual computing requirements for the installed computing devices may deviate from the forecast computing requirements. In the case where actual computing requirements are less than forecast computing requirements, installed computing devices may be inefficiently used. For example, a computing device with a given processor capacity, a given memory capacity, a given a storage capacity, etc. may be used to perform tasks that do not require the full capacity of the computing device. Conversely, in the case where actual computing requirements for the installed computing devices are greater than forecast computing requirements, installed computing devices may lack sufficient capacity to perform assigned tasks or may perform assigned tasks at a slower speed than desired. Additionally, computing devices installed in anticipation of demand may remain unused for considerable periods of time until demand rises to a level necessitating use.

In some embodiments, a near real-time custom server system (either stationary or portable) may reduce inefficiencies and capacity bottlenecks by allowing computing devices to be assembled in near real-time when demand is better defined. For example, in some embodiments, a client of a provider network may request a custom server and one or more robots at a data center of the provider network may assemble the custom server according to configuration requirements specified by the client. This may be done in near real-time, for example within a matter of minutes of the requestor placing the request. In some embodiments, the client making the request, e.g. the requestor, may be an external client of a provider network or service provider, or may be an internal client, such as another service of a service provider. Additionally, the one or more robots or another device may install the custom assembled server in an unoccupied slot of a server mounting structure at the data center of the provider network. Additionally, a manager of a provider network may perform one or more configuration operations to make the installed custom server available to perform workloads on behalf of the requestor. Installation of the custom assembled server and the making of the custom assembled server available to perform workloads may also be performed in near real-time in response to a request for a custom assembled server.

In some embodiments, a server assembly controller may determine a custom tailored server configuration based on an application class of an application to be executed by the custom assembled server. For example, for an application with high processing requirements, a server assembly controller may select a custom server configuration with more processors than other server configurations. As another example, for an application with high memory utilization, a server assembly controller may select a custom server configuration with more memory devices than other server configurations. In some embodiments, a server assembly controller, which may include a server configuration selection system, may determine application classes without accessing underlying applications. The server assembly controller may also make such determinations without access to application data or user data associated with already installed servers. For example, in some embodiments, a server assembly controller may identify trends in high level utilization data such as power consumption data and memory utilization data without accessing underlying applications being executed on installed servers. Based on the identified trends in the high-level utilization data, the server assembly controller may determine an application class of an application being executed on an installed server and may further determine a custom server configuration that is tailored for the particular application class to provide optimum performance while minimizing wasted resources, e.g. an efficient custom server configuration for the particular application class. The server assembly controller may then cause one or more robots to assemble a custom server having the determined configuration and further cause the assembled custom server to be installed in an unoccupied slot of a server mounting structure and made available to execute the application corresponding to the particular application class.

In some embodiments, a server placement controller, may determine an optimum or satisfactory slot for placement of a custom assembled server based on specific infrastructure support requirements of the custom assembled server and based on infrastructure support capacities of available unoccupied slots of a server mounting structure at a data center. For example, a processor intense server may have a higher power and cooling requirement than a less processor intense server. As another example, some servers may have greater network requirements than other servers. In some embodiments, infrastructure support systems, such as power, networking, cooling, etc. may be pre-installed in a data center hall prior to the data center hall being populated with custom servers. In such embodiments, placement of custom servers having different infrastructure requirements may be determined by a server placement controller to efficiently distribute custom servers such that infrastructure support systems, such as power, networking, cooling, etc. meet the demands of the custom assembled servers, while minimizing wasted or stranded capacity of infrastructure support systems. For example, in order to avoid overloading a cooling infrastructure support system, a server placement controller may spread out placement of custom servers that generate large amounts of waste heat. This may prevent localized hot spots that exceed a support infrastructure capacity of the cooling infrastructure support system. In a similar manner, custom servers requiring more network support may be placed adjacent to custom servers requiring fewer network connections such that a capacity of a networking infrastructure support system is not overloaded. As another example, custom servers requiring greater amount of power may be placed adjacent to, or on a same bus as, custom servers requiring smaller amounts of power. In such an arrangement, the smaller and greater power requirements of the custom servers sharing the same bus may at least partially balance each other out, such that the bus is not overloaded or underutilized.

In some embodiments, a custom server may be logically attached to another server such that the servers operate in a coordinated manner. For example, a cluster may include multiple servers that operate as a single server from a perspective of a client of a service provider or in various other coordinate manners. Additionally, some servers may perform distributed applications, wherein a set of servers including more than one server operate together to perform tasks associated with the distributed application. In such cases, server performance of a custom server may depend on a distance, in terms of network hops, latency, etc., from another server to which the custom server is to be attached. In such situations, a server placement controller may select an unoccupied slot for placement of the custom server such that the custom server is or can be placed adjacent (physically or in regard to network distance) to one or more other servers to which the custom server is to be attached.

In some embodiments, a service provider may implement a user interface allowing a client of the service provider to request a custom server or a cluster comprising custom servers. In such an embodiment or in other embodiments, a service provider may implement an application program interface (API) allowing a client to request a custom server or cluster comprising one or more custom servers. In some embodiments, a particular service of a service provider network may request custom servers be assembled for use by the particular service. In some embodiments, the service may execute workloads on behalf of clients of the service provider network. In some embodiments, management of custom server requests and installation may be automatically performed by a manager of a service, a server assembly controller, and/or a server placement controller without intervention by a client of the service. For example, a computing service of a provider network that performs compute workloads on behalf of clients may request one or more additional custom servers be assembled for the compute service and may then execute client workloads using the assembled and installed custom servers without the client being involved in the management of the custom servers. In other embodiments, a client may directly specify requirements for a custom server and a server assembly controller may cause a requested custom server to be assembled in near real-time in response to the client's request.

In some embodiments, robots that assemble custom servers may be housed at a data center and may be available to assemble custom servers in near real-time. In some embodiments, robots that assemble custom servers may be part of a portable server assembly system and may be relocated between different data center locations in order to assemble custom servers at the different data center locations. For example, in some embodiments costs associated with robots may be spread across multiple data centers by relocating the robots to an additional data center when slots of a first data center are substantially occupied. In some embodiments, a portable server assembly system may include a container, such as a cargo container or other suitable type of container for stowing the assembly robots when transporting the assembly robots between data center locations. Additionally, in some embodiments, a container of a portable server assembly system may include a portion of the container that stores parts to be used in assembling custom servers. In some embodiments, additional containers may be included in a portable server assembly system to store parts to be used in assembling custom servers. In some embodiments, a container of a portable server assembly system may include one or more conveyances, such as a conveyer belt, to assist coordinated robots that assemble custom servers via an assembly line.

Near Real-Time Custom Server System

FIG. 1 illustrates a block diagram of a provider network, a top view of a data center that may be included in the provider network, and a server assembly system for custom assembling servers for the data center, according to some embodiments.

System 100 includes provider network 102 connected to network 122. Clients 124 are also connected to network 102 and may access services of provider network 102 via a connection over network 122. Provider network 102 also includes service A 104 and service B 110, and clients 124 may access service A 104 and service B 110 via network 122. In some embodiments, a provider network, such as provider network 102, may include any number of services that perform tasks on behalf of clients, such as a computing service, a data storage service, a database service, a machine learning service, and various other types of services. In some embodiments, service A 104 and/or service B 110 may be a service offered to clients 124 such as a computing service, a data storage service, a database service, a machine learning service, etc.

In some embodiments, services of a provider network may include a service manager and resource hosts. For example, service A 104 includes service manager 106 and resource hosts 108. Also, service B 110 includes service manager 112 and resource hosts 114. In some embodiments, resource hosts and/or other computing devices that implement a service of a provider network may be implemented using computing devices, such as servers, mounted in a server mounting structure of a data center. For example, resource hosts 108 and 114 may include servers mounted in data center 150.

In some embodiments, a provider network may further include a server assembly controller configured to determine configurations for custom servers and to cause one or more robots of a server assembly system to assemble custom servers having the determined configurations. For example, provider network 102 includes server assembly controller 116.

In some embodiments, a client of a provider network, such as one of clients 124, may submit a request, such as request 126 or request 128, for a custom server having a specified configuration via a user interface, such as user interface 118. Also, in some embodiments, a manager of a service of a provider network, such as one or more computing devices implementing manager 106 or manager 112, may send a request for one or more custom servers to a server assembly controller, such as server assembly controller 116.

In some embodiments, as discussed in more detail below in regard to FIG. 24, a server assembly controller may determine a configuration for a customer server based on identified trends in server utilization metadata for already installed servers, wherein the determined configuration is tailored for an application or application class of an application to be executed on the custom server. Furthermore, in some embodiments, a server assembly controller, such as server assembly controller 116, may cause one or more robots at a server assembly location to assemble a custom server having a particular configuration determined based on server utilization trends. For example, server assembly controller 116 may cause robots 162 to assemble one or more custom servers to be installed in server mounting structure 166 of data center 150 based on server utilization trends for servers already placed in mounting structure 166 of data center 150.

In some embodiments, robots may be included in a data center hall of a data center and may assemble custom servers to be installed in the data center hall. Also, in some embodiments robots may be included in a container coupled to a data center, wherein the robots assemble custom servers to be installed in the data center. For example, in some embodiments, robots 162 may be included in data center 150 or may be included in a container coupled to data center 150. In some embodiments, a data center hall comprising robots may also include one or more parts storage areas, such as parts storages 158 and 160. Alternatively parts storages, such as parts storages 158 and 160 may be included in a container or multiple containers of a portable server assembly system.

Additionally, an assembly location may include one or more conveyances, such as conveyances 164. In some embodiments, in which robots, such as robots 162, are included in a container coupled to a data center, the container may further include a parts storage area or may couple with one or more other containers that include a parts storage area. In some embodiments, robots of a data center may autonomously assemble a custom server. For example, a robot may perform all or substantially all the assembly steps for assembling a custom server on its own. Also, in other embodiments, a server assembly controller, such as server assembly controller 116, may cause one or more robots to work in coordination with each other to assemble a custom server. For example, parts for assembling a custom server may be placed on a conveyance, such as conveyance 164, by some robots, such as some of the robots 162, and the parts may be assembled into a custom server by a group of coordinated robots. For example other robots 162 may work in coordination using conveyance 164 to assemble a custom server from parts retrieved from parts storage 158 and parts storage 160.

As explained in more detail below, in some embodiments, a server assembly controller may select to cause separate robots to assemble separate custom servers autonomously when custom server demand includes low volumes of different custom server configurations. Also, in some embodiments, a server assembly controller, may cause a group of robots to work in coordination with one another to assemble custom servers when demand for custom servers includes a large volume of custom servers having a common configuration.

In some embodiments, robots may determine amongst themselves whether or not to assemble custom servers autonomously or in coordination. For example, in some embodiments, each robots of a set of robots may operate according to a "greedy" algorithm, wherein the greedy algorithm causes the robot to attempt to maximize one or more performance goals. In such embodiments, robots may communicate amongst themselves and determine that sets of the robots can achieve better performance goal results if working together than separately. Conversely the set of robots may communicate amongst themselves and determine that individual ones of the robots can achieve better performance goal results if working autonomously. For example, if a first robot has five custom servers to assemble using a first tool and a second tool, and another robot has five custom servers to assembly using the first tool and the second tool, the first and second robot may determine that they can assemble more custom servers in less time, if the first robot performs tasks requiring the first tool and the second robot performs tasks requiring the second tool. However, a third robot, that has a single custom server to assemble using a third tool and a fourth tool, may determine that the third robot can achieve better performance goal results by not coordinating with the first or second robot, and instead autonomously assembling the custom server using the third tool and the fourth tool.

In some embodiments, a server assembly controller may determine a weighted score when deciding whether a type of custom servers are to be assembled via a set of robots working in coordination, for example via an assembly line, or whether the type of custom servers are to be assembled via one or more robots working autonomously. In some embodiments, factors included in a weighted score may include: an amount of time until server of the particular type are needed to be in service, current tooling of robots that are available to assemble servers of the particular type (e.g. will the robots need to change tools), the volume of servers of the particular type that are to be assembled, etc. In some embodiments, the server assembly controller may compare the weighted score against a threshold score and may determine to autonomously assemble custom servers of a particular type autonomously if the weighted score is less than the threshold, wherein if the weighted score is above the threshold, the server assembly controller causes a set of robots to assemble custom servers of the particular type in coordination.

In some embodiments, a server assembly controller may determine an autonomous assembly weighted score and a coordinated assembly weighted score for each custom server to-be-assembled and may select to assemble the custom server using whichever method results in the highest weighted score. For example, in such embodiments, factors that may be considered in determining a weighted score, such as an autonomous assembly weighted score or a coordinated assembly weighted score, may include a cost of switching tooling of the robots, a time requirement for the custom server to-be-assembled, how many robots are available to assemble the custom server to-be-assembled, how many servers of the same type as the custom server to-be-assembled are in a queue of custom servers to-be-assembled, whether the custom server to-be-assembled is a high priority custom server or a low-priority custom server, etc. In some embodiments, various ones of the factors described for a weighted score that is compared to a threshold and autonomous assembly weighted scores and/or a coordinated assembly weighted scores may be combined or used together in different combinations.

Also, in some embodiments, a provider network, such as provider network 102, may include a server placement controller, such as server placement controller 120. In some embodiments, a server placement controller may select an installation location for a custom server from a plurality of available installation locations, e.g. unoccupied slots of a server mounting structure, based on support infrastructure requirements of the custom server and respective capacities of support infrastructure to be provided to the custom server at the available placement locations.

For example, data center 150 includes server mounting structures 166 that include section 152 comprising filled slots, section 154 that is partially filled such that it includes some unoccupied slots and some available slots, and section 156 that is empty, e.g. the slots of section 156 are unoccupied. A server placement controller, such as server placement controller 120, may select a placement location for a custom server based on available support infrastructure requirements at available (e.g. unoccupied) slots of a server mounting structure. For example, filled slots of section 152 may be removed from consideration because they are not un-occupied slots. As a further example, for a custom server with a high power consumption requirement or a high cooling requirement, a server placement controller may select an available slot adjacent to an already placed server with a lower power consumption requirement or a lower cooling requirement. For example, a server placement controller, such as server placement controller 120, may select a slot in section 154 that is adjacent to one or more servers with lower power and/or cooling requirements for placement of a custom server having a high power and/or cooling requirement. Alternatively, a server placement controller, such as server placement controller 120, may select a slot for the high power/high cooling custom server in an unoccupied section of server mounting structure 166, such as section 156.

As another example, a custom server with a high network support requirement and a low power and/or cooling requirement may be placed adjacent to the custom server with the high power and high cooling requirement because the infrastructure requirements of the two custom servers complement each other and make efficient use of support infrastructure capacity at a data center, such as data center 150.

In some embodiments, sequentially assembled custom servers may be installed in non-sequential slots of a server mounting structure. For example, sequentially assembled custom servers may be installed at various locations in a data center (as opposed to sequential adjacent positions) based on respective infrastructure support requirements of the custom servers and available infrastructure capacities at unoccupied slots of a server mounting structure of a data center. Also, in some embodiments, custom servers may be placed in slots of a server mounting structure of a data center such that at least some slots of the server mounting structure between adjacent installed servers remain unoccupied. For example, in the case of custom servers with high cooling support requirements, a blank slot may be left between two high-heat custom servers such that cooling support capacity of unoccupied slots is distributed to cool high-heat custom servers mounted in nearby slots. Server placement is described in more detail below in FIGS. 13A-13B and subsequent figures.

Figure 2A:
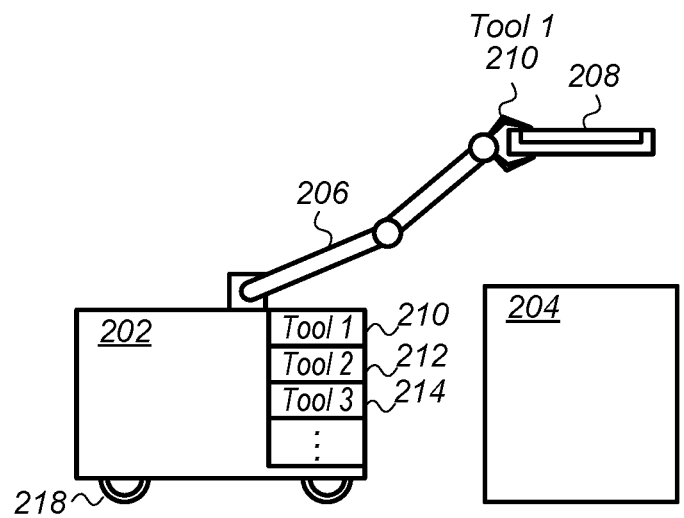
FIGS. 2A-2C illustrates a robot autonomously assembling a custom server using multiple tools, according to some embodiments.
Figure 2B:
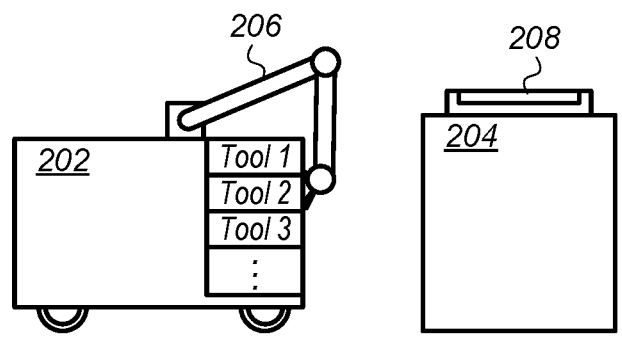
Figure 2C:
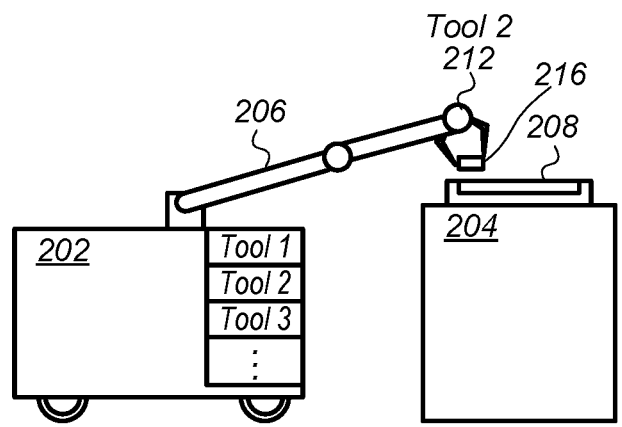

FIGS. 2A-2C illustrates a robot autonomously assembling a custom server using multiple tools, according to some embodiments.

In some embodiments, a robot such as any of the robots described in FIG. 1 or any of the other figures herein, may autonomously assemble a customer server. For example, in FIG. 2, robot 202 initially uses tool 1 (210) attached to arm 206 to grip server chassis 208 and place the server chassis 208 on assembly structure 204, which may be a work bench, table, conveyance, or other suitable structure. Robot 202 also includes compartments for tool 1 (210), tool 2 (212), and tool 3 (214); and may include other compartments for additional tools. As shown in FIG. 2B, robot 202 may change tools. For example, subsequent to placing chassis 208 on assembly structure 204, robot 202 may return tool 1 (210) to the storage compartment for tool 1 and may retrieve tool 2 (212) from the storage compartment for tool 2. For example, tool 2 (212) may be a tool for gripping and installing a processor to be installed in chassis 208. For example, in FIG. 2C robot 202 grips processor 216 using tool 2 (212) and installs processor 216 in chassis 208. As can be seen, in some embodiments, a single robot may change tools to perform different tasks required to assemble a custom server. In some embodiments, a robot may autonomously assemble a custom server by performing all or substantially all the tasks required to assemble the customer server, including tasks that require different tools to perform.

In some embodiments, a robot used for assembling custom servers may be stationary or may be mobile. For example, robot 202 may include wheels, tracks, or various other type of locomotion devices to allow robot 202 to move from one place to another. For example, robot 202 is illustrated with wheels 218.

Figure 3:
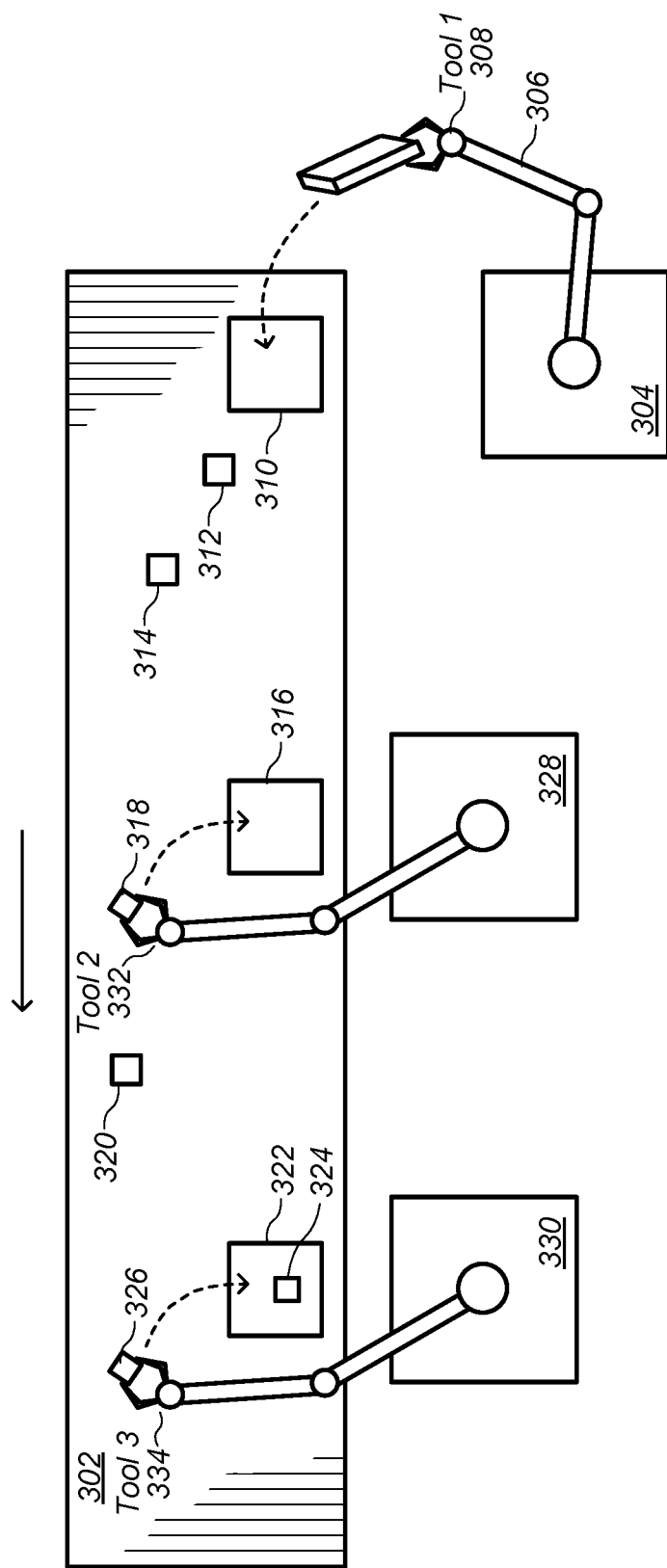
FIG. 3 illustrates multiple robots assembling a server in coordination via an assembly line process, according to some embodiments.

FIG. 3 illustrates multiple robots assembling a server in coordination via an assembly line process, according to some embodiments.

In some embodiments, a group of robots may work in coordination with one another to assemble a custom server via an assembly line. For example, in FIG. 3, robot 304 places chassis 310 on conveyance 302 using tool 1 (308) attached to arm 306. In some embodiments, robot 304 or another robot may also place processor 312 and memory 314 on conveyance 302. Robot 328 installs processor 318 in chassis 316 using tool 2 (332), and memory 320 remains on conveyance 302. Robot 330 installs memory 326 in chassis 322 that already includes processor 324. Robot 330 uses tool 3 (332) to install memory 326 in chassis 322.

In some embodiments, assembling a custom server using an assembly line may be quicker than a single robot autonomously assembling a custom server. This is because different robots can use different tools without the robots needing to change tools. For example, whereas robot 202 in FIG. 2 changed from tool 1 to tool 2 to install processor 216 in chassis 208, in an assembly line arrangement, different robots can specialize in different aspects of the assembly process reducing or eliminating the need for the robots to change tools. For example, robot 304 may specialize in placing parts on a conveyance using tool 1 (308), while robot 328 may specialize in installing processors using tool 2 (332) and robot 330 may specialize in installing memories using tool 3 (334). In some embodiments various other tools may be used by a robot or robots to assemble a custom server. In some embodiments, robots 328 and 330 may be stationary robots mounted in a container adjacent to conveyance 302 or may be mobile robots. In some embodiments, robot 304 may be a mobile robot that retrieves parts from a parts storage associated with an assembly location, such as a portion of a container of a server assembly system or other containers coupled to a server assembly system. In some embodiments, parts storage may be located in a data center and a robot, such as robot 304 may retrieve parts from a parts storage of a data center. In some embodiments, a robot or multiple robots may install various other components in a custom server, such as power supplies, storage devices (e.g. solid-state storages, hard drives, etc.), network cards, cooling elements (e.g. fans), or various other components. In some embodiments, a chassis to be used to assemble a custom server may be pre-configured with some server components that are common for multiple custom server configurations and additional components may be installed via robots to assemble the custom server, wherein the additional components vary across different custom server configurations.

In some embodiments, a robot that assembles or partially assembles a custom server may further install the custom server in an unoccupied slot of a server mounting structure of a data center. Also, in some embodiments some robots may perform installation while other robots perform assembly.

In some embodiments, blanking plates may be used to cover unoccupied slots of a server mounting structure such that cooling resources are not wasted on the unoccupied slots and to prevent recirculation of air from adjacent servers through an unoccupied slot. As discussed above, in some embodiments, custom servers may be placed in unoccupied slots based on a matching of available infrastructure support capacities of the unoccupied slots to infrastructure support requirements of the custom server. This may lead to an uneven distribution of unoccupied slots. For example, unoccupied slots may be intermixed with occupied slots of a server mounting structure.

In some embodiments, a server placement controller may select an unoccupied slot for installation of a custom server and command a robot to install the custom server in the unoccupied slot.

Figure 4A:
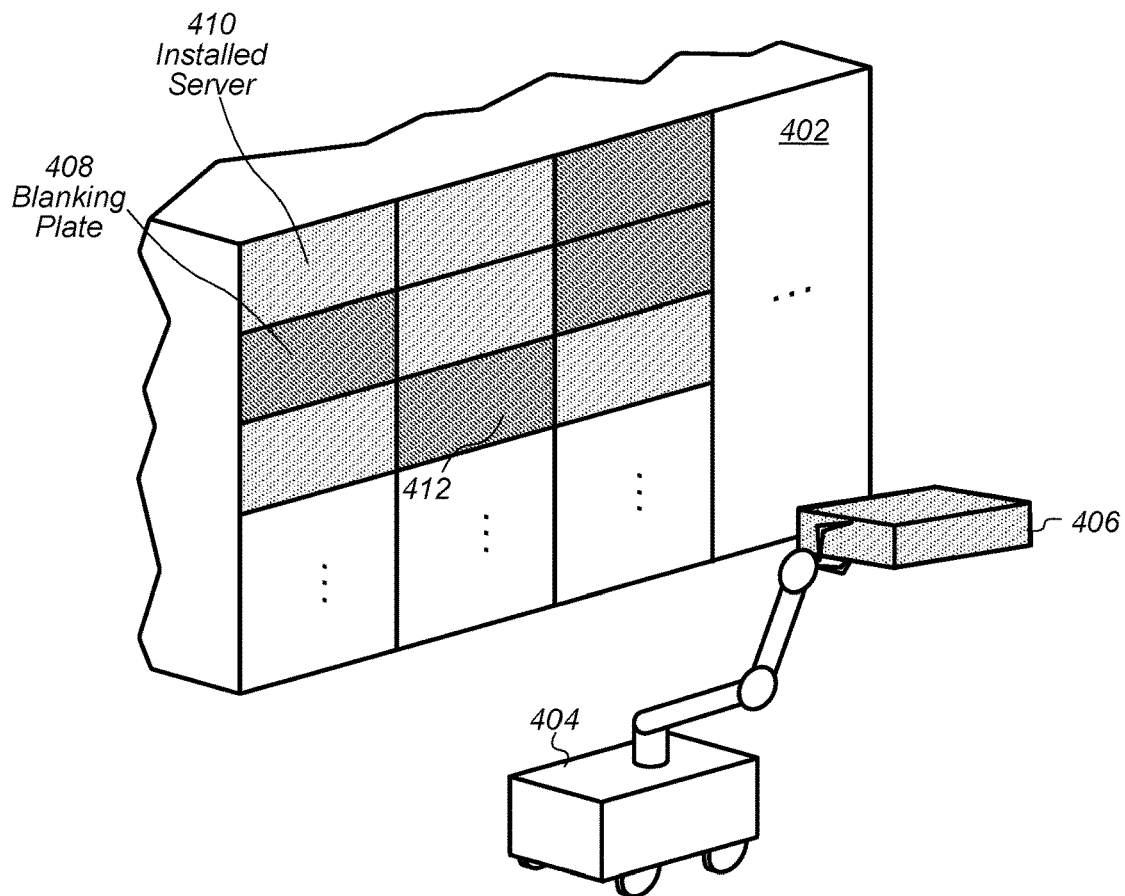
FIGS. 4A-C illustrate a robot removing a blanking plate from a slot of a server mounting structure and installing a custom server in the slot, according to some embodiments.
Figure 4B:
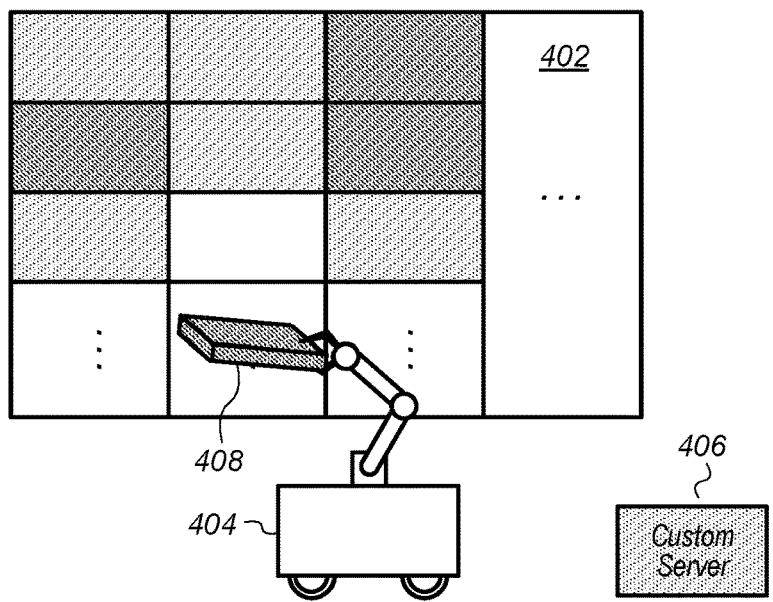
Figure 4C:
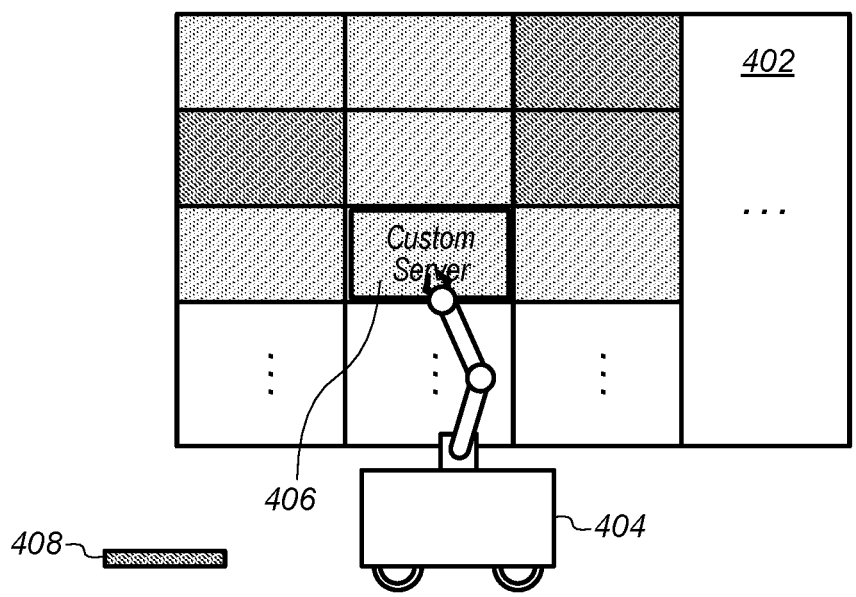

FIGS. 4A-C illustrates a robot removing a blanking plate from a slot of a server mounting structure and installing a custom server in the slot, according to some embodiments.

For example, robot 404 may be commanded to install custom server 406 in unoccupied slot 412 of server mounting structure 402 where servers are installed in slots 410 (light grey) and blanking plates 408 (dark grey) are placed over unoccupied slots. As shown in FIG. 4B, robot 404, may set down custom server 406 and remove blanking plate 408 to access unoccupied slot 412. In some embodiments, robot 404 may change tools to transition from transporting custom server 406 to removing blanking plate 408. In some embodiments, a blanking plate, such as blanking plate 408 may be configured to swivel when a custom server is installed in a slot without the blanking plate being removed.

As shown in FIG. 4C, robot 404 may set down blanking plate 408 and install custom server 406 in unoccupied slot 412. In some embodiments, robot 404 may change tools to install custom server 406 in unoccupied slot 412.

In some embodiments, a robot, such as any of the robots described herein may be a robot with an arm configured to move about 6 axis. This may be referred to as a 6-axis robotic arm.

In some embodiments, a data center may be designed to be a "lights out" operation wherein robots as described herein install servers in the data center without human intervention. For example, robot 404 and robots 202 and 303 may assemble and install custom servers in a server mounting structure of a data center without human intervention.

Because a data center hall may be designed for limited human access, restrictions on rack heights may be relaxed. For example, whereas a conventional rack may be designed such that a human can install servers in the slots of the conventional rack, a data center including robotic installation, as described herein, may include server mounting structures that are considerably taller than conventional racks. For example, in some embodiments, a server mounting structure may be 40' tall or taller.

In some embodiments, an automated installation and retrieval system (AIRS) may be included in a data center to install servers in a server mounting structure. Also, in some embodiments, larger items may be installed in a server mounting structure using an automated stocking and retrieval system (ASRS). In some embodiments, a single system may function as both an AIRS and an ASRS.

Figure 5A:
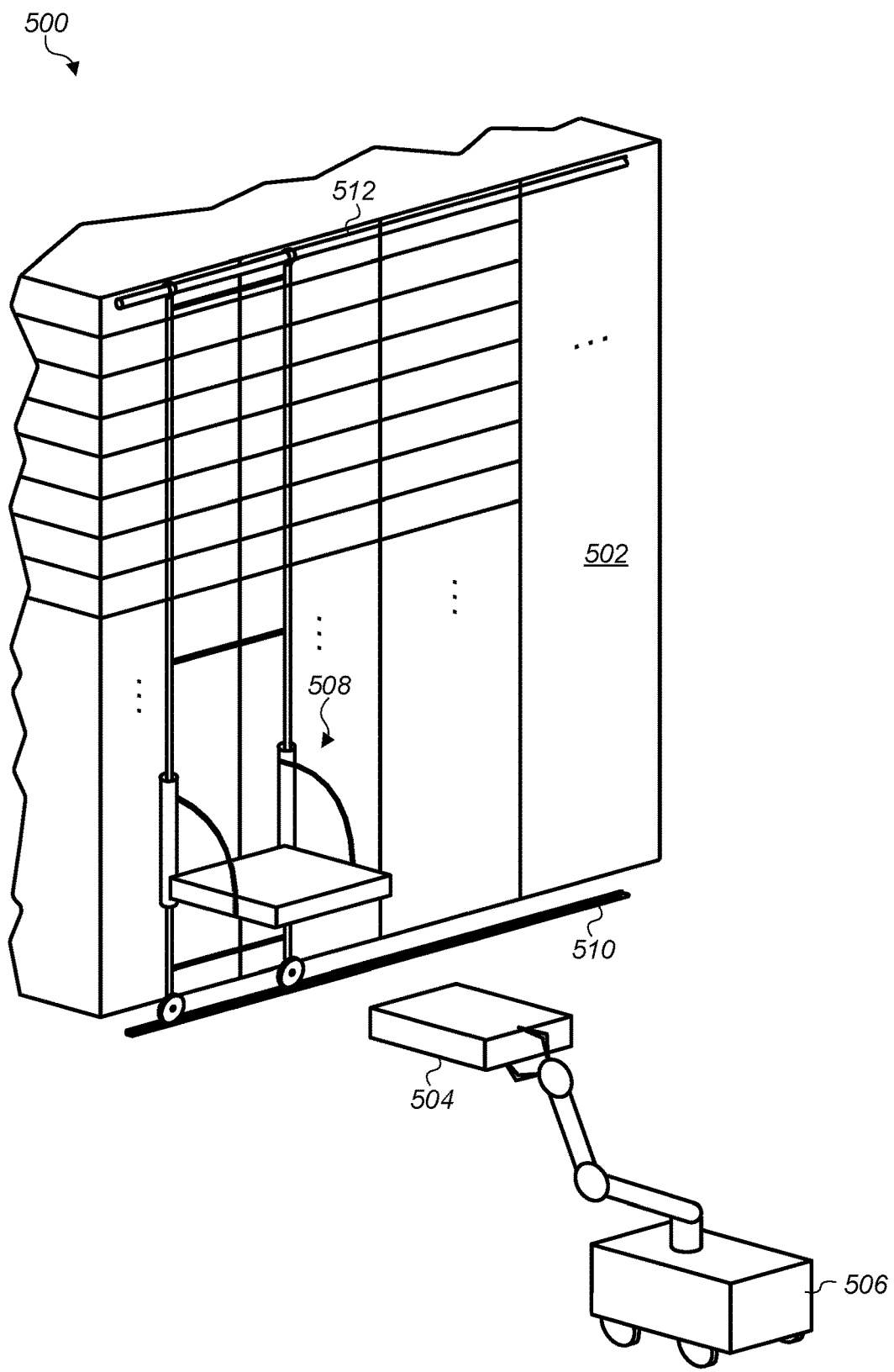
FIG. 5A illustrates a perspective view of a robot delivering a custom server to an automated installation and retrieval system (AIRS) of a data center, according to some embodiments.

FIG. 5A illustrates a perspective view of a robot delivering a custom server to an automated installation and retrieval system (AIRS) of a data center, according to some embodiments.

Data center 500 includes server mounting structure 502, a rail system including top rail 512 and bottom rail 510, and lifting device 508 coupled to the rail system. In some embodiments, a lifting device, such as lifting device 508, may be included in an AIRS or an ASRS. As shown in FIG. 5A, robot 506 delivers custom server 504 to lifting device 508.

Figure 5B:
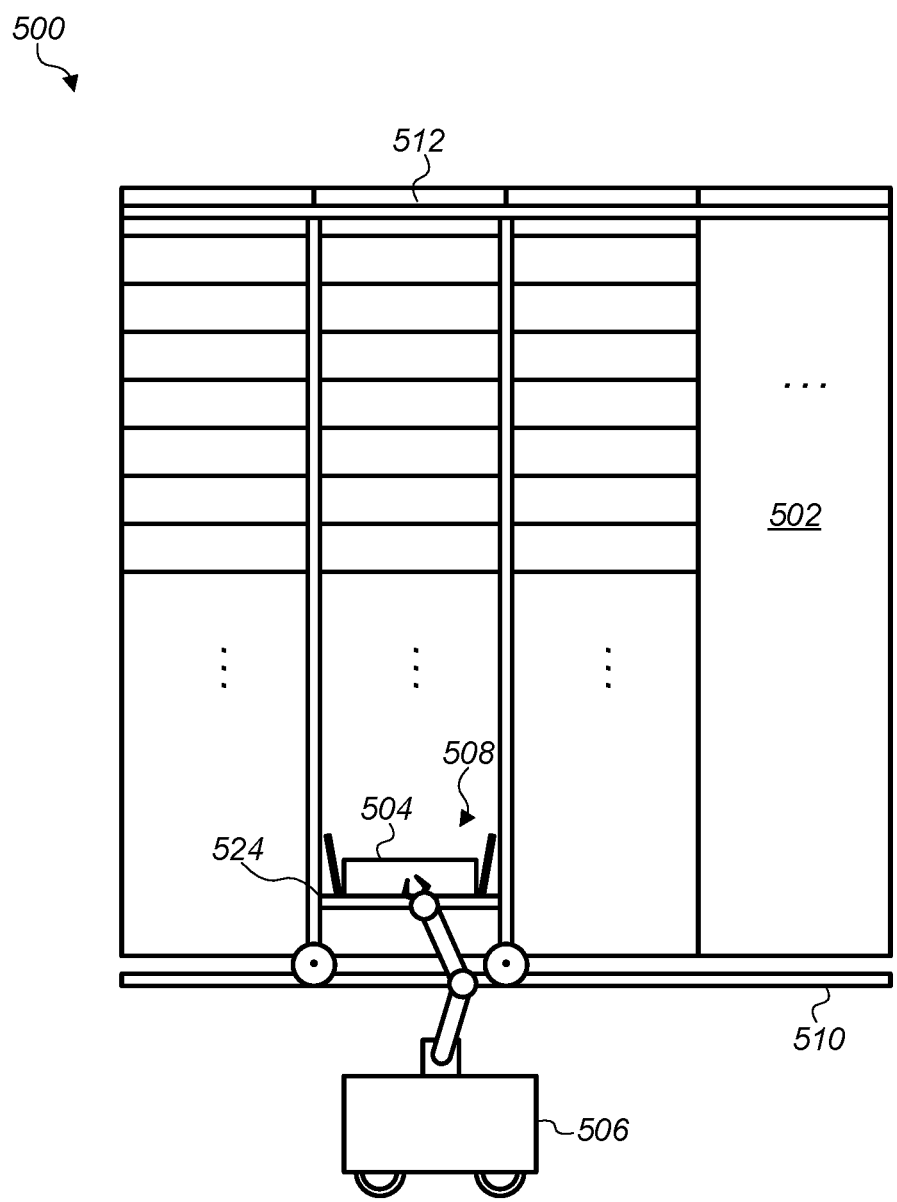
FIG. 5B illustrates a front view of a robot placing a custom server on a lifting plate of an automated installation and retrieval system (AIRS) of a data center, according to some embodiments.

FIG. 5B illustrates a front view of a robot placing a custom server on a lifting plate of an automated installation and retrieval system (AIRS) of a data center, according to some embodiments. As shown in FIG. 5B, robot 506 places custom server 504 on lifting plate 524.

Figure 5C:
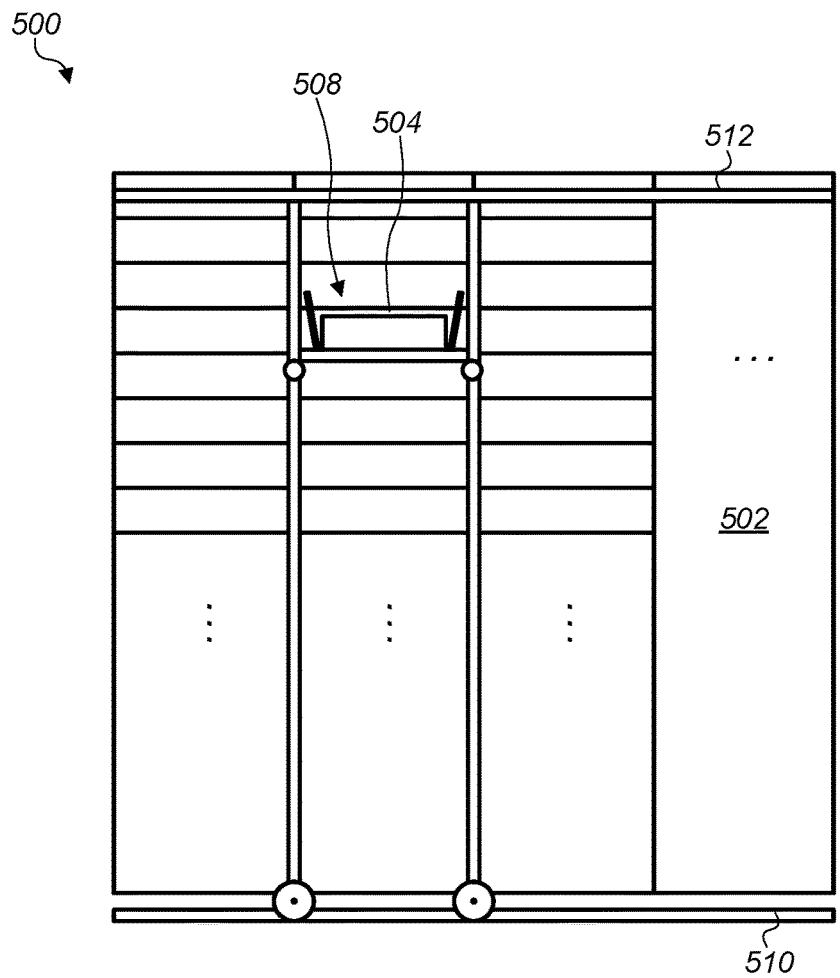
FIG. 5C illustrates a front view an automated installation and retrieval system (AIRS) installing a custom server in a slot of a server mounting structure of a data center, according to some embodiments.

FIG. 5C illustrates a front view an automated installation and retrieval system (AIRS) installing a custom server in a slot of a server mounting structure of a data center, according to some embodiments. As shown in FIG. 5C, lifting device 508 elevates custom server 504 to an unoccupied slot in which custom server 504 is to be installed.

Figure 5D:
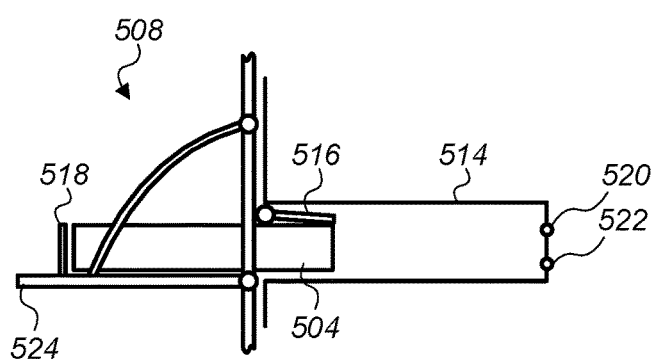
FIG. 5D illustrates a side view of a lifting device of an automated installation and retrieval system (AIRS) installing a custom server in a slot of a server mounting structure of a data center, according to some embodiments.

FIG. 5D illustrates a side view of a lifting device of an automated installation and retrieval system (AIRS) installing a custom server in a slot of a server mounting structure of a data center, according to some embodiments.

In some embodiments, a lifting device of an AIRS or ASRS, may include an insertion stop, such as insertion stop 518. Also, in some embodiments, a slot of a server mounting structure, such as slot 514, may be configured to accept installation of a custom server from a lifting device without human intervention. For example, unoccupied slot 514 includes blind-mate connections 520 and 522 that provide power and network connections for a custom server to be installed in unoccupied slot 514. Additionally, in some embodiments, a slot of a server mounting structure, such as unoccupied slot 514, may include a retractable blanking plate, such as blanking plate 516.

For example, blanking plate 516 may be mounted to a server mounting structure on a swivel such that insertion of custom server 504 causes the blanking plate 516 to swing back into the server mounting structure and allows for insertion of custom server 504. In some embodiments, a retractable blanking plate, such as blanking plate 516, may automatically swing closed when a server is removed from an associated slot. In some embodiments, a retractable blanking plate may automatically close due to gravity. In some embodiments, a retractable blanking plate may be operated via an actuator or other suitable device.

Figure 5E:
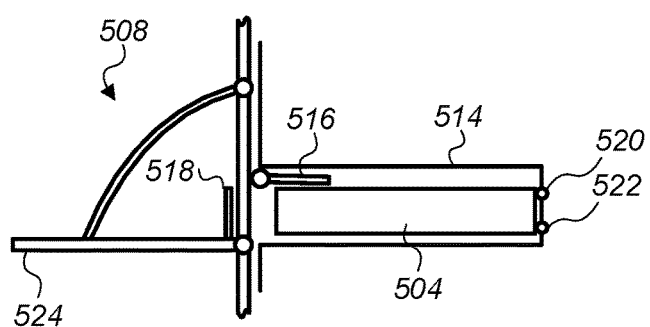
FIG. 5E illustrates a side view of a lifting device of an automated installation and retrieval system (AIRS) that has installed a custom server in a slot of a server mounting structure of a data center, according to some embodiments.

FIG. 5E illustrates a side view of a lifting device of an automated installation and retrieval system (AIRS) that has installed a custom server in a slot of a server mounting structure of a data center, according to some embodiments.

As shown in FIG. 5E an insertion stop of a lifting device, such as insertion stop 518 may move towards a slot of a server mounting structure causing a server placed on a lifting plate, such as lifting plate 524, of the lifting device to be inserted in the slot. While not shown, in some embodiments an insertion stop may further include a hook, claw, or other device configured to grip a server already installed in a slot and extract the server from the slot onto a lifting plate of the lifting device.

In some embodiments, a lifting device as described herein may lift individual servers and may be used in an automated installation and retrieval system (AIRS). In some embodiments, a lifting device as described herein, may lift sets of servers mounted in a rack or other structure and may be used in an automated stocking and retrieval system (ASRS).

In some embodiments, a track system for a lifting device may span multiple aisle of a data center.

Figure 6:
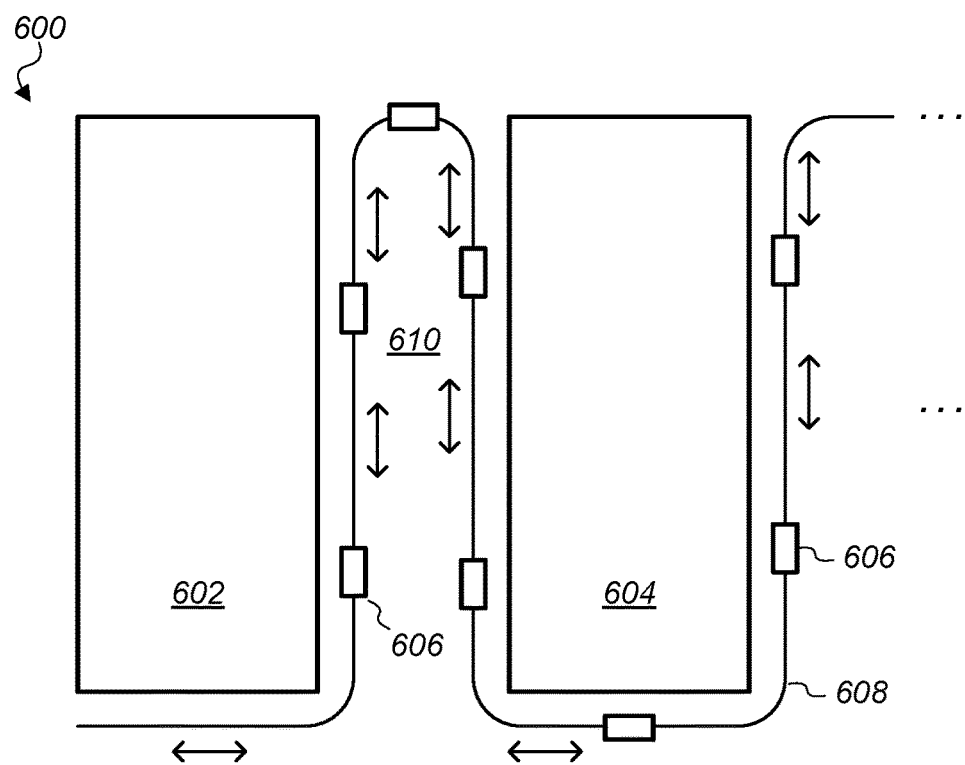
FIG. 6 illustrates a top view of a data center hall that includes a track-mounted automated installation and retrieval system (AIRS) or a track-mounted automated stocking and retrieval system (ASRS), according to some embodiments.

FIG. 6 illustrates a block diagram illustrating a top view of a data center hall that includes a track-mounted automated installation and retrieval system (AIRS) or a track-mounted automated stocking and retrieval system (ASRS), according to some embodiments.

Data center hall 600, which may be one of multiple data center halls of a data center, includes server mounting structures 602 and 604 and an aisle 610 between the server mounting structures. In some embodiments, a data center hall may include any number of server mounting structures and aisles. In some embodiments, a track system may connect multiple aisles, such that a lifting device may move from one aisle to another aisle via the track system. For example, data center hall 600 includes track system 608 that allows lifting device 606 to move to different slot locations along an aisle and to different aisles in the data center hall.

In some embodiments, a lifting device of an automated installation and retrieval system (AIRS) or an automated stocking and retrieval system (ASRS) may be configured with wheels that allow the lifting device to move around a data center hall without using a track system.

Figure 7:
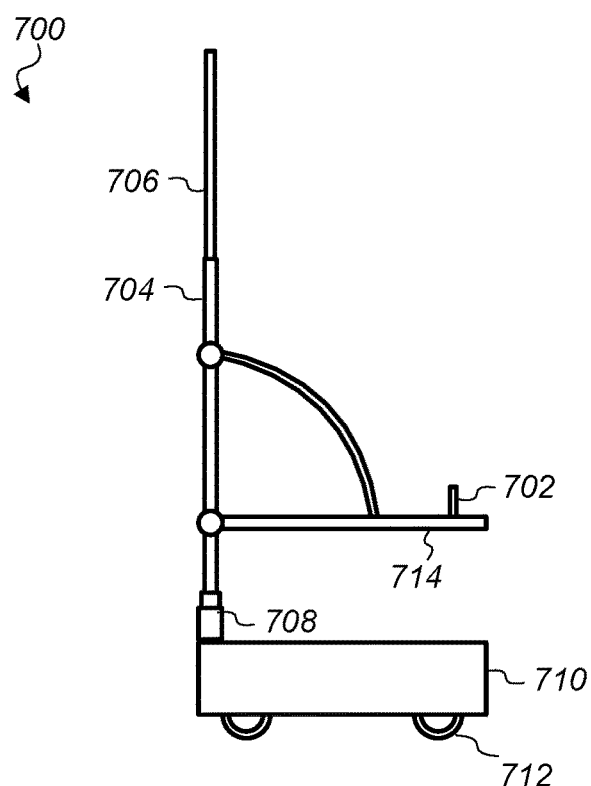
FIG. 7 is a side view of a lifting device of an automated installation and retrieval system (AIRS) or an automated stocking and retrieval system (ASRS), according to some embodiments.

FIG. 7 is a side view of an automated installation and retrieval system (AIRS) or an automated stocking and retrieval system (ASRS), according to some embodiments.

For example, lifting device 700 includes base 710 and wheels 712. In some embodiments, base 700 may include a counter weight that prevents lifting device 700 from tipping over when lifting a server or rack of servers. Lifting device 700 also includes a lifting plate 714 and insertion stop 702. In some embodiments, an insertion stop, such as insertion stop 702, may push a server into an unoccupied slot and pull a server from an occupied slot.

In some embodiments, a lifting device, such as lifting device 700, may include a retractable mast structure 704. For example, mast elements 706 and 708 of mast structure 704 may collapse to make the lifting device more mobile, for example when moving between aisles of a data center, and may extend such that the lifting device can reach greater heights when inserting or retrieving a server or rack of servers from a server mounting structure. For example, in some embodiments, a retractable mast structure, such as retractable mast structure 704, may extend to over 40' high or may retract to a smaller height, such as 6' or less.

Figure 8:
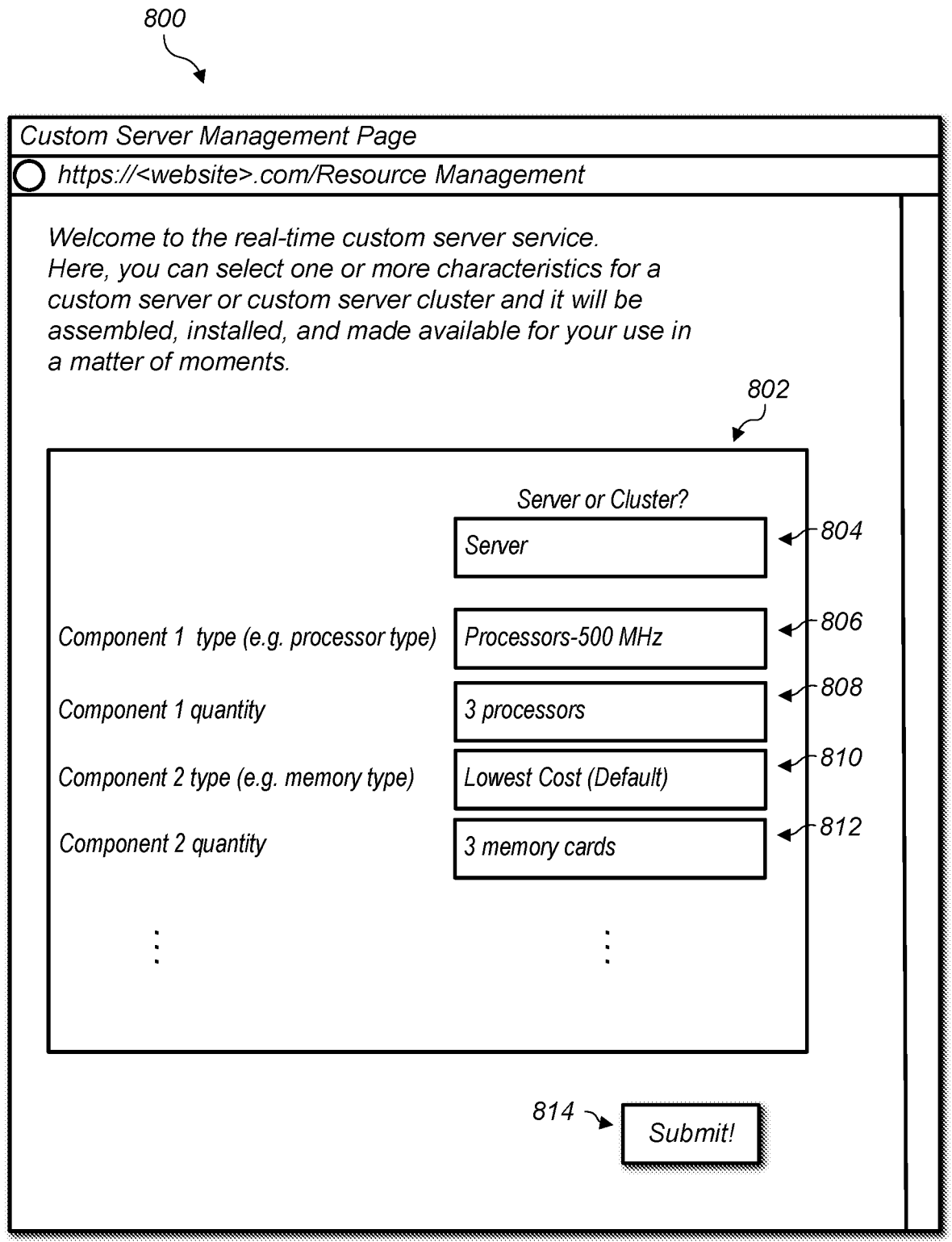
FIG. 8 illustrates an example user interface implemented by a service provider for requesting custom servers, according to some embodiments.

FIG. 8 illustrates an example user interface implemented by a service provider for requesting custom servers, according to some embodiments.

In some embodiments, a service provider may allow clients of the service provider to specify characteristics of one or more custom servers that are to be used to execute workloads on behalf of the clients. For example, a service provider network may include one or more computing devices that implement a user interface, such as user interface 118 described in FIG. 1. The user interface may provide an interface to a client such as the interface 800 illustrated in FIG. 8.

In some embodiments, an interface, such as interface 800, may include a field allowing a client to indicate if a custom server is requested or if a cluster of servers that include one or more custom servers is requested. For example, interface 800 includes box 802 that includes a field 804 for selecting a server or a cluster.

In some embodiments, an interface, such as interface 800, may include one or more fields for selecting a type and quantity of components, such as processors, to be included in a custom server or cluster. Also, in some embodiments, an interface, such as interface 800 may include one or more other fields for selecting a type and quantity of other components, such as memory cards or storage devices, to be included in a custom server or cluster. In some embodiments, an interface, such as interface 800, may include additional fields for specifying other characteristics of a custom server.

For example, box 802 includes field 804 for selecting a processor type for processors to be included in a custom server or cluster. As an example, field 804 indicates that a 500 MHz processor type is requested. In some embodiments, processor types may be selected in various ways, for example based on manufacturer, based on application type, e.g. graphics, etc., based on speed, or based on various other categories. Box 802 also includes field 808 indicating that 3 of the 500 MHz processors are to be included in the requested custom server. In some embodiments, a user interface, such as user interface 800 may include multiple boxes 802 for selecting different quantities of different types of components to be included in a custom server. For example, a client may request a certain quantity of CPU processors of a certain type and a different quantity of graphics processors of a certain type to be included in a custom server.

As another example, box 802, also includes field 810 for selecting a type of memory card to be included in a custom server and a field 812 for indicating the quantity of the selected type of memory card to be included in the custom server. For example, FIG. 8 indicates a default memory type is to be used and that 3 memory cards are to be used in the custom server. In a similar manner as described above, in some embodiments a user interface may include multiple boxes 802 for selecting multiple types of a particular component, such as memory cards, to be included in a custom server and for indicating respective quantities of the different types of components, such as memory cards, that are to be included in the custom server.

Additionally, in some embodiments, a user interface such as user interface 800, may include additional boxes 802 for specifying types and quantities of other components to be included in a custom server.

User interface 800 also includes a submit button 814. In response to a client selecting the submit button, a server assembly controller may cause one or more robots to assemble the requested custom server and install the assembled custom server in an unoccupied slot of a server mounting structure. The robots that assemble the custom server may be located at the same data center where the custom server is installed and the custom server may be assembled and installed in near real-time. For example in a matter of minutes, hours, or possibly overnight the requested custom server may be assembled and installed. Once the custom server is installed, it may be made available to perform workloads on behalf of the client.

Figure 9:
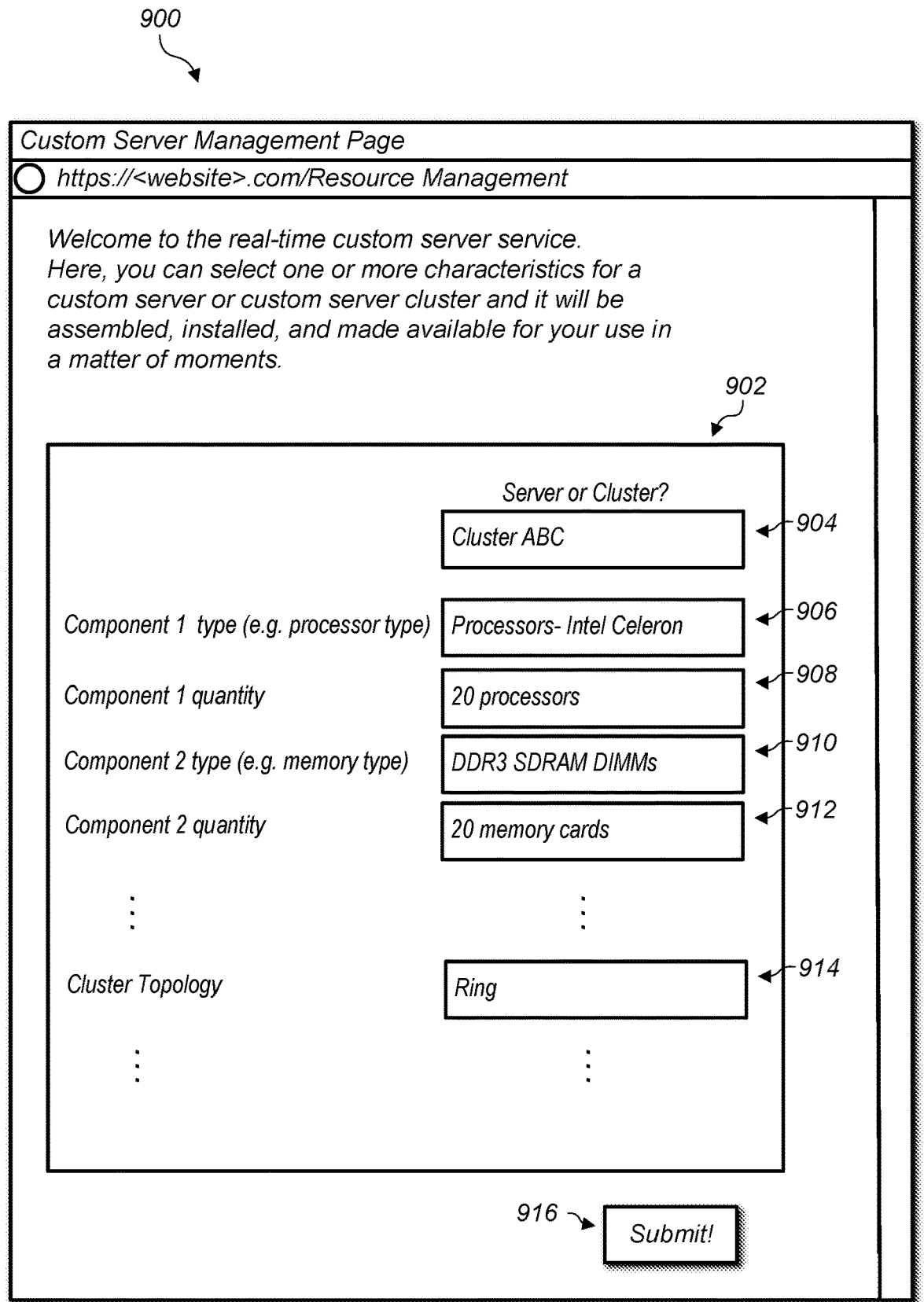
FIG. 9 illustrates an example user interface implemented by a service provider for requesting a custom cluster of servers, according to some embodiments.

FIG. 9 illustrates an example user interface implemented by a service provider for requesting a custom cluster of servers, according to some embodiments.

In a similar manner as described for FIG. 8, a client may select a cluster and specify component types and quantities, such as processor types and quantities and also memory types and quantities, for a custom cluster. Also, in some embodiments, a client may specify other characteristics for a custom cluster. For example, a client may make a specification that implies an existing installed server is to be included in the custom cluster. Also, a client may specify configuration characteristics for the custom cluster, such as a cluster topology or a cluster interconnect protocol. In some embodiments, it may be less important to a client that requested components be included in a single server, but it may be more relevant to the client than a group of servers clustered together include requested components having certain capabilities.

For example, in some embodiments, servers included in a cluster may be placed in proximity to each other such that a number of network hops, a latency, etc. between the servers of the cluster is less than a threshold amount. In some embodiments, a user interface 900 for selecting a custom cluster may include one or more boxes 902 for selecting types and quantities of components to be included in the cluster. For example, box 902 includes field 904 indicating that the request is for cluster ABC. In some embodiments, user interface 900 may be used to request a new cluster, or in conjunction with user interface 1000 described in FIG. 10, may be used to add additional capacity to an existing cluster. Continuing the example, box 902 also includes field 904 for indicating a type of a first component, such as a processor, to be included in the custom cluster and a field 906 for indicating a quantity of the selected component type to be included in the custom cluster. Additionally, box 902 includes a field 910 for indicating a type of another component, such as a memory card or storage device, to be included in the custom cluster and a field 912 for indicating a quantity of the selected component type to be included in the custom cluster. As discussed above, in some embodiments a user interface 900 may include multiple boxes 902 for specifying different quantities of different types of components to be included in a custom cluster. Additionally, in some embodiments a user interface 900 may allow a client to specify types and quantities of other components to be included in a custom cluster.

In some embodiments, a user interface, such as user interface 900, may also include one or more fields for indicating other configuration characteristics for a custom cluster, such as a cluster topology, cluster interconnect protocol, etc. For example, field 914 indicates that a ring topology has been selected. A ring topology may organize servers of the cluster in a ring. In other embodiments, other topologies may be available for selection such as a mesh topology or other suitable topologies.

Additionally, user interface 900 includes a submit button 916. In response to the request being submitted via user interface 900, one or more robots at a data center may automatically assemble one or more servers for the requested cluster and place the assembled servers in proximity to one another. Furthermore, a manager of a service of the service provider may make the placed (e.g. installed) servers available to perform workloads on behalf of the requestor. In some embodiments, the cluster may be made available in a matter of minutes, hours, or possibly overnight.

Figure 10:
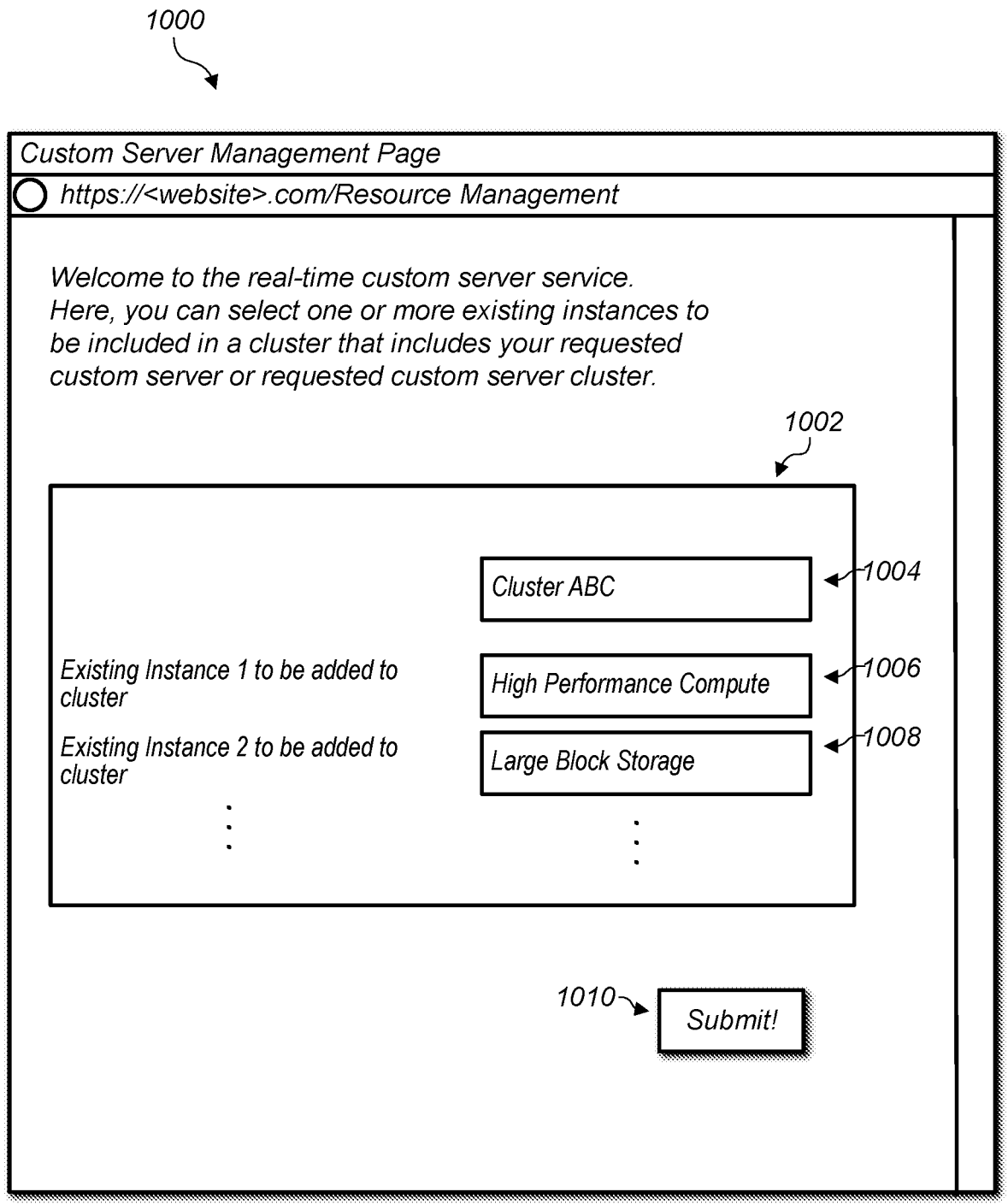
FIG. 10 illustrates an example user interface implemented by a service provider for requesting one or more already installed compute resources be included in a cluster with a custom server, according to some embodiments.

FIG. 10 illustrates an example user interface implemented by a service provider for requesting one or more already installed compute resources be included in a cluster with a custom server, according to some embodiments.

As discussed above, in some embodiments, a client may include one or more already placed servers in a requested cluster. For example user interface 1000 includes a box 1002 for selecting already placed servers to be included in a requested cluster. For example, box 1002 includes field 1004 for indicating a cluster in which the already placed servers are to be included and fields 1006 and 1008 for indicating which already placed servers are to be included in the indicated cluster.

In some embodiments, a client may indicate abstract resources, such as a high performance compute instance to be included in a custom cluster without knowledge of the details of what physical server the high performance compute instance resides on. In such situations, a server placement controller may determine where the physical server that implements the abstract resource, such as the high performance compute instance, is located and may select a placement location for additional servers of the custom cluster that are proximate to the already placed server. In some embodiments, a server placement a controller may move an abstract resource implementation location in order to place the resource in a location proximate to other servers included in a cluster. For example, if a client requests an existing high compute resource be included in a cluster with a newly requested custom server, there may be insufficient space in a server mounting structure to place the requested custom server proximate to a server that implements the existing high performance compute instance. In such a situation, a server placement controller may place the custom server in an unoccupied slot with one or more proximate unoccupied slots and may further place another server in one of the proximate unoccupied slots. The server placement controller may then cause one or more configuration operations to be performed to relocate the high performance resource instance to the server placed proximate to the custom server.

Figure 11:
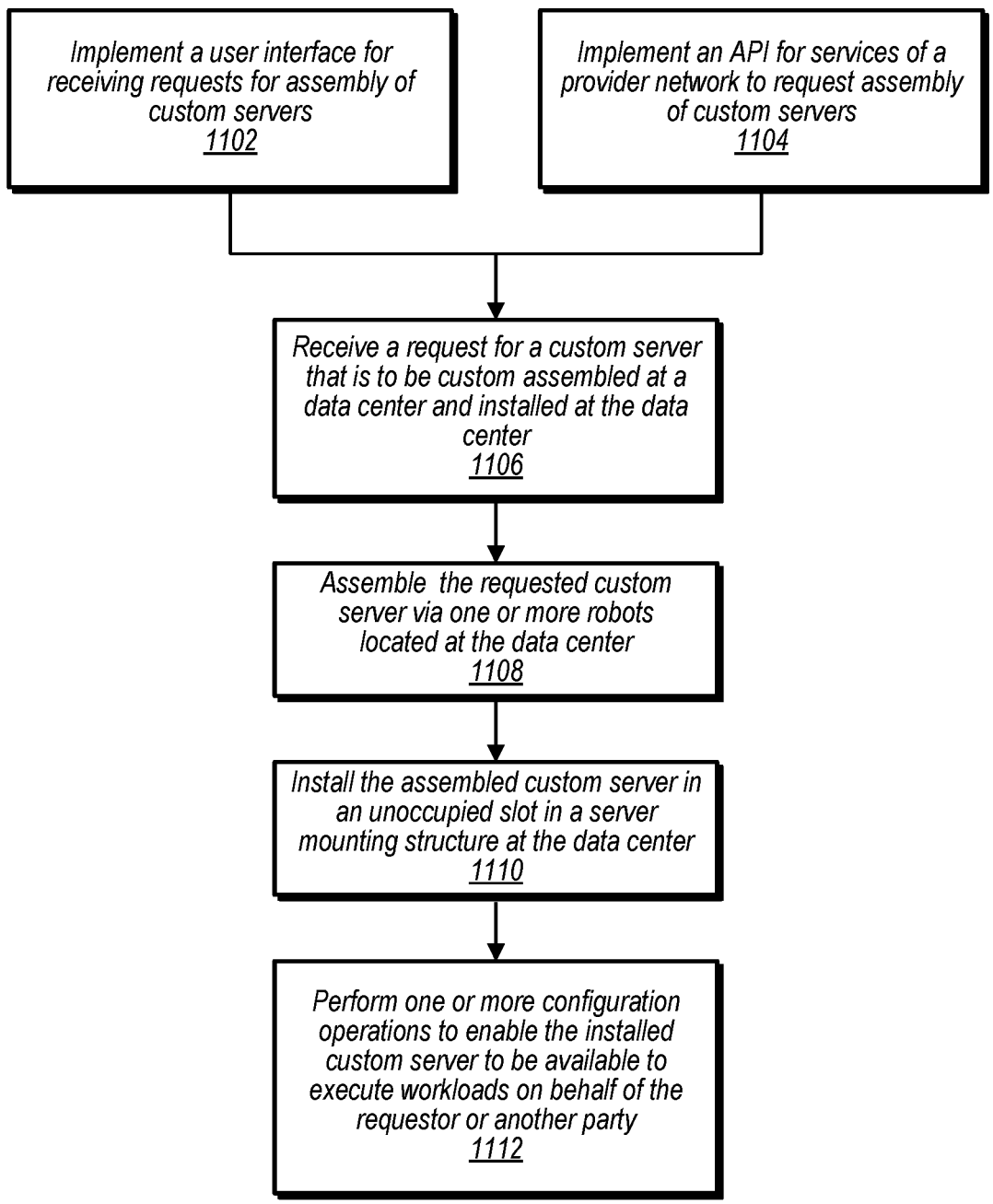
FIG. 11 is a high-level flowchart illustrating various methods and techniques for providing a near real-time custom server service, according to some embodiments.

FIG. 11 is a high-level flowchart illustrating various methods and techniques for providing a near real-time custom server service, according to some embodiments.

At 1102 a service provider network implements a user interface for receiving requests for assembly of custom servers. In some embodiments, the user interface may be implemented by a server assembly controller or another user interface of a provider network may implement the user interface and provide requests to a server assembly controller of a provider network. Additionally or alternatively, at 1104, a service provider network may implement an application programmatic interface (API) to a server assembly controller. The API may allow clients or other services of a service provider network request assembly of custom servers or custom clusters.

At 1106, a server assembly controller of a provider network receives a request for a custom assembled server or custom cluster, for example via a user interface or an API.

At 1108, the requested custom server is assembled by one or more robots at data center location where the custom server is to be installed.

At 1110, the assembled custom server is installed in an unoccupied slot of a server mounting structure at the data center where the custom server was assembled. In some embodiments, a server placement controller may select a particular slot from a plurality of available unoccupied slots based on support infrastructure needs of the custom server and support infrastructure availability at the unoccupied slots. Also, proximity to other attached servers may be taken into consideration when selecting an unoccupied slot for installation of the custom assembled server. For example, locations of other servers in the same cluster may be taken into consideration when selecting a placement location.

At 1112, a service provider manager, such as a hypervisor, performs one or more configuration operations to enable the installed custom assembled server to be available to execute workloads on behalf of the requestor. For example, the custom assembled server may be made available to perform workloads on behalf of a client that requested the custom assembled server via a user interface. Also, the custom assembled server may be made available to be included in a fleet of servers that implement a service of the service provider network. For example, a service of the service provider network may have requested additional servers having one or more particular configurations via an API to a server assembly controller of the service provider network and the installed assembled servers may be made available for use by the requesting service.

Figure 12:
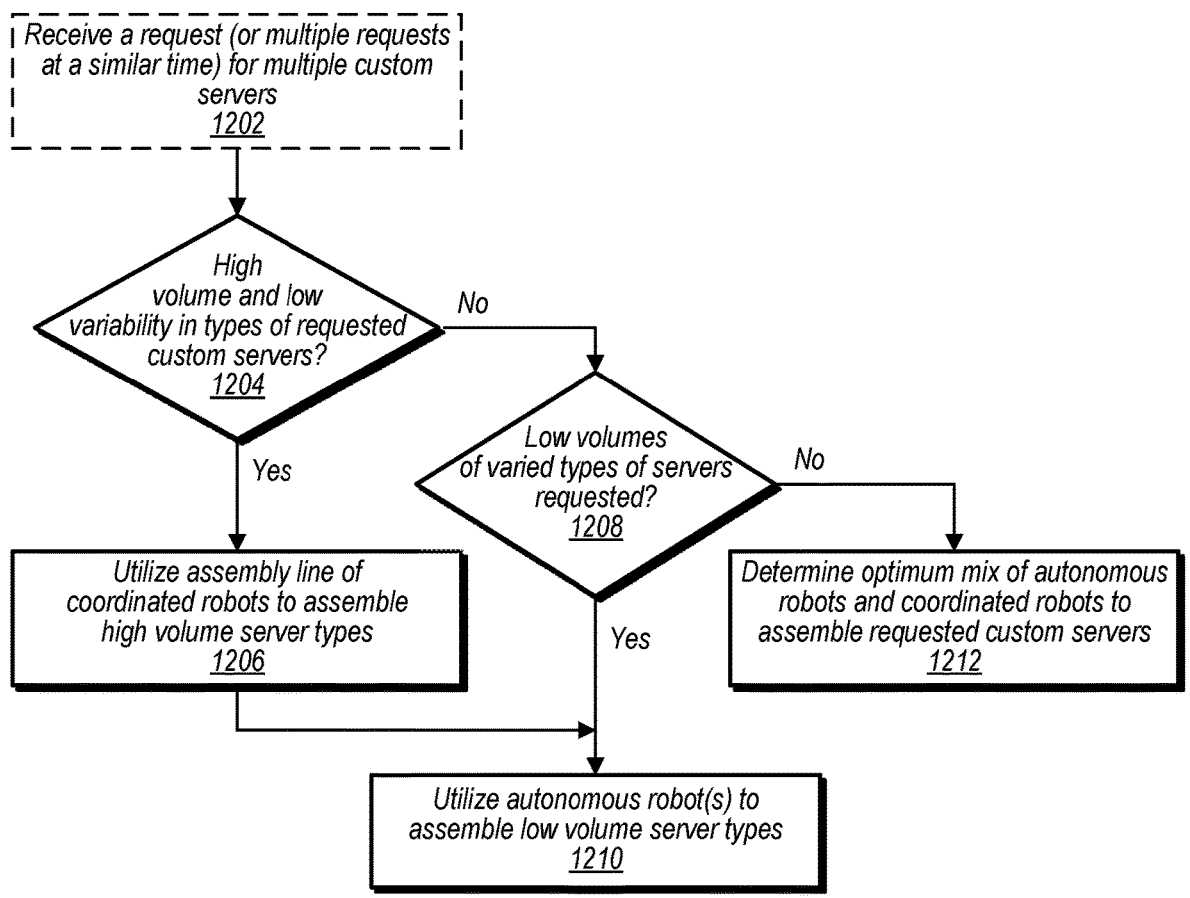
FIG. 12 is a high-level flowchart illustrating various methods and techniques for assembling custom servers using robots of a near real-time custom server service, according to some embodiments.

FIG. 12 is a high-level flowchart illustrating various methods and techniques for assembling custom servers using robots of a near real-time custom server service, according to some embodiments.

At 1202 a server assembly controller receives a request for multiple custom servers or multiple request at a similar time for multiple custom servers. For example, the requests may have been received at 1106.

In some embodiments, a server assembly controller determines at 1204 whether the multiple requested custom servers include a high volume of custom servers having a common configuration or whether the multiple requested servers include low volumes of multiple types of server configurations. If there is a high volume of a common configuration type, at 1206 the server assembly controller causes robots assembling the high volume of custom servers having the common server configuration to coordinate with one another to assemble the high volume of custom servers with the common server configuration, for example utilizing an assembly line. In some embodiments, one or more weighted scores and/or threshold as described above, may be used to determine whether the multiple requested custom servers include a high volume of custom servers having a common configuration or whether the multiple requested servers include low volumes of multiple types of server configurations.

If the requested custom servers do not include a high volume of a common server configuration, the server assembly controller determines at 1208 whether the requested custom servers comprise low volumes of varied server types. If the answer is yes, the server assembly controller causes multiple robots to autonomously assemble the different custom servers having different configurations at 1210. If the answer is no, at 1212 the server assembly controller determines a mix of autonomous and coordinated robots to assemble the requested custom servers.

Custom Server Placement System

In some embodiments, a computing facility, or a provider network comprising multiple computing facilities, may further include a server placement controller for determining placement locations for custom assembled servers.

Whereas a single placement decision for a group of non-custom servers may be made for the group, custom servers assembled at a data center may be placed individually or in smaller groups than would be the case for non-custom servers. Also, non-custom servers that are placed as a large group may typically be placed in slots with infrastructure support systems designed, in advance, to meet the needs of the large group of servers. In such a situation, the configurations of the servers to be placed as a large group are known when the infrastructure support systems are designed and built, and the infrastructure support systems are designed to meet these known requirements. In contrast, custom server configurations and quantities of different configurations of custom servers may not be known when server mounting structures and infrastructure support systems are being designed and built. Because custom servers are assembled in real-time or near real-time, what custom server configurations and quantities of different custom server configurations that will be installed in a server mounting structure may not be known at the time the server mounting structure and related infrastructure support systems are designed and built. Because of this unknown nature of what custom server configurations will ultimately be installed in a server mounting structure, allocation of infrastructure resources and placement decisions are more complex for near real-time custom servers than is the case for non-custom servers with configurations that are known in advance of designing infrastructure support systems.

In some embodiments, a server placement controller identifies unoccupied slots in a server mounting structure as candidates for placement of a custom server. The server placement controller also identifies infrastructure support requirements for the custom server, such as a power requirement, a networking requirement, a cooling requirement, requirements regarding other attached/associated servers, etc. The server placement controller makes an individual placement decision for an individual custom server to place the custom server in an unoccupied slot that meets the infrastructure support requirements for the custom server while making the most efficient use of infrastructure support system resources of a data center. In some embodiments, a server placement controller may also make a placement decision based on flexibility considerations to meet infrastructure support requirements of future custom servers that may be placed in the future, wherein the configurations of the future custom servers is not known when the placement decision for a given custom server is made.

In some embodiments, a server placement controller may follow a hierarchical decision process. For example, in some embodiments, a server placement controller may first perform an optimization for a power domain, wherein the server placement controller selects unoccupied slots that meet the infrastructure support requirements of the custom server and also optimizes use of power infrastructure support systems of the data center. As a second hierarchical consideration, the server placement controller may further optimize a networking domain. For example, if there are multiple unoccupied slots with similar power domain optimization results, the server placement controller may further compare the multiple unoccupied slots to determine if a placement in a particular one or more of the slots would make a more efficient or optimal use of networking infrastructure support resources of the data center. In some embodiments, a networking optimization may be performed at a rack level, aisle level, or larger network level, or a combination thereof. In some embodiments, an optimization may consider both power and networking and apply different weighting factors to each. For example, in some embodiments, a placement that is not the optimum for power and not the optimum for networking may be selected if a weighted score in regard to both power and networking optimization is better than other possible alternatives.

As a third hierarchical consideration, a server placement controller may further consider space optimization, wherein the server placement controller attempts to reduce unused slots. However, in some embodiments, a fully utilized server mounting structure may include at least some unoccupied slots that are covered with blanking plates.

As a fourth hierarchical consideration, a server placement controller may consider cooling infrastructure support optimization, wherein a server placement controller chooses a placement that optimizes use of cooling resources. In some embodiments, a cooling infrastructure support system for a data center hall may be designed with at least some excess capacity such that cooling is generally not a constrained infrastructure support system. However, nevertheless, a server placement controller may attempt to place custom servers that generate large amounts of waste heat at disperse locations in a server mounting structure, as opposed to concentrated locations that may cause a local hot spot.

In some embodiments, other hierarchical considerations may be considered by a server placement controller. Also, in some embodiments, other hierarchies may be used by a server placement controller to select a placement location for a custom server. For example, in some embodiments, the four hierarchical considerations described above may be considered in one or more other orders, e.g. cooling may be considered first, networking may be considered first, space may be considered first, etc.) In some embodiments, a simulation may be performed for each available unoccupied slot and hypothetical impacts for placement of a custom server may be determined in regard to multiple infrastructure support systems for placement of the custom server in each of the available slots. In some embodiments, weighting factors may be applied to the respective impacts on some or all of the infrastructure support systems to select a placement location for the custom server. In some embodiments a selected placement location may not be optimal for any one particular infrastructure support system, but may in the aggregate across multiple infrastructure support systems produce more efficient utilization of infrastructure support system resources than placement at other ones of the respective available unoccupied slots.

Figure 13A:
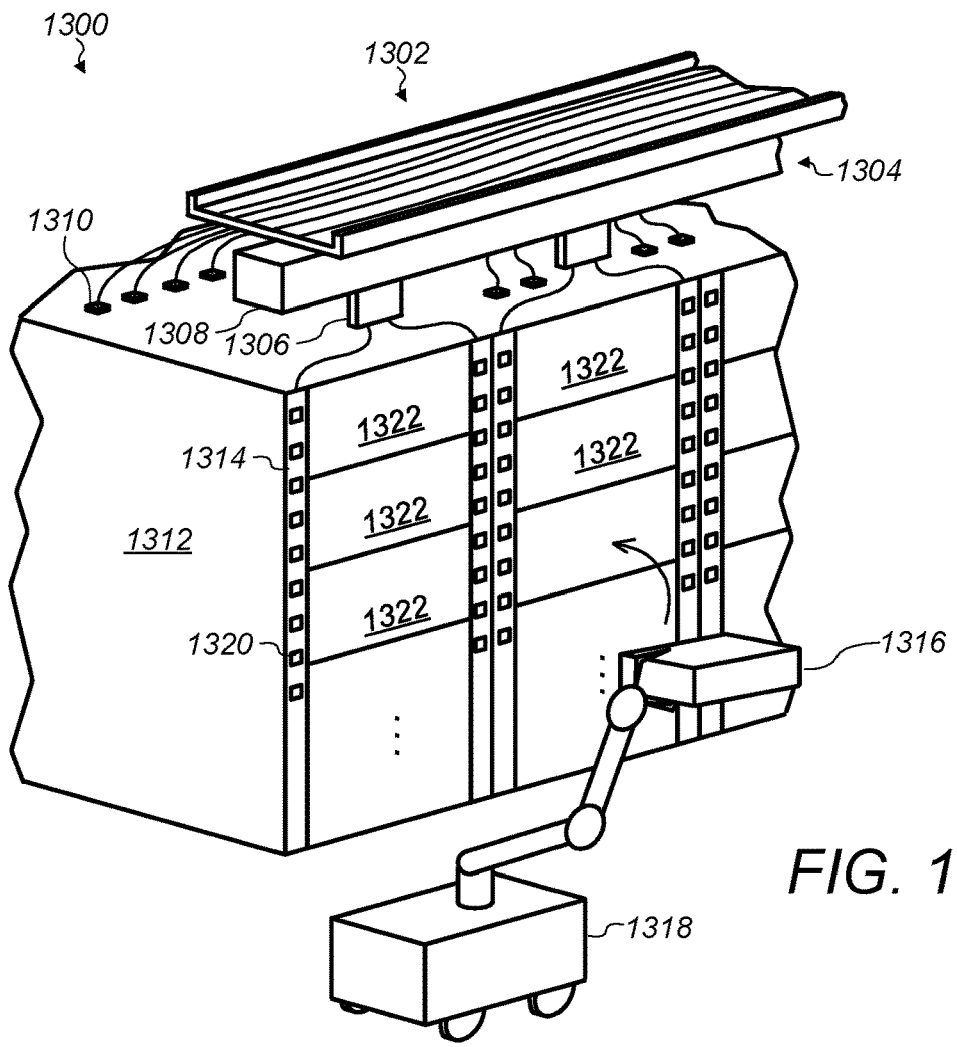
FIG. 13A is a perspective view of a robot of a near-real time custom server service delivering a custom server to a selected slot of a server mounting structure, according to some embodiments.

FIG. 13A is a perspective view of a robot of a near-real time custom server service delivering a custom server to a selected slot of a server mounting structure, according to some embodiments.

Data center 1300 includes server mounting structure 1312, power infrastructure support system 1304, and networking infrastructure support system 1302. Server mounting structure 1312 includes slots 1322.

In some embodiments, server mounting structure 1312, power infrastructure support system 1304, and networking infrastructure support system 1302 may be designed and built prior to custom servers being placed in slots 1322. In such embodiments, fixed amounts of power and networking capacity may be allocated to each slot. However, power capacity or network capacity of some slots that utilize less power capacity or network capacity may be utilized by other slots that include a custom server that requires more power or networking capacity. For example, power infrastructure support system 1304 includes tap boxes 1306 coupled to bus bar 1308, wherein the tap boxes 1306 each provide power to respective rack power distribution units 1314 that include power receptacles 1320. The power receptacles 1320 are spaced out evenly for the slots 1322 of server mounting structure 1312. In some embodiments, some custom servers may require less power than other custom servers and may utilize fewer power receptacles than other custom servers. Thus, as long as power requirements of a mix of custom servers installed in server mounting structure 1312 does not exceed the overall power receptacle capacity of the server mounting structure 1312, the power infrastructure support system 1304 may meet the power requirements of the custom servers. In a similar manner, networking infrastructure support system 1302 includes network connections 1310, wherein some custom servers mounted in slots 1322 may require more network connections than other custom servers mounted in slots 1322. In some embodiments, various networking connection types could be used, such as optical connections, copper connections, or various other types of network connections. While power infrastructure resources are described in terms of receptacles, in some embodiments, power infrastructure support system capacity may be allocated and consumed in other ways. For example, in some embodiments, power units may be allocated to a slot wherein a capacity of a bus bar is divided into power units. Also, in some embodiments, in a similar manner as described above in regard to power receptacles, power units allocated to a particular slot may be consumed by another slot. Similarly, while network infrastructure resources are described in terms of network connections, in some embodiments network infrastructure support system capacity may be allocated and consumed in other ways. For example, network units may be allocated to a slot, wherein a network unit represents a portion of capacity of a network to which the slot is configured to attach a custom server. For example a network unit, may be a bandwidth amount, or other measure of network capacity.

In order to determine a mix of custom servers and distribution of custom servers such that power, networking, cooling, and other infrastructure resources are efficiently used and stranded capacity is minimized, a server placement controller, such as server placement controller 1352, may make placement decisions for a custom server that take into account power, networking, cooling, space, etc. to determine an optimal placement location for a next incremental custom server. Furthermore, a server placement controller, such as server placement controller 1352, may cause a robot to install a custom server in the selected slot. For example, server placement controller 1352 may command robot 1318 to install custom server 1316 in a selected slot of server mounting structure 1312.

Figure 13B:
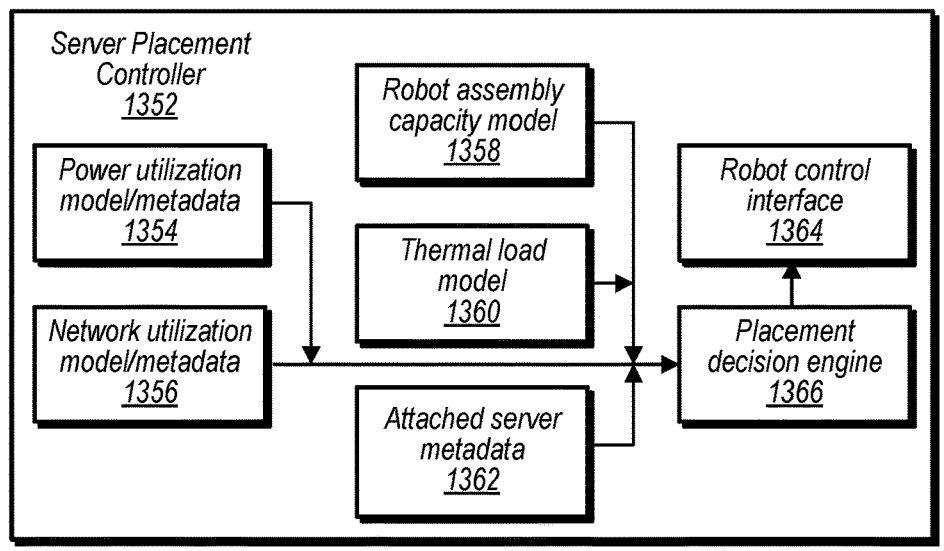
FIG. 13B is a block diagram illustrating a server placement controller that selects a placement location for a custom server based on infrastructure support requirements of the custom server and capacities of associated server support infrastructure systems at unoccupied slots of a server mounting structure, according to some embodiments.

FIG. 13B is a block diagram illustrating a server placement controller that selects a placement location for a custom server based on infrastructure support requirements of the custom server and capacities of associated server support infrastructure systems at unoccupied slots of a server mounting structure, according to some embodiments.

For example, server placement controller 1352 includes a power utilization model/data store 1354 that tracks power capacity availability at respective slots of a server mounting structure. For example, power utilization model and data store 1354 may track a number of available receptacles 1320 (or power units) at various slots 1322 and may further track receptacles (or power units) that are not used by adjacent slots 1322 that may be utilized by a particular slot 1322 to place a custom server having a particular power requirement. Note that power connectors are described for ease of illustration. However, in some embodiments power capacity may be measured in other power units, such as kilowatts consumed, amperes consumed, etc. and should not be interpreted to be limited to power receptacle availability.

As another example, server placement controller 1352 also includes network utilization model and data store 1356 that tracks available networking capacity at various slots of a server mounting structure and networking capacity being used by servers mounted in occupied slots of a server mounting structure. For simplicity of illustration, networking capacity is described in terms of network connections. However, in some embodiments, networking capacity could be tracked and allocated in other ways, such as bandwidth, etc.

Also, server placement controller 1352 includes thermal load model 1360 that tracks waste heat generated by various servers already placed in a server mounting structure and also determines available cooling infrastructure support capacity at various unoccupied slots of a server mounting structure, such as slots 1322 of server mounting structure 1312. In some embodiments, a server placement controller, such as server placement controller 1352, may also include an attached server model and data store 1362 that tracks associations between placed servers and to be placed servers. Additionally, in some embodiments, a server placement controller, such as server placement controller 1352, may include a robot assembly capacity model 1358 that tracks available assembly capacity at a plurality of custom server assembly locations at a data center.

Additionally, server placement controller 1352 includes placement decision engine 1366 which performs hierarchical analysis and/or a simulation to select an optimal or near-optimal placement location for a custom server taking into account power considerations, networking considerations, thermal considerations, attached server considerations, assembly capacity considerations, and/or various other factors. The placement decision engine 1366 may make a placement decision and a robot control interface 1364 may, in coordination with a server assembly controller, cause the custom server to be assembled in near real-time and installed in the selected placement location.

In some embodiments, a server placement controller 1352, may further take into consideration failure domains for servers allocated to a same client. For example, in some embodiments, in addition to or instead of, considering attached servers, attached server model and data store 1362 may further track servers allocated to the same client, servers performing similar operations, or servers that are related in other ways. In some embodiments, placement decision engine 1366 may further take into consideration failure domains when making a placement decision, wherein a selected placement location is selected such that related servers are placed in different failure domains.

In some embodiments, a server placement controller, such as server placement controller 1352, may further determine a momentum of server configurations being selected and may take the determined momentum into consideration when making a placement decisions for a custom server. For example, a momentum may include a trend in custom servers being placed, such as servers having particular configurations. Based on this momentum, a server placement controller may anticipate that additional custom servers having configurations according to the trend will need to be placed in the future. Accordingly, the server placement controller may make placement selections in the present with the anticipation that additional placements according to the trend will be needed in the future. In some embodiments, this may affect a weighting of different factors used to make a placement decision, such as a power, networking, cooling, space considerations, etc. based on anticipated capacity of these infrastructure support systems if the current trend continues.

In some embodiments, a server placement controller, such as server placement controller 1352, may further detect a failed server and in coordination with a server assembly controller, cause a replacement custom server to be assembled in near real-time and installed to replace the failed server.

Figure 14:
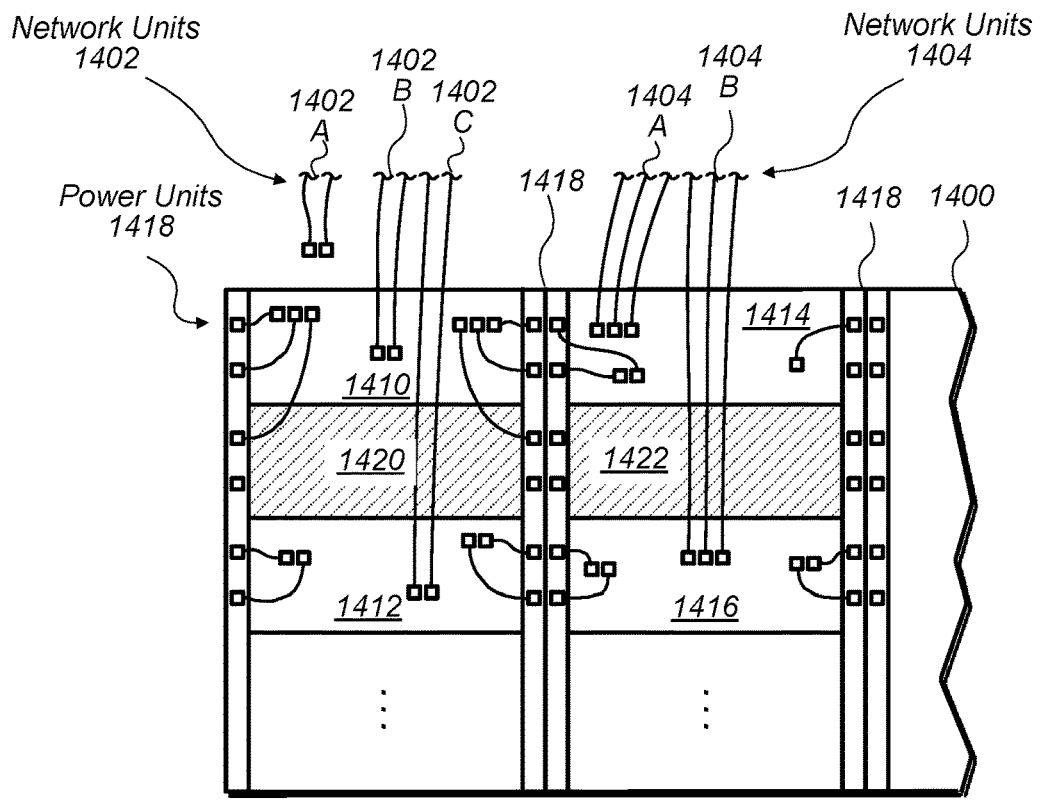
FIG. 14 illustrates a front view of a server mounting structure and associated power and network infrastructure support systems, according to some embodiments.

FIG. 14 illustrates a front view of a server mounting structure and associated power and network infrastructure support systems, according to some embodiments.

As an example of uneven distribution of infrastructure support system resources between slots and as an example of some slots remaining unoccupied, server mounting structure 1400 includes power units 1418, network units 1402 and 1404, and slots 1410, 1412, 1414, 1416, and unoccupied slots 1420 and 1422. As an example, a custom server mounted in slot 1410 and another custom server mounted in slot 1412, may have similar networking requirements. For example, network units 1402B are connected to a custom server in slot 1410 and network units 1402 C are connected to a custom server mounted in slot 1412. Note that unoccupied slot 1420 is covered with a blanking plate and network units 1402A, are not connected to a custom server. In this example, each slot may be allocated two network units, thus the network units, such as network connections, for unoccupied slot 1420 are unused because a custom server is not mounted in the unoccupied slot 1420. Continuing the example, six power units are utilized by the custom server mounted in slot 1410, while only four power units are utilized by the custom server mounted in 1412. Also, note that because slot 1420 is an unoccupied slot, two of the power units associated with unoccupied slot 1420 have been used to supply power to a custom server mounted in slot 1410.

As another example, the custom server mounted in slot 1414 utilizes three power units and the custom server mounted in slot 1416 utilizes four power units. However, each of the custom servers mounted in slots 1414 and 1416 utilize three network units. Since slot 1422 is unoccupied, the six network units available for slots 1414, 1422, and 1416 may be distributed with three network units for slot 1414, three network units for slot 1416 and zero network connections for unoccupied slot 1422.

As can be seen, by strategically placing custom servers requiring more power resources or networking resources adjacent to servers requiring less power or network resources or next to an unoccupied slot, the fixed power and networking resources associated with each slot may be flexibly deployed to accommodate custom servers having various combinations of infrastructure support system requirements. Thus, when a custom server is to be placed, a server placement controller may determine if infrastructure support system resources are available at an unoccupied slot to support the custom server's infrastructure support requirements, by not only looking at the infrastructure support system resources allocated to the particular unoccupied slot, but by also looking at the unused infrastructure support system resources of adjacent or proximate slots.

Figure 15:
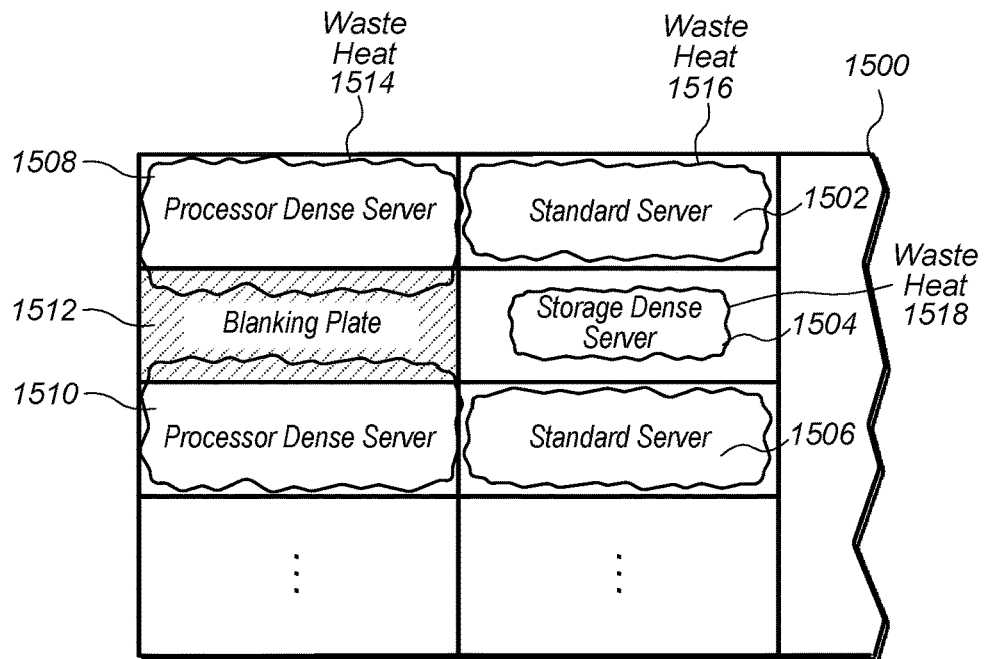
FIG. 15 illustrates a front view of a server mounting structure and associated cooling infrastructure support systems, according to some embodiments.

FIG. 15 illustrates a front view of a server mounting structure and associated cooling infrastructure support systems, according to some embodiments.

In a similar manner as described in FIG. 14 for power and networking resources, a server placement controller may strategically place custom servers in regard to waste heat generation/cooling infrastructure support system requirements.

For example, server mounting structure 1500 includes standard server 1502, storage dense server 1504, and standard server 1506 mounted adjacent to one another wherein the waste heat 1516 generated by each of the servers is such that a cooling capacity of a cooling infrastructure support system, such as an HVAC system computer room air conditioning (CRAC) system, server mounting structure fan system, etc., associated with server mounting structure 1500 is able to remove the waste heat 1516 from servers 1502, 1504, an 1508 without the waste heat 1516 affecting adjacent servers. In contrast, processor dense server 1508 and processor dense server 1510 may generate waste heat 1514 that exceeds a capacity of a cooling infrastructure support system to remove the waste heat without the waste heat affecting cooling of adjacently mounted servers. However, in some embodiments, a server placement controller may intentionally leave an unoccupied slot between processor dense server 1508 and processor dense server 1510 such that cooling capacity of the unoccupied slot, e.g. slot 1512, may be distributed to processor dense server 1508 and processor dense server 1510 to augment cooling capacity for processor dense server 1508 and processor dense server 1510.

As described above, a server placement controller, such as server placement controller 1352, may take into account multiple requirements for a custom server such as power, networking, cooling, etc. when determining a placement location for the custom server. Also, a server placement controller may consider these different requirements according to a hierarchy, or simulation, wherein optimal use of some infrastructure support systems is prioritized above optimal use of other infrastructure support systems.

Figure 16:
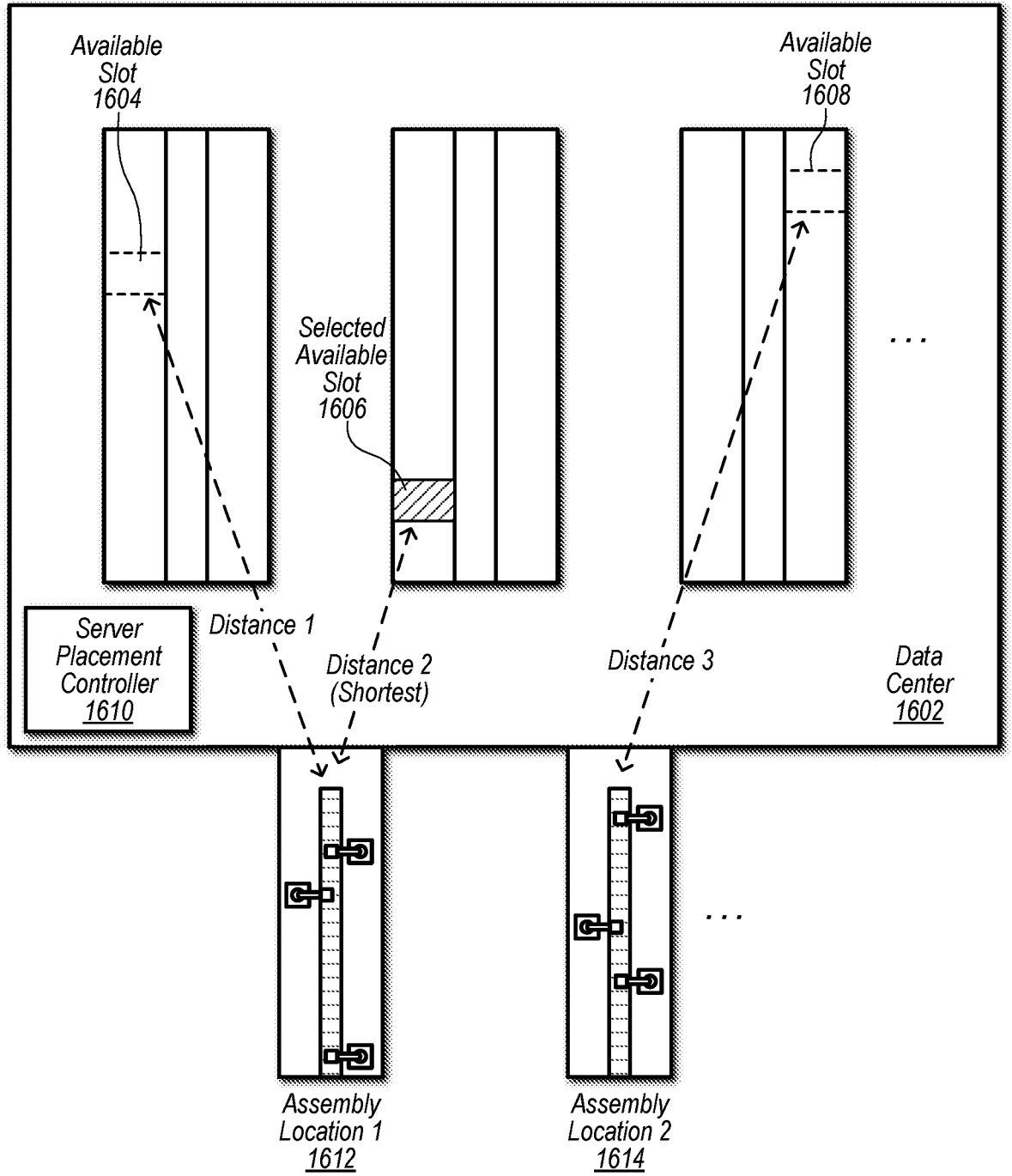
FIG. 16 illustrates a top view of a data center and coupled portable server assembly systems, wherein a server placement controller selects a placement location based on distances from assembly locations to unoccupied slots of a server mounting structure, according to some embodiments.

FIG. 16 illustrates a top view of a data center and coupled portable server assembly systems, wherein a server placement controller selects a placement location based on distances from assembly locations to unoccupied slots of a server mounting structure, according to some embodiments.

Data center 1602 includes a server placement controller 1610, which may be the same as server placement controller 120 illustrated in FIG. 1, server placement controller 1352, illustrated in FIG. 13, or any of the server placement controllers described herein.

In some embodiments, a server placement controller, such as server placement controller 1610, may further select a placement location based on a distance to a server assembly location. For example, server placement controller 1610 may determine that slots 1604, 1606, and 1608 are available slots for placement of a custom server. While power, networking, cooling, etc. may be considered when making the placement decision for the custom server, additionally, in some embodiments, the placement decision may be based, at least in part, on respective distances to assembly locations. For example, available slot 1606 is closer to assembly location 1 (1612) than is available slot 1604. Also a distance between available slot 1606 and assembly location 1 (1612) may be a shorter distance than a distance between assembly location 2 (1614) and available slot 1608. Thus, server placement controller 1610 may select to place the custom server in available slot 1606 that is closest to assembly location 1 (1612), where the custom server will be assembled.

Figure 17:
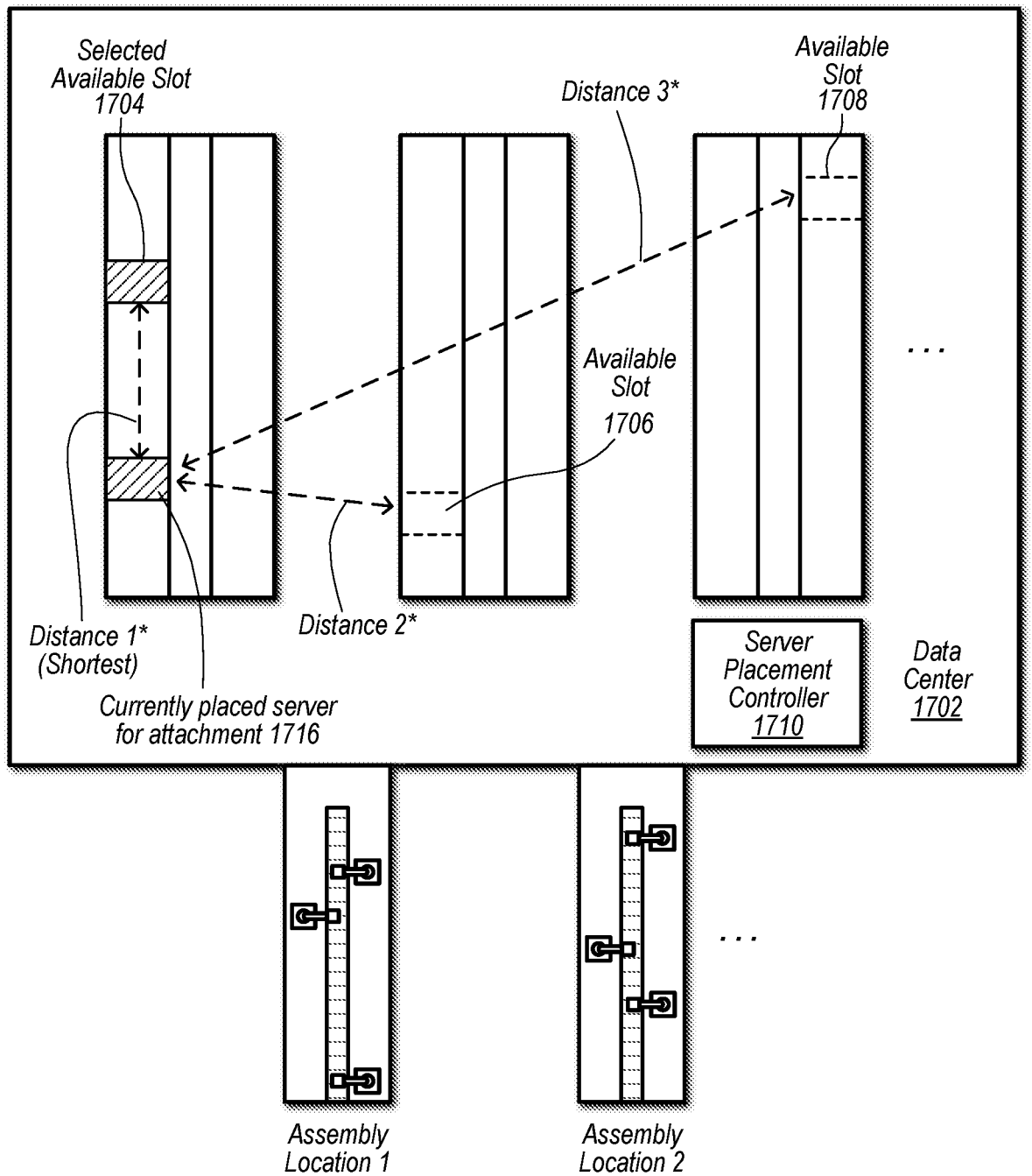
FIG. 17 illustrates a top view of a data center and coupled portable server assembly systems, wherein a server placement controller selects a placement location for a to-be-placed server based on distances from an already placed server to unoccupied slots of a server mounting structure, according to some embodiments.

FIG. 17 illustrates a top view of a data center and coupled portable server assembly systems, wherein a server placement controller selects a placement location for a to-be-placed server based on distances from an already placed server to unoccupied slots of a server mounting structure, according to some embodiments.

Data center 1702 includes a server placement controller 1710, which may be the same as server placement controller 120 illustrated in FIG. 1, server placement controller 1352, illustrated in FIG. 13, or any of the server placement controllers described herein.

In some embodiments, a server placement controller, such as server placement controller 1710, may further select a placement location based on a distance to an associated or attached server. An associated or attached server may be a server that will coordinate execution of one or more workloads with the custom server, once the custom server is placed and put into operation.

For example, server placement controller 1710 may determine that slots 1704, 1706, and 1608 are available slots for placement of a custom server. While power, networking, cooling, distance to assembly locations etc. may be considered when making the placement decision for the custom server, additionally, in some embodiments, the placement decision may be based, at least in part, on respective distances to related servers (either already installed or to be installed). For example, available slot 1704 is closer to currently placed server 1716 (which is a related or attached server) than is available slot 1706 or 1708. Thus, server placement controller 1710 may select to place the custom server to be assembled in available slot 1704 that is closest to related/attached server 1716.

Figure 18A:
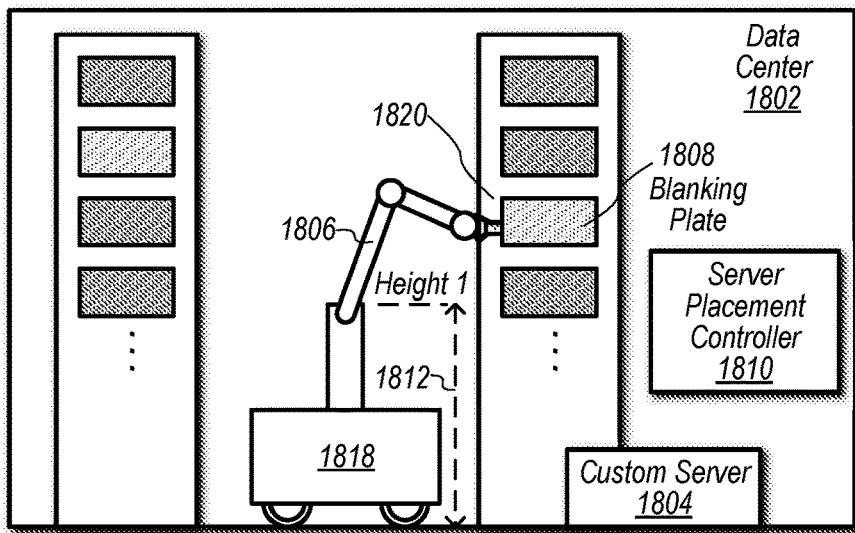
FIGS. 18A-18C illustrate a robot making height adjustments as part of installing a custom server in a server mounting structure, according to some embodiments.
Figure 18B:
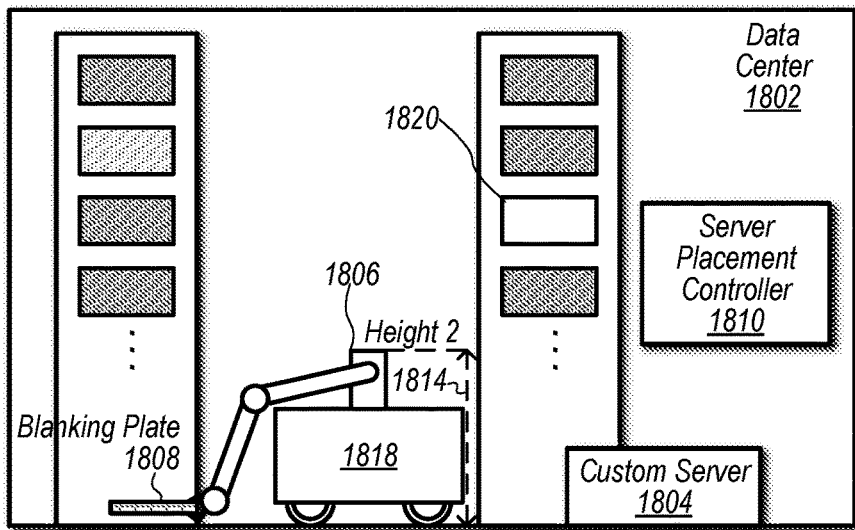
Figure 18C:
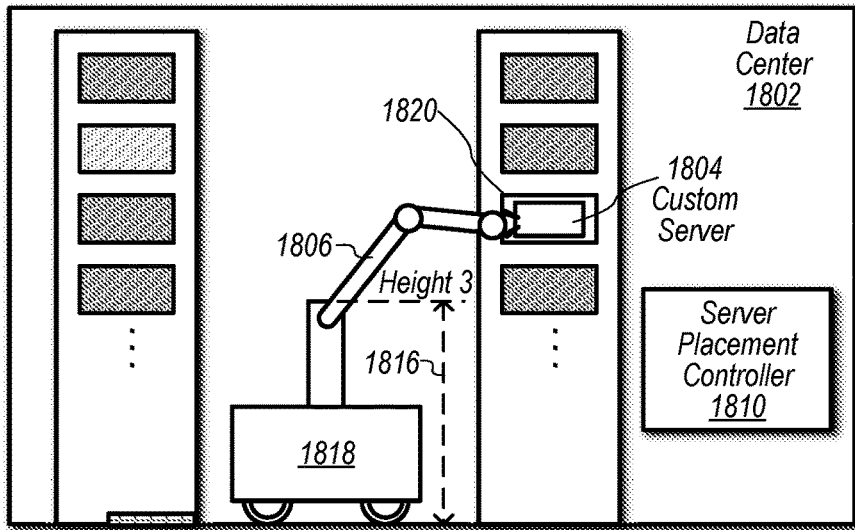

FIGS. 18A-18C illustrate a robot making height adjustments as part of installing a custom server in a server mounting structure, according to some embodiments. Data center 1802 includes server placement controller 1810 and robot 1818. Server placement controller 1810 may be the same as server placement controller 120 illustrated in FIG. 1, server placement controller 1352, illustrated in FIG. 13, server placement controller 1710 illustrated in FIG. 17, or any of the server placement controllers described herein.

In some embodiments, a server placement controller, such as server placement controller 1810, may further command or otherwise cause a mobile robot, AISR, or ASRS to cause a custom server to be placed in a selected unoccupied slot. For example, robot 1806 places custom server 1804 in a selected slot 1820 in data center 1802. In some embodiments, a robot, such as mobile robot 1818 may be able to adjust a height of the robot to install a custom server in a selected unoccupied slot. For example, in FIG. 18A, robot 1818 is adjusted to height 1 (1812) such that arm 1806 can remove blanking plate 1808. Then, in FIG. 18B, robot 1806 is adjusted to height 2 (1814) such that arm 1806 can place blanking plate 1808 on the ground and grip custom server 1804. Then in FIG. 18C, robot 1818 is adjusted to height 3 (1816) such that arm 806 can install custom server 1804 in selected slot 1820.

In some embodiments, a robot, such as robot 1818, may adjust to various heights. In some embodiments, a robot may be able to adjust to reach placement heights at elevations of 40' or greater. In some embodiments, any of the robots described herein may be able to adjust its height in a similar manner as described in regard to FIGS. 18A-18C.

Figure 19:
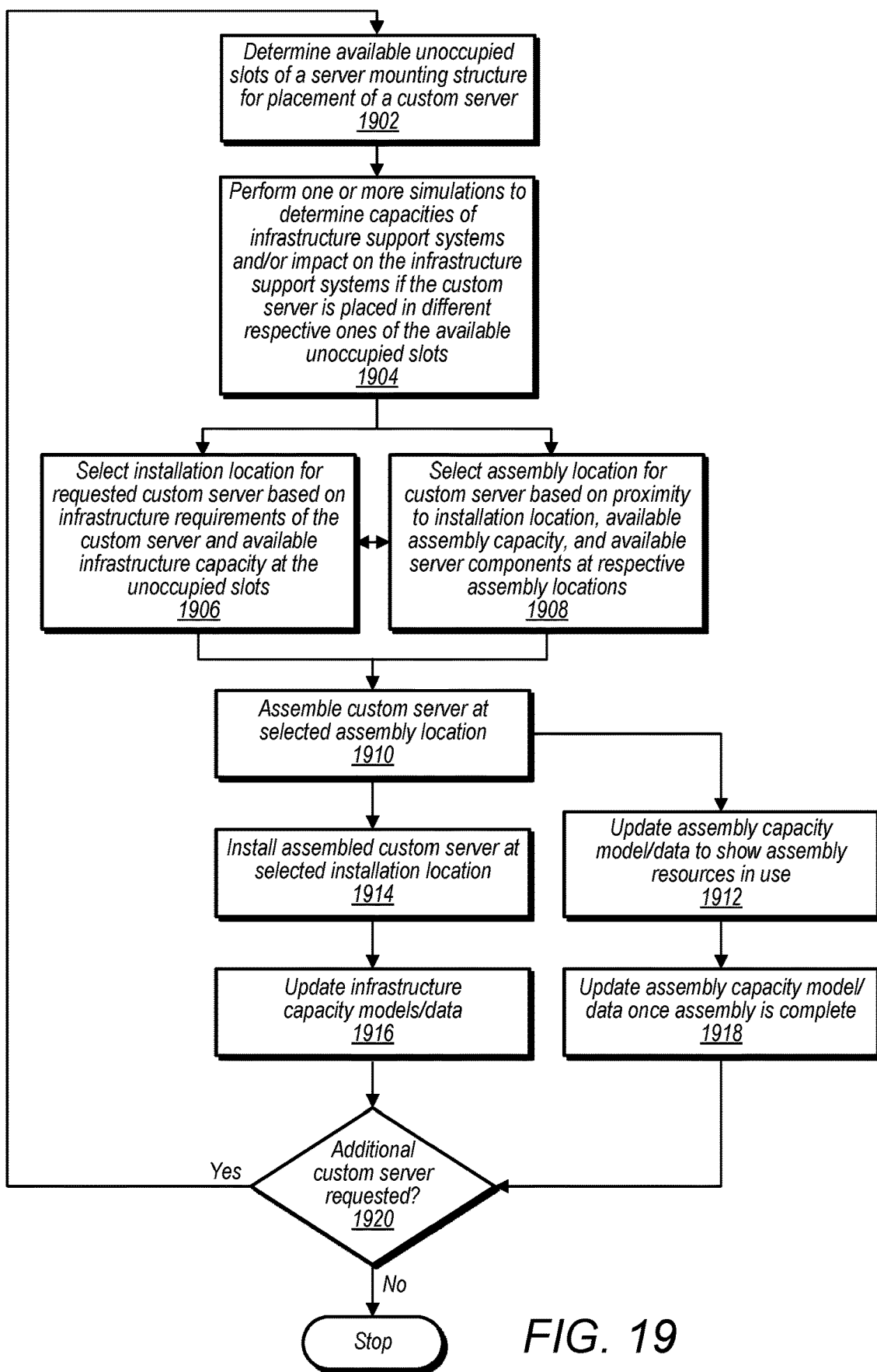
FIG. 19 is a high-level flowchart illustrating various methods and techniques for selecting a placement location for a custom server, according to some embodiments.

FIG. 19 is a high-level flowchart illustrating various methods and techniques for selecting a placement location for a custom server, according to some embodiments.

At 1902, a server placement controller determines which slots of one or more server mounting structures of a data center are available unoccupied slots that are available to accept installation of a custom server.

At 1904, the server placement controller performs one or more simulations to determine respective capacities of the infrastructure support systems at the available unoccupied slots. In some embodiments, the server placement controller may additionally perform one or more simulations to model placement of the custom server in each or multiple ones of the available unoccupied slots in regard to one or more infrastructure support systems. For example, the server placement controller may model how placement of the custom server in each of the available unoccupied slots would impact power capacity of power infrastructure support system. Additionally, impact on other infrastructure support systems, such as a networking infrastructure support system, cooling infrastructure support system, etc. may also be simulated.

At 1906 a server placement controller selects an installation location for a requested custom server based on infrastructure support requirements of the custom server and based on respective available infrastructure support capacities at unoccupied slots of a server mounting structure. In some embodiments, a hierarchical evaluation and decision process may be followed as described above based on the simulated results determined at 1904. Also, at 1908 a server assembly controller selects an assembly location for assembling the requested custom server. In some embodiments, the assembly location may be selected based on a distance to a selected placement location for the custom server, available assembly capacities at respective assembly locations, and availability of server components at respective assembly locations. In some embodiments, a server placement controller and a server assembly controller may coordinate with one another to select a server installation or placement location and a server assembly location. For example, a server placement location may be adjusted based on a selected assembly location and vice-versa.

At 1910 one or more robots assemble the requested custom server at the selected assembly location. At 1912, a model of assembly capacity is updated based on the selection of the assembly location. After the custom server is assembled, at 1918, the model of assembly capacity is further updated to show that the assembly capacity is available to assemble another custom server. Also, at 1914, the assembled custom server is placed in the selected installation location at the data center where the custom server was assembled. At 1916, infrastructure support system capacity models and data is updated to reflect the placement of the custom assembled server in the selected installation location. At 1920, it is determined if another custom server is requested. If so, the process repeats. If not the process stops until another custom server is requested.

As described above, a placement decision for a custom server may be made on an individual server basis and may be made prior to determining infrastructure demand for other custom servers that are yet to be requested, assembled, or installed.

Portable Server Assembly System

In some situations, robots of a server assembly system may be relatively expensive. Thus, in some embodiments, in order to spread the costs of robots across multiple data center facilities, the robots may be included in a portable server assembly system and re-used to populate server mounting structures with custom servers at multiple data center locations. In some embodiments, a portable server assembly system may be deployed to a data center and may be re-deployed to another data center location. For example, when a server mounting structure of a first data center is substantially filled, a portable server assembly system may be re-deployed to another data center location. In some embodiments, a portable server assembly system may include robots stowed in a portable shipping container, such as an international standard organization (ISO) compliant shipping container. In some embodiments, a shipping container of a portable server assembly system may be transported via rail, road, water, air, or by other means. In some embodiments, a portable server assembly system may comprise a single container that stows robots and parts for assembling custom servers or may include multiple containers that stow robots and that store parts for assembling custom servers. In some embodiments, a parts storage container may be coupled to a robot assembly container, and when a parts inventory of the parts storage container is depleted, another parts storage container may be coupled to the robot assembly container.

Figure 20:
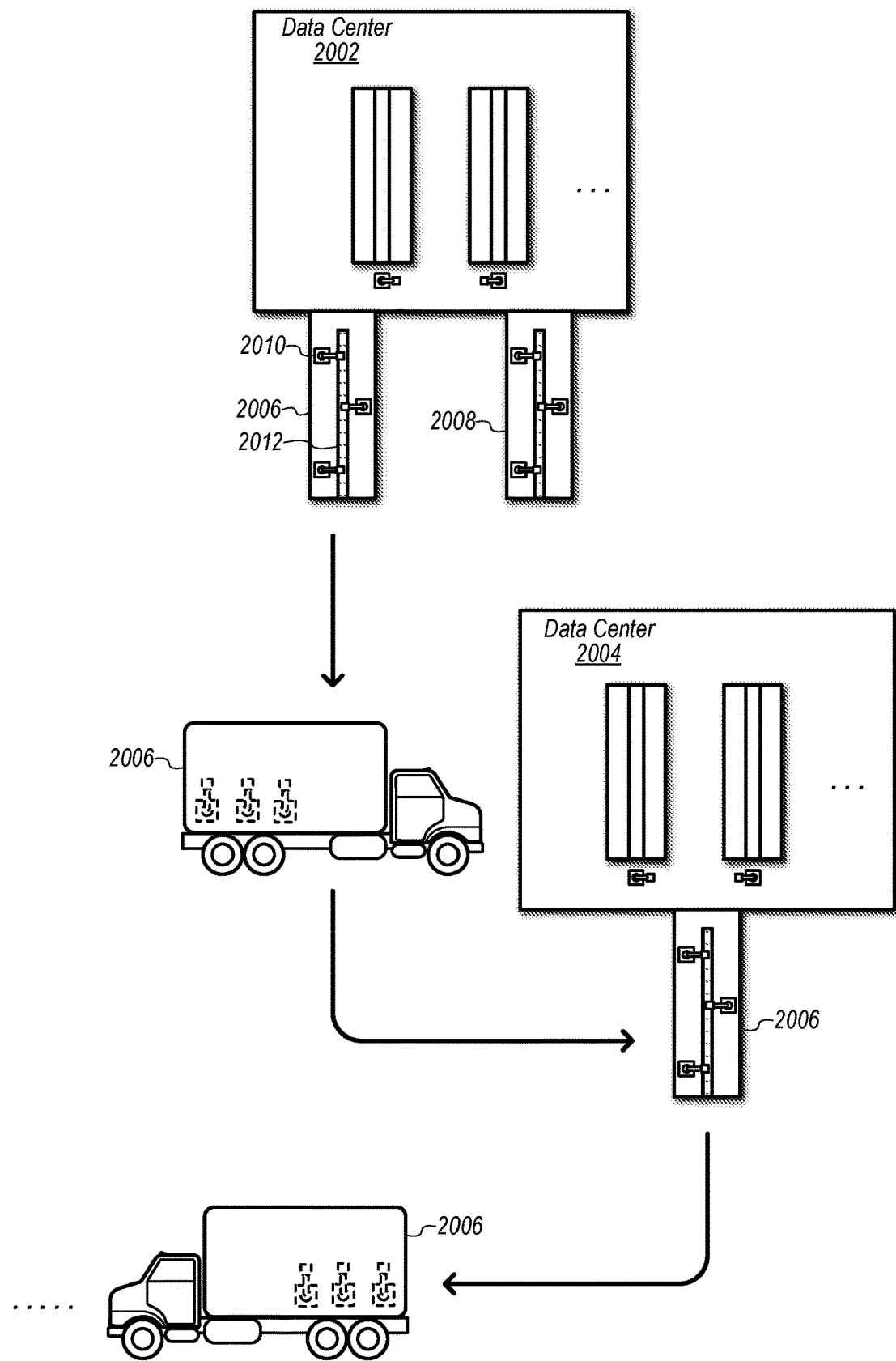
FIG. 20 is a flow diagram illustrating a portable server assembly system being deployed and redeployed to multiple data center locations, according to some embodiments.

FIG. 20 is a flow diagram illustrating a portable server assembly system being deployed and redeployed to multiple data center locations, according to some embodiments.

Initially, container 2006 and container 2008 are coupled to data center 2002. In some embodiments, containers 2006 and 2008 may be part of a portable server assembly system or may be two independent portable server assembly systems. Containers 2006 and 2008 include robots 2010 and conveyances 2012. In some embodiments, robots 2010 may operate in coordination as described in regard to FIG. 3 or may operate autonomously as described in regard to FIG. 2. In some embodiments, robots of a portable server assembly system may further install assembled custom servers in a data center, for example based on placement decisions made by a server placement controller as described above.

As shown in FIG. 20, robots of a portable server assembly system may be stowed in a container of a portable server assembly system and re-deployed to another data center location. For example, container 2006 and stowed robots 2010 that are stowed in container 2006, are re-deployed to data center 2004. In some embodiments, a portable server assembly system may be deployed to any number of data center locations or other locations. For example, container 2006 and stowed robots 2010 may be further re-deployed to other locations.

In some embodiments, re-deploying a portable server assembly system includes stowing robots of the portable server assembly system in a container of the portable server assembly system, transporting the container and stowed robots to another data center location, positioning the container at the other data center location, for example at a loading dock of the other data center location, and assembling custom servers via the robots at the other data center location.

In some embodiments, a portable server assembly system including a group of robots and one or more conveyances may generate a large volume of custom servers in a short period of time. For example, the portable server assembly system may be used to quickly populate slots of one or more server mounting structures of a data center and then may be re-deployed to another data center location to quickly populate slots of other server mounting structures at the other data center location.

Figure 21A:
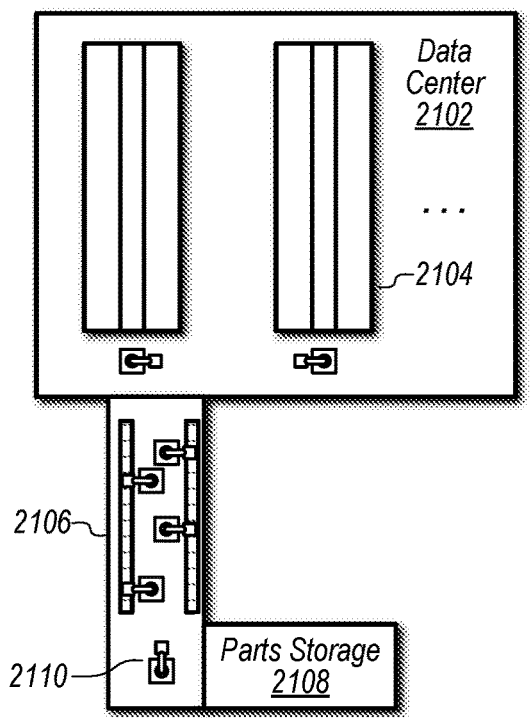
FIG. 21A is a top view of a data center and attached portable server assembly system that includes a portable container comprising robots and an attached portable container comprising parts storage, according to some embodiments.

FIG. 21A is a top view of a data center and attached portable server assembly system that includes a portable container comprising robots and an attached portable container comprising parts storage, according to some embodiments.

In some embodiments, a portable server assembly system may include a parts storage container that couples with an assembly container that is coupled to a data center. For example, assembly container 2106 is coupled to data center 2102 at a first end and is coupled to parts storage container 2108 at a second end. Robots 2110 may retrieve parts from parts storage container 2108 and place the parts on one or more conveyances where other robots 2110 assembly custom servers using the parts. Furthermore, a robot 2110 may further install an assembled custom server in a server mounting structure 2104 of data center 2102.

Figure 21B:
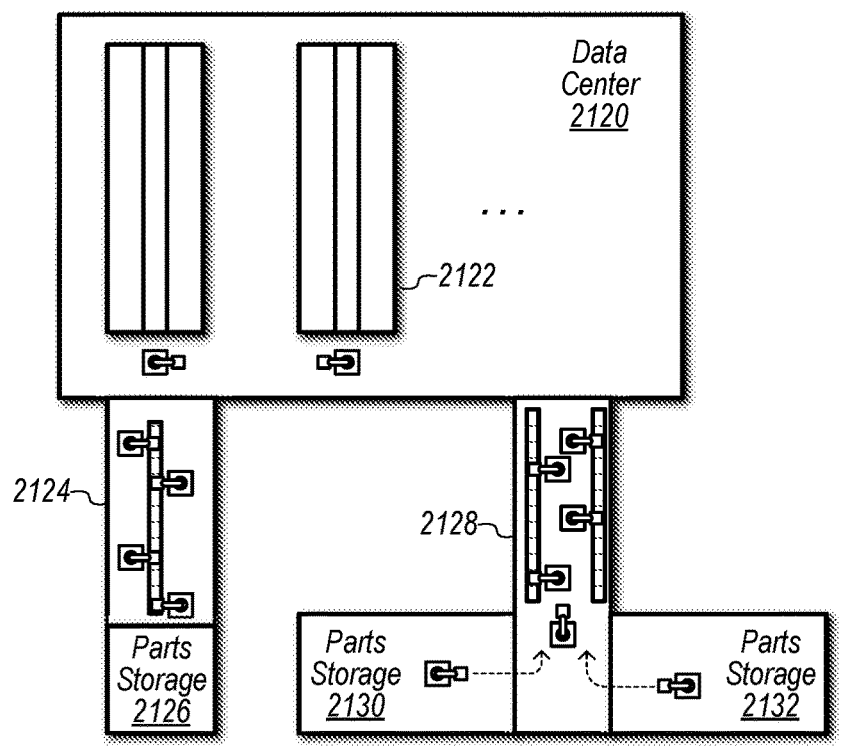
FIG. 21B is a top view of a data center and attached portable server assembly system that includes a portable container comprising robots and different parts storage arrangements, according to some embodiments.

FIG. 21B is a top view of a data center and attached portable server assembly system that includes a portable container comprising robots and different parts storage arrangements, according to some embodiments.

In some embodiments, a portable server assembly system may be configured in other ways. For example, assembly container 2124 coupled to data center 2120 also includes parts storage section 2126. Additionally, assembly container 2128 is coupled to data center 2120 at a first end and is coupled to parts storage containers 2130 and 2132 at a second end of the assembly container 2128. In a similar manner as described above, robots from either assembly container 2124 or 2128, or robots of data center 2120, may install assembled custom servers in server mounting structure 2122. In some embodiments, an automated installation and retrieval system (AIRS) or automated stocking and retrieval system (ASRS) as described herein may receive a custom assembled server from a robot and cause the custom assembled server to be installed in a server mounting structure of a data center, such as server mounting structure 2104 or 2120.

Figure 22:
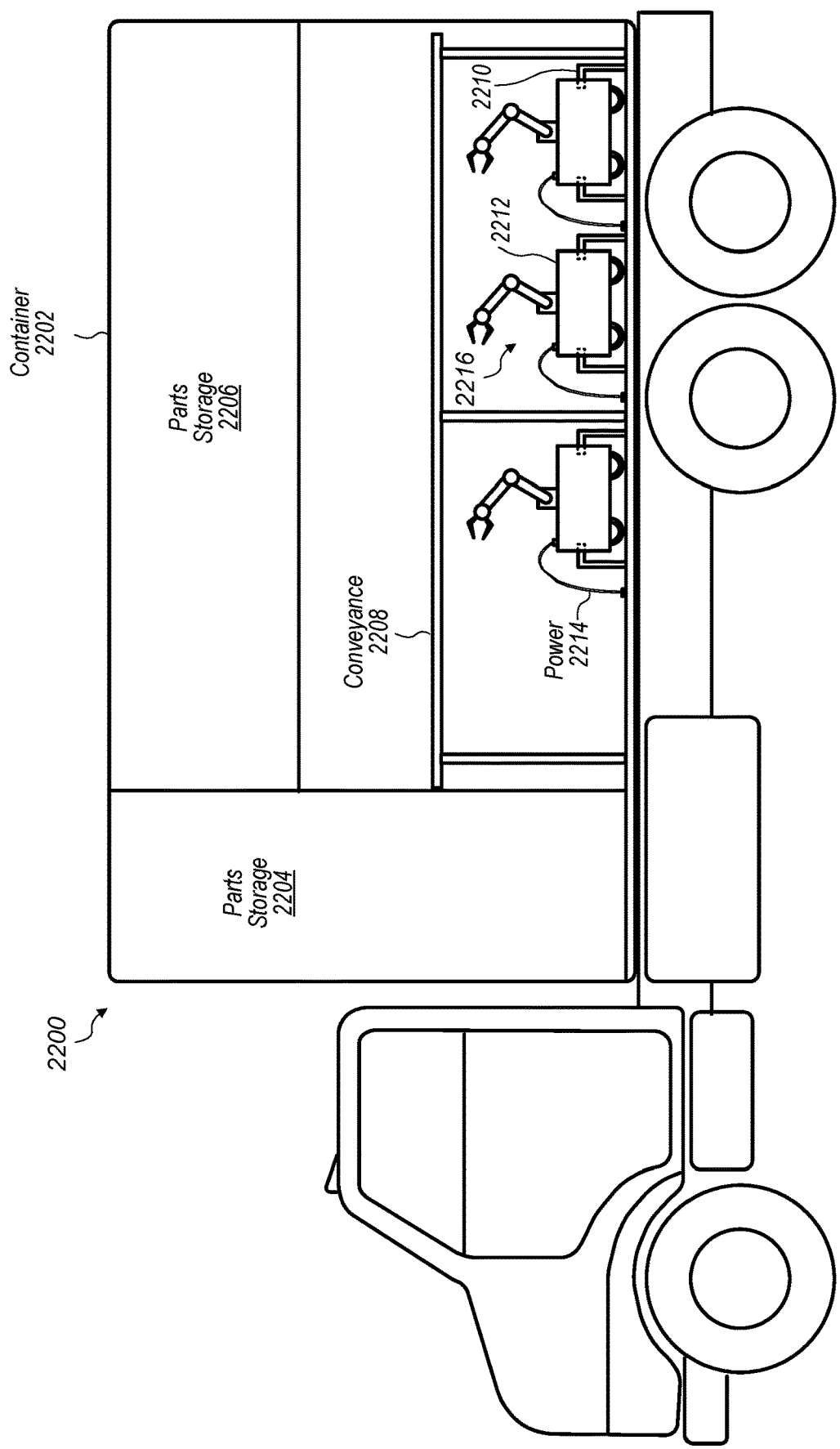
FIG. 22 is a side view of an interior of a container of a portable server assembly system, according to some embodiments.

FIG. 22 is a side view of an interior of a container of a portable server assembly system, according to some embodiments.

In some embodiments, a container of a portable server assembly system may be an ISO container configured to be moved via a truck, train, ship, airplane, or other suitable transportation device. In some embodiments, a container of a portable server assembly system may include docking stations for stowing robots during transport. For example, container 2202 of portable server system 2200 includes docking stations 2216 for stowing robots 2212. In some embodiments, a docking station, such as one of docking stations 2216, may include a clamp, bracket, strap or other means for securing a robot during transport. For example, docking stations 2216 include clamps 2210. Additionally, in some embodiments, a docking station, such as docking stations 2216 may include a power connection, such as power connections 2214, for charging robots during transportation between data centers.

In some embodiments, a container of a portable server assembly system may further include one or more parts storage compartments. For example, container 2202 includes parts storages 2206 and 2204. In some embodiments, a container of a portable server assembly system may further include one or more conveyances, such as conveyor belts. For example, container 2202 includes conveyance 2208. In some embodiments, parts storages, such as parts storage 2206, may be located on walls of a container above a conveyance, such as conveyance 2208. In some embodiments, robots, such as robots 2212, may be stowed in docking stations below a conveyance, such as conveyance 2208, during transport between data center locations. Furthermore, in some embodiments, a container of a portable server assembly system, such as container 2202, may be configured to couple with a loading dock of a data center. For example, a floor of container 2202 may be flush with a floor of a data center when container 2202 is positioned in a loading dock of a data center.

Figure 23:
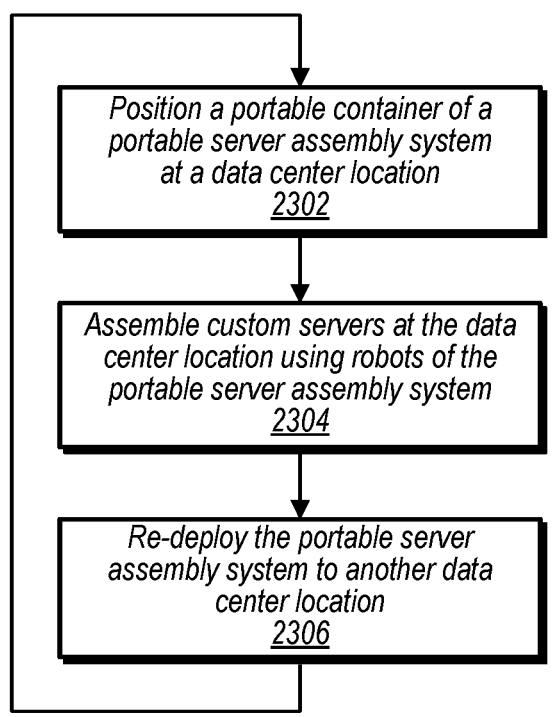
FIG. 23 is a high-level flowchart illustrating various methods and techniques for deployment and re-deployment of a portable server assembly system, according to some embodiments.

FIG. 23 is a high-level flowchart illustrating deployment and re-deployment of a portable server assembly system, according to some embodiments.

At 2302, a portable container of a portable server assembly system is positioned at a data center location. For example, the portable container may be positioned at a loading dock of a data center.

At 2304, one or more robots of the portable server assembly system assemble custom servers at the data center location. In some embodiments, the robots may further install the assembled custom servers at the data center location. In some embodiments, assembly and installation of custom assembled servers may be controlled by a server assembly controller and/or server placement controller as described herein.

At 2306, the portable server assembly system is re-deployed to another data center location. Re-deployment may include stowing the robots of the portable server assembly system in a container of the portable server assembly system, transporting the container comprising the stowed robots to the other data center location, positioning the container at the other data center location, for example at a loading dock, and assembling custom servers at the other data center location.

Server Configuration Selection System

In some embodiments, a server assembly controller may further be configured to perform server configuration selection, or a provider network may further include a server configuration selection system that coordinates with a server assembly controller to select a configuration for a custom server. As described above in regards to FIGS. 8-10, in some embodiments a client or service of a provider network may request a custom server having a particular configuration. However, in other embodiments, a client or a service of a provider network may delegate server configuration selection to a server configuration selection system or a server assembly controller configured to perform server configuration selection. In some embodiments, a server assembly controller or server configuration selection system may select a configuration for a custom server without access to applications executing on other servers that are similar to applications that will be executed on the custom server. For example, instead of accessing an application itself or underlying application data, a server configuration selection system or server assembly controller may determine trends in higher level server utilization data and deduce application classes of applications executing on a server based on detected trends in server utilization metadata. The server configuration selection system or server assembly controller may then use these determined application classes to select a configuration for a custom server that will be used in a similar manner as the servers having the observed utilization trends.

For example, a server assembly controller or server configuration selection system may identify trends in time-series power utilization data for an already installed server, without accessing an application being executed on the already installed server. In some instances, power utilization may correspond with processor utilization, thus processing trends may be deduced based on power utilization data without access to the application being executed. As another example, a server assembly controller or server configuration selection system may also identify trends in time-series memory utilization data. In a similar manner, a server assembly controller or server configuration selection system may deduce characteristics of an application being executed on a server based on trends in memory utilization without access to the underlying application or application data. In some embodiments, a server assembly controller or server configuration selection system may further identify trends in time-series server utilization metadata for a group of servers to determine types of applications being executed on the group of servers. For example, correlated changes in power usage or memory utilization between servers of a group of servers may indicate that the servers of the group are executing a distributed application. In some embodiments, a server assembly controller or server configuration selection system may further identify trends in time-series server utilization metadata for other server components, such as central processing units (CPUs), graphics processing units (GPUs), solid-state drives (SSDs), hard drives, etc. These trends, determined for already installed servers, may then be used by a server assembly controller or server configuration selection system to determine configurations for yet-to-be installed custom servers that are to execute workloads similar to the workloads being executed on the already installed servers.

Note the contrast between using higher level server utilization metadata to determine an application class for an application being executed on a server and utilizing profiling techniques that require access to the application and/or application data.

Some computing facilities may service internal computing needs and thus may have lessened privacy concerns. However, other computing facilities may perform workloads for clients that may desire a high level of privacy and/or security. For example, many clients may not be inclined to grant a service provider access to applications that the clients are executing in order to determine recommendations for custom servers. However, conversely such clients may not be opposed to a service provider tracking trends in server utilization such as power consumption and memory utilization. Also, in some embodiments, server utilization metrics may already be tracked for other reasons, such as power management or server performance monitoring. For example, a management controller may include counters and/or registers that measure resource component utilization pressure for server components managed by the management controller. Thus, utilizing server utilization metadata to select server configurations for recommended custom servers may not involve collecting any more additional data about client usage than is already collected for other reasons.

In some embodiments, resource utilization pressure may be determined based on current utilization of a server component or set of server components relative to a benchmark utilization for the server component or set of server components. For example, resource utilization pressure may be determined for an individual server component or for a group of server components, such as processors for a fleet of servers or memory cards for a fleet of servers.

As an example embodiment, a client may select for custom servers to be installed to optimize a client's computing resources, but the client may not be inclined to determine configurations for the custom servers and may delegate this determination to a service provider, for example via a server assembly controller or a server configuration selection system. The client may be an external client or another service of a server provider network. The request may indicate that current workloads of the client are to be moved to custom servers that are optimized for these workloads. Additionally, or alternatively, a client may indicate that as workload demand increases, newly added servers are to be custom servers optimized for the workload. In some embodiments, a client may be a client external to a service provider network or may be another internal service of a service provider network. In such an example embodiment, a server assembly controller may analyze server utilization metadata for already installed servers that are executing workloads similar to workloads that are to be executed on the yet-to-be assembled custom server(s). The server assembly controller or server configuration selection system may identify trends in the server utilization metadata and compare the identified trends to known trends that are associated with particular application classes to determine an application class or application classes for applications executing the workloads that are similar to workloads to be executed on the yet-to-be assembled custom server. Based on these identified application class(es), a server assembly controller may select a server configuration that is optimized or near optimal for the determined application class(es). Furthermore, the server assembly controller may command one or more robots to assemble the custom server(s) according to the selected server configuration. Additionally, the assembled custom server(s) may be automatically installed in a server mounting structure of a data center by one or more robots and made available to execute the workloads. In some embodiments, the selected server configuration may specify, types and quantities of server components to be included in a custom assembled server. For example, the selected server configuration may specify a type of processor to be included in the custom assembled server and a quantity of processors to be included in the custom assembled server. The selected server configuration may also specify types and quantities of other server components, such as memory cards, networking cards, SSDs, hard drives, GPUs, and/or other server components. In some embodiments, a selected server configuration may also specify an arrangement of components that are to be included in a custom assembled server, such as how processors, memory cards, storage devices, etc. are to be arranged in a server chassis.

In some embodiments, machine learning techniques may be used to identify trends in server utilization metadata and to associate the identified trends with application classes. In some embodiments, a server assembly controller may work in coordination with a machine learning service of a service provider network in order to identify trends in server utilization metadata. For example, a server assembly controller may provide server utilization metadata to a machine learning service, and the machine learning service may provide identified trends and/or associations with application classes back to the server assembly controller. In some embodiments, server utilization metadata for workloads with known application classes may be provided to a machine learning service, wherein the machine learning service uses the workloads with known application classes to learn associations between trends in server utilization metadata and application classes. For example, a machine learning technique may be used to identify trends in server utilization metadata for a workload of a known application class. The machine learning technique may associate the identified trends with the known application class. Wherein, the determined (now known) association between the trends in server utilization metadata and the particular application class can be used to determine application classes of other workloads that indicate similar trends in server utilization metadata, but for which the application class for the other workloads is not known.

In some embodiments, a server assembly controller or server configuration selection system may utilize internal workloads of services of a provider network to learn associations between trends in server utilization metadata and application classes, wherein application classes are known for the internal workloads. The a server assembly controller or server configuration selection system may then utilize the known associations that were learned from analyzing internal workloads to determine application classes of external customer workloads, without knowledge of the application classes of the external customer workloads and without access to the applications or application data of the external client workloads. In some embodiments, an external client workload may be a workload executed by a service of a provider network on behalf of a client, wherein the execution takes places on resources of the provider network. In contrast, in some embodiments, an internal workload may be a workload executed on behalf of the service provider, for example to manage a service of the service provider network.

In some embodiments, a server assembly controller may further identify trends in a robot calibration process, a custom server assembly processes, and/or a custom server validation process and correlate these trends with instances of custom server failures, assembly delays, or quality incidents. In some embodiments, a server assembly controller may determine adjustments to a robot calibration process, a server assembly process, or a custom server validation process to reduce instances of custom server failures, assembly delays, or quality incidents. In some embodiments, a server assembly controller may utilize machine learning techniques to perform such optimizations.

Figure 24:
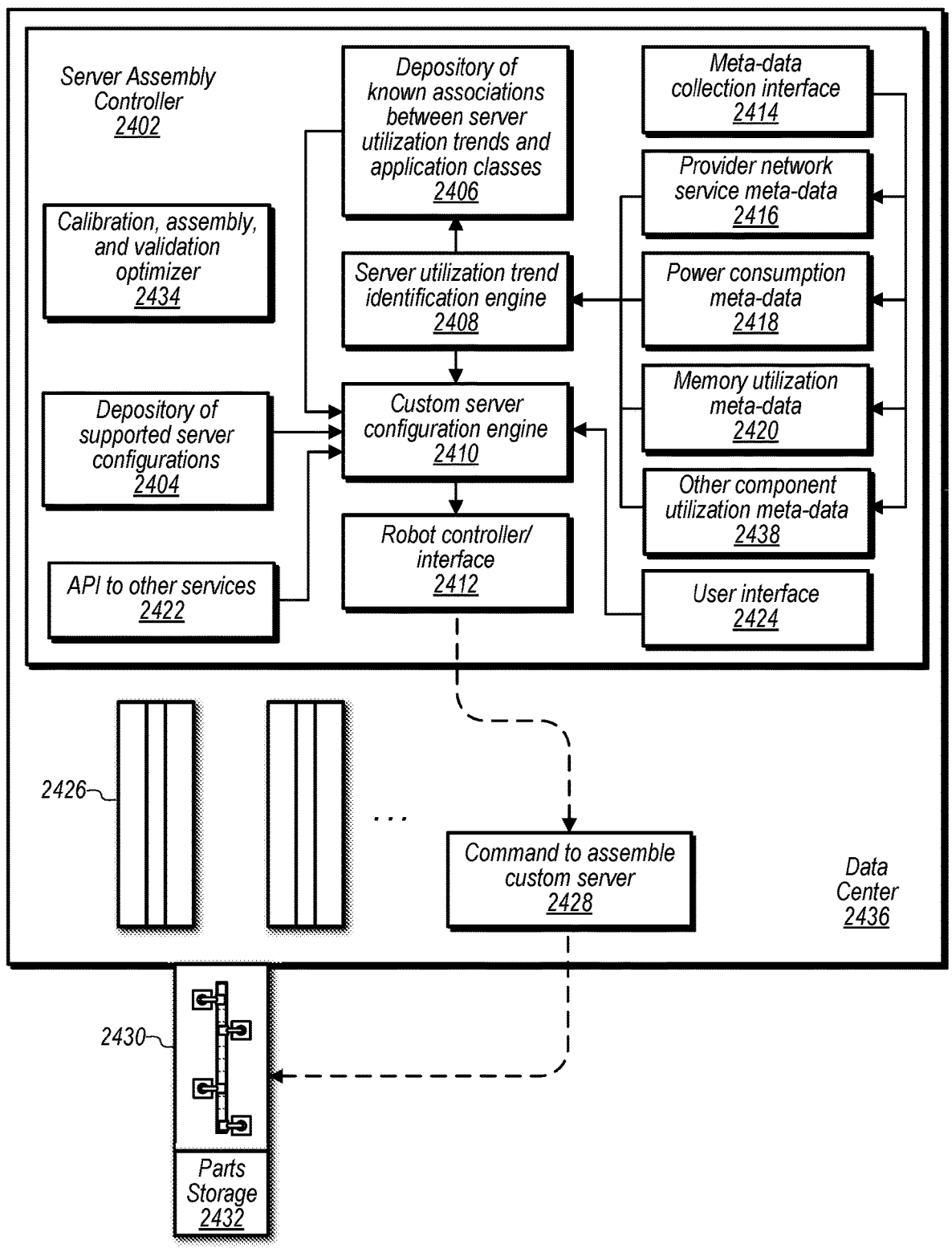
FIG. 24 illustrates a block diagram of a server assembly controller of a provider network, a top view of a data center that included in the provider network, and a server assembly system for custom assembling servers for the data center, according to some embodiments.

FIG. 24 illustrates a block diagram of a server assembly controller of a provider network, a top view of a data center included in the provider network, and a server assembly systems for custom assembling servers for the data center, according to some embodiments.

Server assembly controller 2402 includes a metadata collection interface 2404 that may collect time-series metadata about already installed servers executing workloads similar to one or more workloads that are to be executed on a yet-to-be assembled custom server. The collected server utilization metadata may be stored and analyzed by a server utilization trend identification engine, such as server utilization trend identification engine 2418. In some embodiments, a server utilization trend identification engine may be implemented by one or more computing devices that implement a server assembly controller, such as server assembly controller 2402, or may be implemented in a separate machine learning service. Also, the collected server utilization metadata may be stored, for example as provider network server metadata 2406, power consumption metadata 2408, memory utilization metadata 2410, and/or other server component utilization metadata 2438. In some embodiments, provider network service metadata 2406 may indicate a particular service of a plurality of services offered by a service provider network that the workloads associated with the server utilization metadata are related to. For example, the provider network service metadata may indicate that the server utilization metadata corresponds to a workload executed by a computing execution service of a provider network, or a database service of a provider network, as a few examples.

In some embodiments, a server assembly controller may further include or have access to a depository that stores known associations between trends in server utilization metadata and application classes. For example, server assembly controller 2402 includes a depository of known associations between server utilization trends and application classes 2416. In some embodiments, a server assembly controller further includes a depository of supported server configurations, such as depository of supported server configurations 2422. In some embodiments, a depository of supported server configurations may store a list of possible server configurations that may be assembled by robots of a server assembly system using parts that are stocked and available to the robots to use to assembled a custom server.

In some embodiments, a server assembly controller further includes a custom server configuration engine and a robot controller/interface. For example, server assembly controller 2402 includes robot controller/interface 2412.

In some embodiments, a server assembly controller may be implemented on one or more computing devices of a data center, such as data center 2436. In some embodiments, a server assembly system, such as server assembly system 2426 may be coupled to data center 2436 and may include robots that receive a command from a server assembly controller and assemble a custom server for installation at a slot of a server mounting structure, such as server mounting structure 2426, of the data center to which the server assembly system is coupled. In some embodiments, robots of the server assembly system may assemble the custom server using parts from a local parts storage, such as parts storage 2432. In some embodiments, a server assembly system, such as server assembly system 1430 may be a portable server assembly system as described herein, or may be a permanent or semi-permanent server assembly system.

In some embodiments, a server assembly controller, such as server assembly controller 2402 may further include a user interface 2414, which may be similar to the user interfaces described in FIGS. 8-10. In some embodiments, a client may specify one or more requested server configuration via a user interface, such as user interface 2424, and a custom server configuration engine may cause a custom server having the requested configuration to be assembled. Also, a client or respective managers of one or more services of a service provider network may request one or more particular server configurations via an API, such as API to other services 2422, and a custom server configuration engine, such as custom server configuration engine 2410, may cause a custom server having the requested configuration to be assembled.

For example, custom server configuration engine 2420 may issue a command 2428 to robots of server assembly system 2430 to assemble one or more custom servers having a determined server configuration. In some embodiments, a command 2428 may be issued for robots to assemble a custom server autonomously or in coordination with one another.

Figure 25:
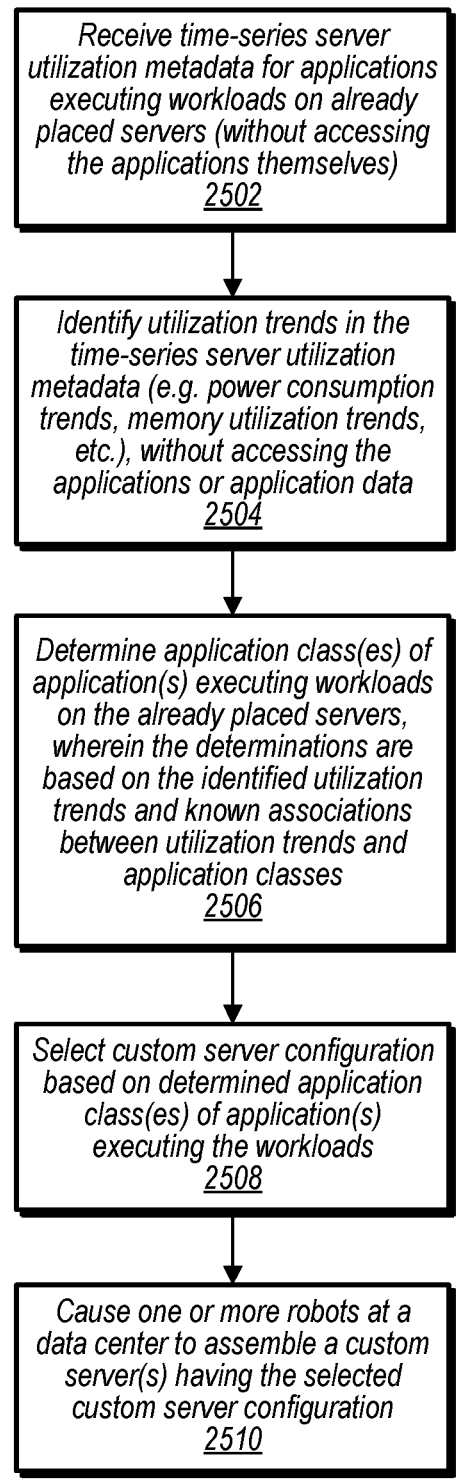
FIG. 25 is a high-level flowchart illustrating various methods and techniques for selecting custom server configurations based on trends in server utilization metadata, according to some embodiments.

FIG. 25 is a high-level flowchart illustrating various methods and techniques for selecting custom server configurations based on trends in server utilization metadata, according to some embodiments.

At 2502 a server assembly controller (or server configuration selection service) receives time-series server utilization metadata for applications executing workloads on already placed servers, wherein the workloads are similar to workloads that are to be executed on a yet-to-be assembled custom server. The server assembly controller receives the time-series server utilization metadata without access to the application executing the workload and without access to application data.

At 2504, the server assembly controller (or server configuration selection service) identifies server utilization trends in the server utilization metadata. In some embodiments, machine learning may be employed to identify trends in the server utilization metadata. For example, a server assembly controller may identify trends in power consumption by a server, trends in memory utilization, trends that correlate across multiple servers, trends in utilization of other server components, or other types of trends in server utilization metadata. The identification of the trends may be performed using the server utilization metadata without access to applications or application data for applications that are being executed on an already installed server.

At 2506, the server assembly controller (or server configuration selection service) determines application class(es) for the workloads, wherein the application class(es) correspond with the identified trends. The application class(es) may be determined based on comparing the identified trends to one or more known trends that are associated with one or more particular application class(es). In some embodiments, machine learning may be used to determine new relationships between server utilization trends and application classes, and new associations associating utilization trends to application classes may be added to a store of known associations.

At 2508, a custom server configuration is selected based on the determined application class. For example, an additional depository of a server assembly controller more store an index of recommended server configurations for different application classes. This index or other type of data structure may be used to select a server configuration for a workload associated with a particular application class.

At 2510, the server assembly controller (or server configuration selection service) causes one or more robots at a data center location to assemble a custom server having the selected custom server configuration. In some embodiments, a server placement controller may select a placement location for the custom assembled server and cause one or more robots, an AIRS, or and ASRS to cause the custom server to be installed in the selected placement location in a server mounting structure of the data center.

Figure 26:
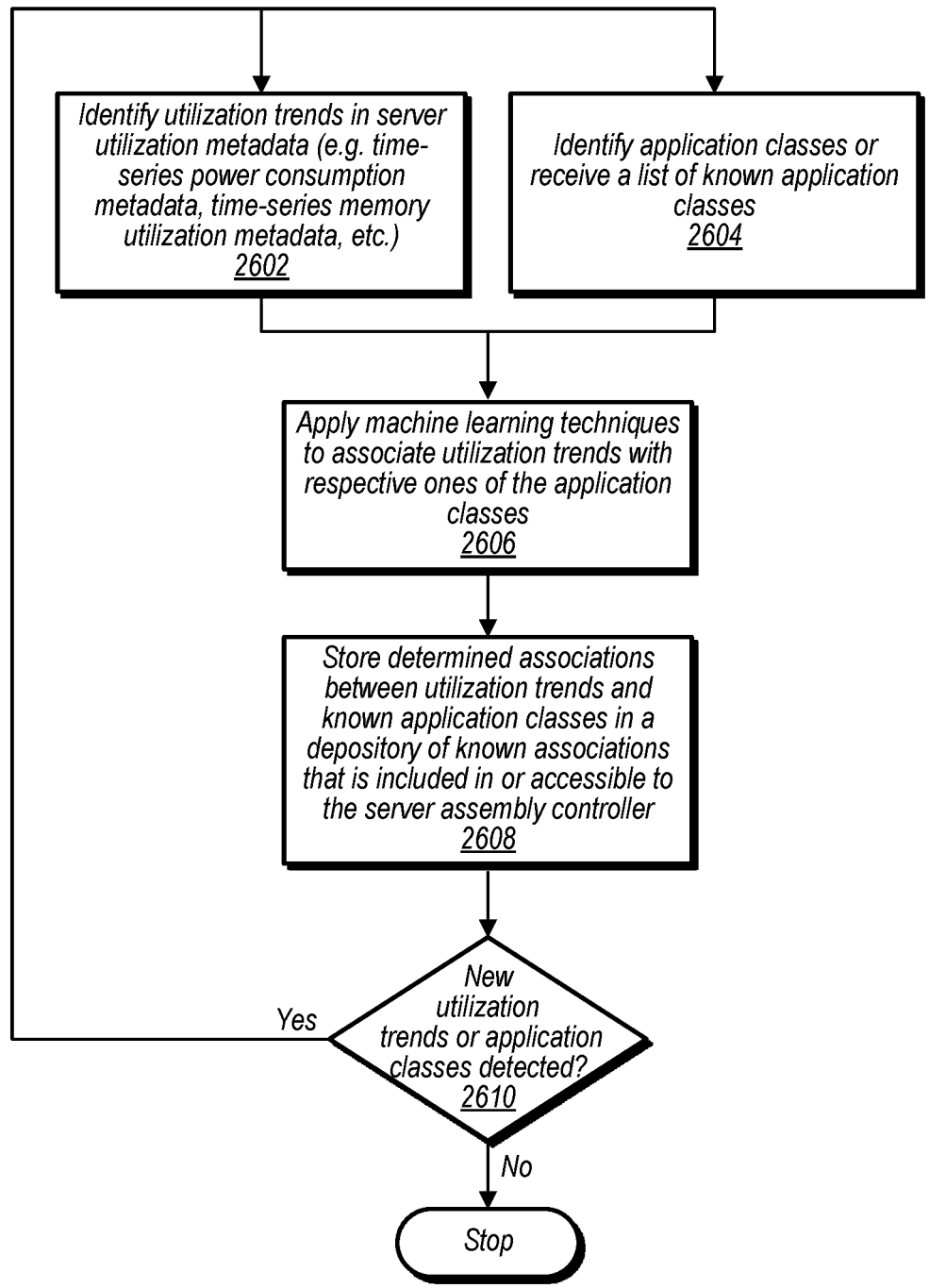
FIG. 26 is a high-level flowchart illustrating various methods and techniques for determining associations between server utilization trends and application classes, according to some embodiments.

FIG. 26 is a high-level flowchart illustrating various methods and techniques for determining associations between server utilization trends and application classes, according to some embodiments.

In some embodiments, in order to determine associations between server utilization trends and application classes, a server assembly controller (or server configuration selection service) may follow a process similar to the process outlined in FIG. 26.

For example, at 2602, a server assembly controller (or server configuration selection service) receives utilization trends in server utilization metadata, such as trends in time-series power consumption metadata, trends in time-series memory utilization metadata, etc. In some embodiments, the utilization trends may have been determined by a server utilization trend identification engine which may be implemented via a machine learning service or may be a component of a server assembly controller (or server configuration selection service).

At 2604, the server assembly controller (or server configuration selection service) also identifies application classes or receives information indicating known application classes. For example, in some embodiments, in order to determine associations between utilization trends and application classes, a server assembly controller (or server configuration selection service) may be provided server utilization metadata associated with workloads for known application classes. The server assembly controller (or server configuration selection service) may then correlate trends in the server utilization metadata to particular ones of the application classes and add these known associations to a depository of known associations that can later be used to determine application classes for other workloads having similar server utilization trends, wherein the application classes associated with the other workloads are not initially known. For example, at 2606, the server assembly controller (or server configuration selection service) applies machine learning techniques to determine the associations between application classes and server utilization trends. In some embodiments, one or more server utilization trends may be associated with one or more application classes. For example, a given server utilization trend may be associated with a broad application class, such as a processor intense application class and may also be associated with a more specific application class, such as a burst application class describing applications that require periodic bursts in processor utilization. In some embodiments, a general application class may be considered a "bucket" comprising multiple more specific application classes. In some embodiments, a workload may be determined, based on identified server utilization trends, to be a workload for an application corresponding to multiple application classes, such as a general application class "bucket" and one or more specific application classes with the more general application class "bucket." In some embodiments, a machine learning service may initially determine associations between trends in server utilization metadata for more general application class "buckets" and may then determine additional associations between the trends in server utilization metadata and more specific application class "sub-buckets."

At 2608, the server assembly controller (or server configuration selection service) stores the determined associations between application classes and server utilization trends in a depository of known associations that is included in (or accessible to) the server assembly controller (or server configuration selection service). These known associations may be used by a server assembly controller (or server configuration selection service) to determine application classes for workloads having similar server utilization trends (without access to the applications associated with the workloads).

At 2610, it is determined whether new server utilization trends or application classes are detected for workloads of interest. If so, the process repeats, if not, the process stops. For example, the process may repeat to determine additional associations between trends in server utilization metadata and more specific application class "sub-buckets."

In some embodiments, a process similar to the process described in FIG. 26 may be used to determine associations between server utilization trends for workloads being executed on a group of servers and application classes, wherein the determined (and now known) associates are later used by a server assembly controller to select server cluster configurations.

Figure 27:
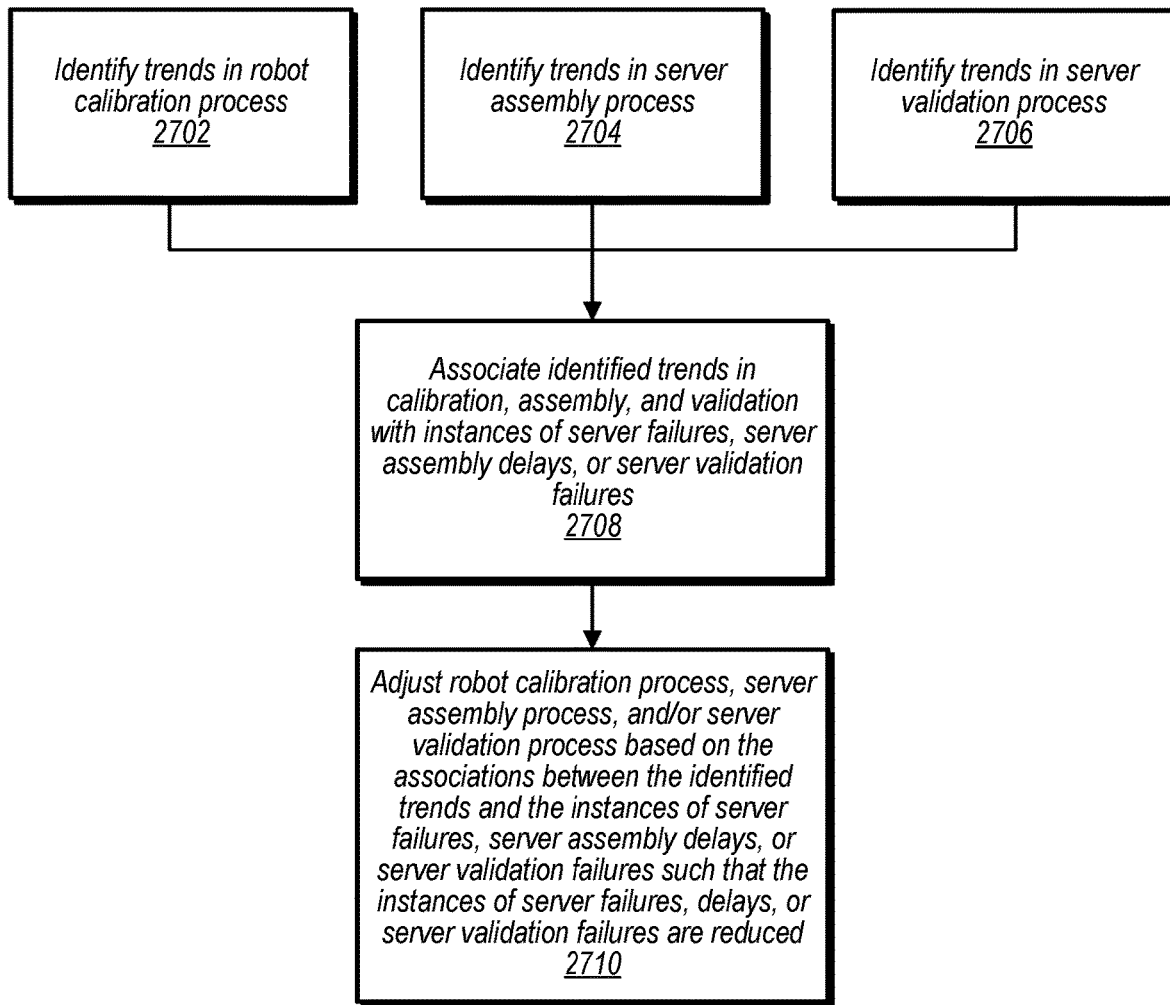
FIG. 27 is a high-level flowchart illustrating various methods and techniques for determining associations between trends in robot calibration, server assembly processes, server validation processes and resulting failures, according to some embodiments.

FIG. 27 is a high-level flowchart illustrating various methods and techniques for determining associations between trends in robot calibration, server assembly processes, server validation processes and resulting failures, according to some embodiments.

In some embodiments, a server assembly controller (or server configuration selection service) may further perform one or more operations to improve assembly of custom servers. For example, a calibration, assembly, and validation optimizer, such as calibration, assembly and validation optimizer 2434, may perform a process similar to the process shown in FIG. 27.

At 2702, a server assembly controller (or server configuration selection service) identifies trends in a robot calibration process. At 2704, the server assembly controller (or server configuration selection service) identifies trends in a server assembly process. And, at 2706, the server assembly controller (or server configuration selection service) identifies trends in a server validation process.

At 2708, the server assembly controller (or server configuration selection service) associates identified trends in calibration, assembly, and/or validation with instances of server failures, server assembly delays, or server validation failures.

At 2710, the server assembly controller (or server configuration selection service) adjusts a robot calibration process, a server assembly process, and/or a server validation process based on the determined associations between identified trends in calibration, assembly, and/or validation and the instances of server failures, server assembly delays, or server validation failures. The adjustments may be made to reduce instances of server failures, server assembly delays, or server validation failures.

Figure 28:
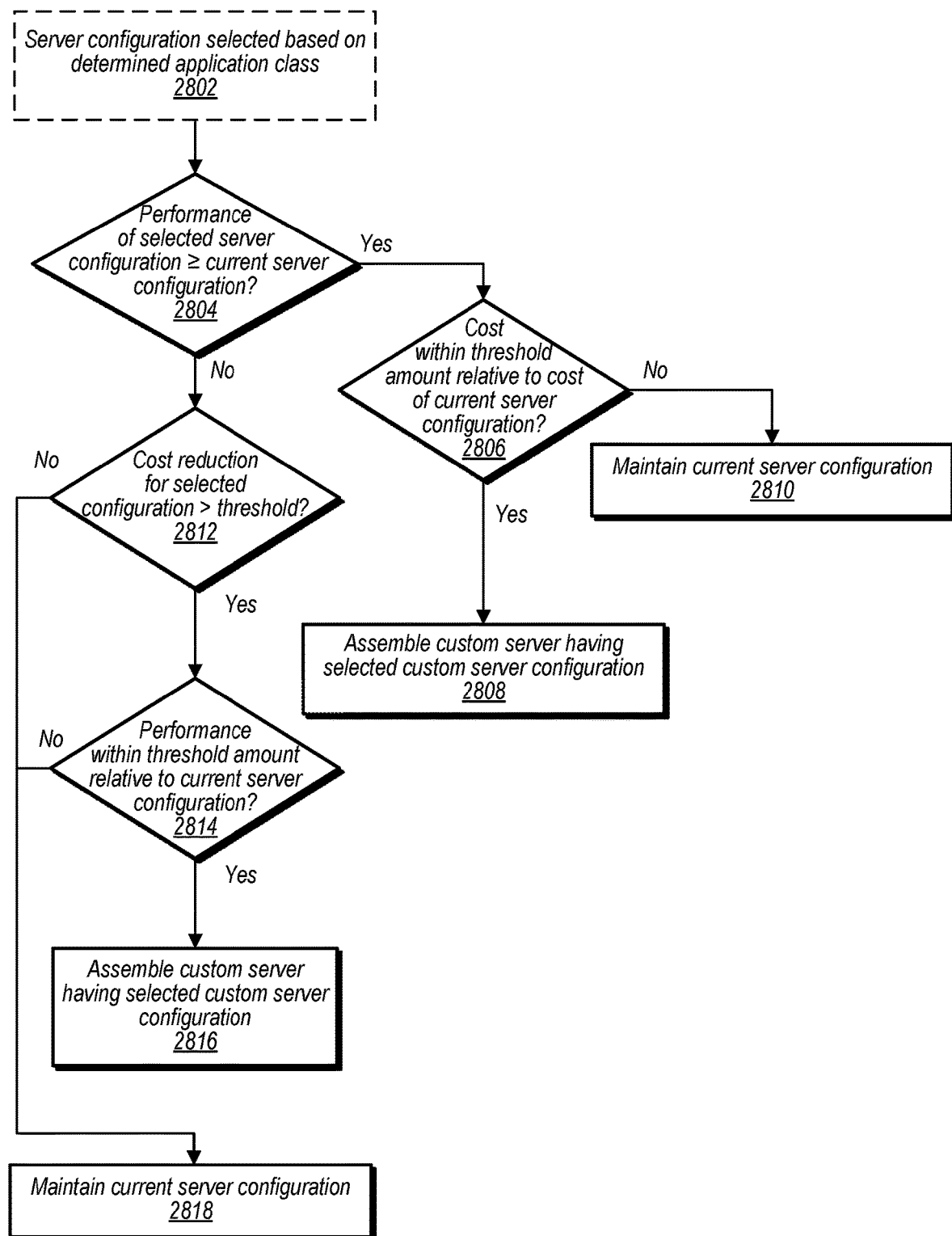
FIG. 28 is a high-level flowchart illustrating various methods and techniques for determining whether to relocate a workload from an existing server to a custom server, according to some embodiments.

FIG. 28 is a high-level flowchart illustrating various methods and techniques for determining whether to relocate a workload from an existing server to a custom server, according to some embodiments.

In some embodiments, a server assembly controller (or server configuration selection service) may balance costs and performance when determining whether or not to recommend a custom server for a particular workload or set of workloads. For example, a server assembly controller (or server configuration selection service) may determine whether an improvement in efficiency will negatively impact performance or an extent to which a performance improvement will negatively impact cost as compared to a current server configuration for a server currently executing the workload.

In some embodiments, performance may comprise computing performance, memory performance, storage performance, such as amount of data stored, transactions per second, etc., environmental performance (e.g. a "green score"), reliability of the custom server, etc. In some embodiments, an environmental performance or "green score" may rate a relative impact the server configuration has on the environment.

In some embodiments, cots may comprise costs of the server (both parts and assembly costs), costs of operating the server (e.g. power, cooling, etc.), etc.

In some embodiments, performance as described herein, may be for a single performance metric, such as computing performance, memory performance, etc., or may be a composite performance. For example, a composite performance may comprise a weighted average of performance metrics. For example, in a weighted average a reliability performance metric may be given more weight than a storage transactions per second performance. In a similar manner, a cost as described herein, may be a single cost performance metric, such as cost of parts, assembly and installation, or a composite costs such as a composite comprising both upfront fixed costs and projected operating costs. In some embodiments, costs metrics of a composite cost may be weighted. For example, in some embodiments upfront fixed costs may be weighted more heavily than projected operating costs, or vice versa. In some embodiments, cost as described herein may be a total lifetime cost of a particular server configuration including upfront costs and on-going costs associated with ownership and operation of a server having the custom server configuration.

For example, at 2802 a server assembly controller (or server configuration selection service) starts the analysis with a selected server configuration for a yet-to-be assembled custom server that was selected based on a determined application class for the workload. For example, the selected configuration may be determined as described in FIG. 25.

At 2804, the server assembly controller (or server configuration selection service) determines whether the performance of the selected server configuration for the yet-to-be assembled custom server is greater than or equal to the performance of a current server configuration that is already placed and executing the workload. If the performance of the selected server configuration for the yet-to-be assembled custom server is greater than the performance of the current server, at 1806, it is determined whether the cost of the selected server configuration for the yet-to-be assembled custom server is within a threshold amount relative to the cost of the current server configuration that is already placed and executing the workload. If the cost exceeds the threshold, the workload is maintained, at 2810, on the current server configuration and the server assembly controller does not recommend or implement assembling a new custom server with the selected configuration based on application class. If the cost is below the threshold, the server assembly controller recommends, at 2808, assembling a custom server (or causes assembly of the custom server) having the selected configuration, selected based on the application class of the workload.

If, at 2804, the performance of the selected configuration for the yet-to-be assembled custom server was less than the performance of the current server configuration, the server assembly controller (or server configuration selection service) determines at 2812 whether a cost reduction for the yet-to-be assembled custom server having the selected configuration is greater than a threshold amount. If the cost reduction is not greater than the threshold amount, the workload is maintained, at 2818, on the current server configuration and the server assembly controller does not recommend or implement assembling a new custom server with the selected configuration based on application class.

If the cost reduction is greater than the threshold amount, at 2814, it is determined, at 2806, whether the performance of the yet-to-be assembled custom server will be within a threshold amount of the performance of the currently placed server executing the workload. If the performance is less than the threshold, the workload is maintained on the current server configuration and the server assembly controller does not recommend or implement assembling a new custom server with the selected configuration based on application class. If the cost reduction is greater than the threshold cost reduction and the performance is not less than the threshold difference as compared to the current server configuration, the server assembly controller recommends, at 2816, assembling a custom server (or causes assembly of the custom server) having the selected configuration, selected based on application class of the workload. If the performance difference is more than the threshold amount below the current server configuration, the workload is maintained, at 2818, on the current server configuration and the server assembly controller does not recommend or implement assembling a new custom server with the selected configuration based on application class.

Example Computing System

Figure 29:
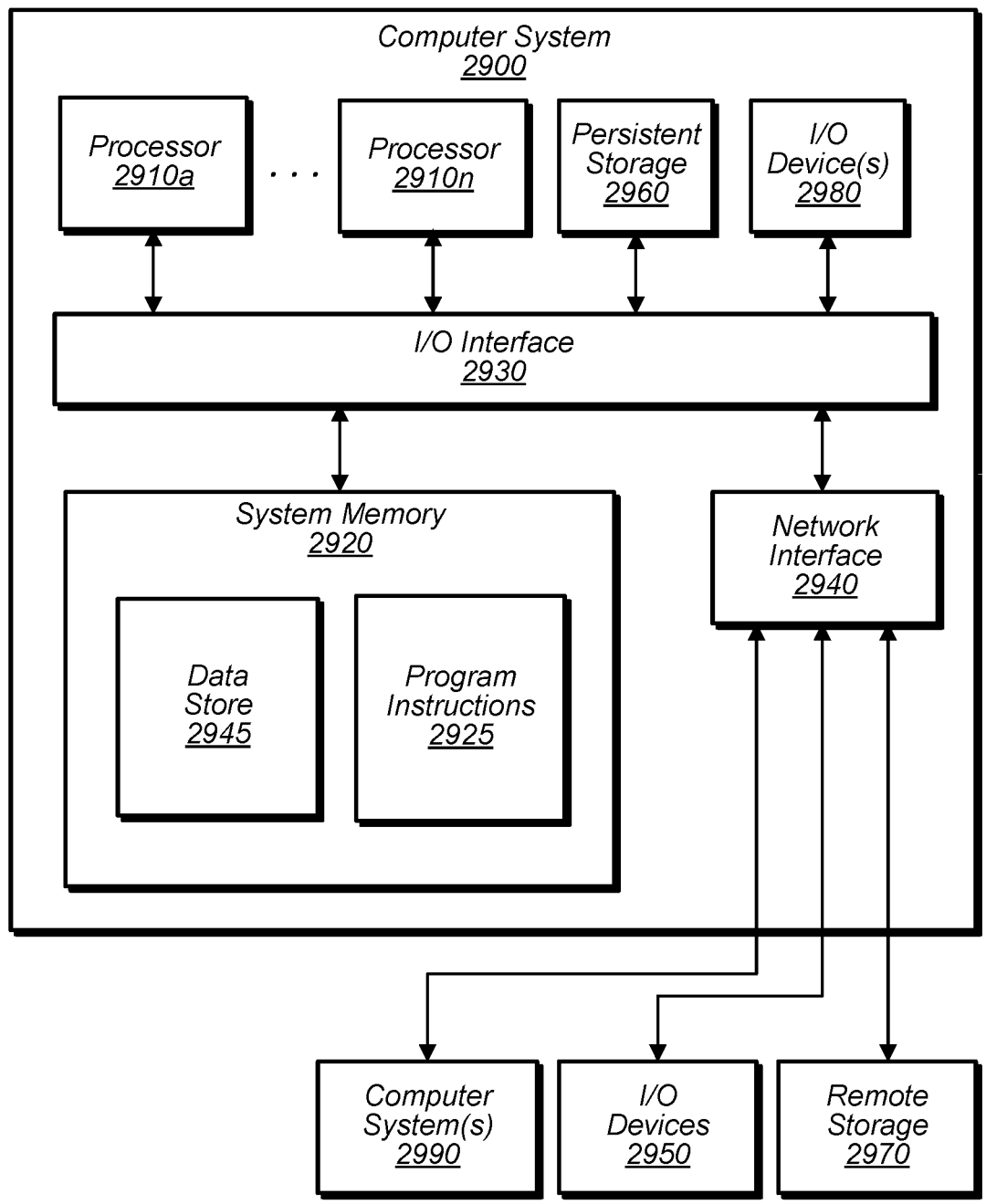
FIG. 29 is a block diagram illustrating an example computing system, according to some embodiments.

FIG. 29 is a block diagram illustrating an example computing system, according to some embodiments. For example, computer system 2900 may be configured to implement storage and/or compute nodes of a service of a provider network, a server placement controller, a server assembly controller, a user interface, an API and/or a client, in different embodiments. Computer system 2900 may be any of various types of devices, including, but not limited to, a personal computer system, desktop computer, laptop or notebook computer, mainframe computer system, handheld computer, workstation, network computer, a consumer device, application server, storage device, telephone, mobile telephone, or in general any type of computing device.

Computer system 2900 includes one or more processors 2910 (any of which may include multiple cores, which may be single or multi-threaded) coupled to a system memory 2920 via an input/output (I/O) interface 2930. Computer system 2900 further includes a network interface 2940 coupled to I/O interface 2930. In various embodiments, computer system 2900 may be a uniprocessor system including one processor 2910, or a multiprocessor system including several processors 2910 (e.g., two, four, eight, or another suitable number). Processors 2910 may be any suitable processors capable of executing instructions. For example, in various embodiments, processors 2910 may be general-purpose or embedded processors implementing any of a variety of instruction set architectures (ISAs), such as the x86, PowerPC, SPARC, or MIPS ISAs, or any other suitable ISA. In multiprocessor systems, each of processors 2910 may commonly, but not necessarily, implement the same ISA. The computer system 2900 also includes one or more network communication devices (e.g., network interface 2940) for communicating with other systems and/or components over a communications network (e.g. Internet, LAN, etc.).

In the illustrated embodiment, computer system 2900 also includes one or more persistent storage devices 2960 and/or one or more I/O devices 2980. In various embodiments, persistent storage devices 2960 may correspond to disk drives, tape drives, solid state memory, other mass storage devices, block-based storage devices, or any other persistent storage device. Computer system 2900 (or a distributed application or operating system operating thereon) may store instructions and/or data in persistent storage devices 2960, as desired, and may retrieve the stored instruction and/or data as needed. For example, in some embodiments, computer system 2900 may host a storage system server node, and persistent storage 2960 may include the SSDs attached to that server node.

Computer system 2900 includes one or more system memories 2920 that are configured to store instructions and data accessible by processor(s) 2910. In various embodiments, system memories 2920 may be implemented using any suitable memory technology, (e.g., one or more of cache, static random access memory (SRAM), DRAM, RDRAM, EDO RAM, DDR 10 RAM, synchronous dynamic RAM (SDRAM), Rambus RAM, EEPROM, non-volatile/Flash-type memory, or any other type of memory). System memory 2920 may contain program instructions 2925 that are executable by processor(s) 2910 to implement the methods and techniques described herein. In various embodiments, program instructions 2925 may be encoded in platform native binary, any interpreted language such as Java™ byte-code, or in any other language such as C/C++, Java™, etc., or in any combination thereof. For example, in the illustrated embodiment, program instructions 2925 include program instructions executable to implement the functionality of a resource host, in different embodiments. In some embodiments, program instructions 2925 may implement multiple separate clients, nodes, and/or other components.

In some embodiments, program instructions 2925 may include instructions executable to implement an operating system (not shown), which may be any of various operating systems, such as UNIX, LINUX, Solaris™, MacOS™, Windows™, etc. Any or all of program instructions 2925 may be provided as a computer program product, or software, that may include a non-transitory computer-readable storage medium having stored thereon instructions, which may be used to program a computer system (or other electronic devices) to perform a process according to various embodiments. A non-transitory computer-readable storage medium may include any mechanism for storing information in a form (e.g., software, processing application) readable by a machine (e.g., a computer). Generally speaking, a non-transitory computer-accessible medium may include computer-readable storage media or memory media such as magnetic or optical media, e.g., disk or DVD/CD-ROM coupled to computer system 2900 via I/O interface 2930. A non-transitory computer-readable storage medium may also include any volatile or non-volatile media such as RAM (e.g. SDRAM, DDR SDRAM, RDRAM, SRAM, etc.), ROM, etc., that may be included in some embodiments of computer system 2900 as system memory 2920 or another type of memory. In other embodiments, program instructions may be communicated using optical, acoustical or other form of propagated signal (e.g., carrier waves, infrared signals, digital signals, etc.) conveyed via a communication medium such as a network and/or a wireless link, such as may be implemented via network interface 2940.

In some embodiments, system memory 2920 may include data store 2945, which may be configured as described herein. In general, system memory 2920 (e.g., data store 2945 within system memory 2920), persistent storage 2960, and/or remote storage 2970 may store data blocks, replicas of data blocks, metadata associated with data blocks and/or their state, configuration information, and/or any other information usable in implementing the methods and techniques described herein.

In one embodiment, I/O interface 2930 may be configured to coordinate I/O traffic between processor 2910, system memory 2920 and any peripheral devices in the system, including through network interface 2940 or other peripheral interfaces. In some embodiments, I/O interface 2930 may perform any necessary protocol, timing or other data transformations to convert data signals from one component (e.g., system memory 2920) into a format suitable for use by another component (e.g., processor 2910). In some embodiments, I/O interface 2930 may include support for devices attached through various types of peripheral buses, such as a variant of the Peripheral Component Interconnect (PCI) bus standard or the Universal Serial Bus (USB) standard, for example. In some embodiments, the function of I/O interface 2930 may be split into two or more separate components, such as a north bridge and a south bridge, for example. Also, in some embodiments, some or all of the functionality of I/O interface 2930, such as an interface to system memory 2920, may be incorporated directly into processor 2910.

Network interface 2940 may be configured to allow data to be exchanged between computer system 2900 and other devices attached to a network, such as other computer systems 2990, for example. In addition, network interface 2940 may be configured to allow communication between computer system 2900 and various I/O devices 2950 and/or remote storage 2970. Input/output devices 2950 may, in some embodiments, include one or more display terminals, keyboards, keypads, touchpads, scanning devices, voice or optical recognition devices, or any other devices suitable for entering or retrieving data by one or more computer systems 2900. Multiple input/output devices 2950 may be present in computer system 2900 or may be distributed on various nodes of a distributed system that includes computer system 2900. In some embodiments, similar input/output devices may be separate from computer system 2900 and may interact with one or more nodes of a distributed system that includes computer system 2900 through a wired or wireless connection, such as over network interface 2940. Network interface 2940 may commonly support one or more wireless networking protocols (e.g., Wi-Fi/IEEE 802.11, or another wireless networking standard). However, in various embodiments, network interface 2940 may support communication via any suitable wired or wireless general data networks, such as other types of Ethernet networks, for example. Additionally, network interface 2940 may support communication via telecommunications/telephony networks such as analog voice networks or digital fiber communications networks, via storage area networks such as Fibre Channel SANs, or via any other suitable type of network and/or protocol. In various embodiments, computer system 2900 may include more, fewer, or different components than those illustrated in FIG. 29 (e.g., displays, video cards, audio cards, peripheral devices, other network interfaces such as an ATM interface, an Ethernet interface, a Frame Relay interface, etc.)

It is noted that any of the distributed system embodiments described herein, or any of their components, may be implemented as one or more network-based services. For example, a compute cluster within a computing service may present computing and/or storage services and/or other types of services that employ the distributed computing systems described herein to clients as network-based services. In some embodiments, a network-based service may be implemented by a software and/or hardware system designed to support interoperable machine-to-machine interaction over a network. A network-based service may have an interface described in a machine-processable format, such as the Web Services Description Language (WSDL). Other systems may interact with the network-based service in a manner prescribed by the description of the network-based service's interface. For example, the network-based service may define various operations that other systems may invoke, and may define a particular application programming interface (API) to which other systems may be expected to conform when requesting the various operations. though In various embodiments, a network-based service may be requested or invoked through the use of a message that includes parameters and/or data associated with the network-based services request. Such a message may be formatted according to a particular markup language such as Extensible Markup Language (XML), and/or may be encapsulated using a protocol such as Simple Object Access Protocol (SOAP). To perform a network-based services request, a network-based services client may assemble a message including the request and convey the message to an addressable endpoint (e.g., a Uniform Resource Locator (URL)) corresponding to the network-based service, using an Internet-based application layer transfer protocol such as Hypertext Transfer Protocol (HTTP).

In some embodiments, network-based services may be implemented using Representational State Transfer ("RESTful") techniques rather than message-based techniques. For example, a network-based service implemented according to a RESTful technique may be invoked through parameters included within an HTTP method such as PUT, GET, or DELETE, rather than encapsulated within a SOAP message.

Although the embodiments above have been described in considerable detail, numerous variations and modifications may be made as would become apparent to those skilled in the art once the above disclosure is fully appreciated. It is intended that the following claims be interpreted to embrace all such modifications and changes and, accordingly, the above description to be regarded in an illustrative rather than a restrictive sense.

What is claimed is:

1. A system comprising:
servers mounted in a server mounting structure of a data center;
one or more robots configured to custom assemble additional servers to be installed in unoccupied slots of the server mounting structure of the data center; and
a server assembly controller configured to:
identify trends in server utilization metadata for the servers mounted in the server mounting structure, wherein the server assembly controller identifies the trends in the server utilization metadata without access to applications being executed on the servers;
determine a particular application class for an application being executed on one or more of the servers based on the identified trends in the server utilization metadata; and
cause the one or more robots to custom assemble an additional server having a server configuration tailored for the particular application class,
wherein the one or more robots are further configured to cause the additional server to be installed in one of the unoccupied slots of the server mounting structure.

2. The system of claim 1, wherein the server assembly controller is configured to utilize machine learning to associate respective trends in server utilization metadata with respective application classes.

3. The system of claim 1, wherein the identified trends in the server utilization metadata comprise trends in time-series power consumption metadata for the servers.

4. The system of claim 1, wherein the identified trends in the server utilization metadata comprise trends in time-series memory utilization metadata for the servers.

5. The system of claim 1, wherein the servers are part of a service provider network that offers a plurality of services to clients of the service provider, wherein workloads associated with the services offered by the service provider network are executed on the servers on behalf of the clients, and
wherein the server assembly controller is further configured to determine the particular application class for the application being executed on the one or more servers based on which service of the plurality of services offered by the service provider network is associated with a workload assigned to the one or more of the servers.

6. A method, comprising:
identifying trends in server utilization metadata for servers mounted in a data center, wherein the trends in the server utilization metadata are identified without access to applications being executed on the servers;
determining a particular application class for an application being executed on one or more of the servers based on the identified trends in the server utilization metadata;
causing one or more robots at the data center to custom assemble an additional server having a server configuration tailored for the particular application class; and
causing, via the one or more robots, the additional server to be installed in a server mounting structure of the data center.

7. The method of claim 6, further comprising:
associating, via machine learning, respective trends in server utilization metadata with respective application classes.

8. The method of claim 7, wherein the server utilization metadata is server utilization metadata for internal workloads of a service provider, wherein application classes of the internal workloads are provided to a computing device performing the machine learning.

9. The method of claim 7, further comprising:
storing the respective associations between trends in server utilization metadata and respective applications classes in a storage repository;
wherein said identifying trends in server utilization metadata for the servers mounted in the data center comprises:
evaluating the server utilization metadata to identify one or more trends that match one or more trends of the respective associations stored in the storage repository.

10. The method of claim 9, further comprising:
identifying, via machine learning, an additional trend in the server utilization metadata;
associating, via machine learning, the additional trend with an additional application class; and
storing an additional association in the storage repository for the additional trend and the additional application class,
wherein the server utilization metadata is evaluated to identify whether one or more trends in the server utilization metadata match the additional trend.

11. The method of claim 6, further comprising:
identifying trends in a robot calibration process, a server assembly process, or a server validation process associated with assembling the additional server or other additional servers; and
adjusting the robot calibration process, the server assembly process, or the server validation process to reduce validation failures for the additional server or other additional servers based on the identified trends.

12. The method of claim 11, further comprising:
associating, via machine learning, the identified trends in the robot calibration process, the server assembly process, or the server validation process with validation failures; and
determining one or more adjustments to be applied to the robot calibration process, the server assembly process, or the server validation process to reduce validation failures for respective ones of the validation failures.

13. The method of claim 6, wherein the identified trends in the server utilization metadata comprise trends in time-series power consumption metadata for the servers or trends in time-series memory utilization metadata for the servers.

14. The method of claim 6, wherein the additional server is optimized for latency, throughput, or cost based on the particular application class.

15. The method of claim 14, wherein the additional server has a latency and a throughput equal to or greater than the servers that are executing the application corresponding to the particular application class.

16. A non-transitory computer readable medium storing program instructions, that when executed by one or more processors, cause the one or more processors to:

identify trends in server utilization metadata for servers, wherein the trends in the server utilization metadata are identified without access to applications being executed on the servers;

determine a particular application class for an application being executed on one or more of the servers based on the identified trends in the server utilization metadata;

cause one or more robots to custom assemble an additional server having a server configuration tailored for the particular application class; and cause the one or more robots to install the additional server in a server mounting structure.

17. The non-transitory computer readable medium of claim 16, wherein the program instructions cause the one or more processors to utilize machine learning to associate respective trends in server utilization metadata with respective application classes.

18. The non-transitory computer readable medium of claim 16, wherein the servers execute workloads for clients of a service provider network via one or more applications implemented on the servers.

19. The non-transitory computer-readable medium of claim 16, wherein the program instructions, when executed on the one or more processors, further cause the one or more processors to:

select a server configuration tailored for the particular application class from a plurality of available server configurations that the one or more robots are capable of assembling, and wherein the selected server configuration has a latency and a throughput equal to or greater than a latency and a throughput of the servers that are executing the application corresponding to the particular application class.

20. The non-transitory computer-readable medium of claim 16, wherein the identified trends in the server utilization metadata comprise trends in time-series power consumption metadata for the servers or trends in time-series memory utilization metadata for the servers.

* * * * *